(12) United States Patent
Schilling et al.

(10) Patent No.: US 8,788,202 B2
(45) Date of Patent: Jul. 22, 2014

(54) NAVIGATION DEVICES

(75) Inventors: Heiko Schilling, Nottingham (GB);
Ewgenij Gawrilow, Berlin (DE);
Moritz Hilger, Berlin (DE); Andreas Profous, Berlin (DE); Jürgen Werber, Berlin (DE); Dominique Pelle, Amsterdam (NL)

(73) Assignee: Tomtom International B.V., Amsterdam (NL)

( * ) Notice: Subject to any disclaimer, the term of this patent is extended or adjusted under 35 U.S.C. 154(b) by 0 days.

(21) Appl. No.: 13/544,028

(22) Filed: Jul. 9, 2012
(Under 37 CFR 1.47)

(65) Prior Publication Data
US 2013/0173152 A1 Jul. 4, 2013

Related U.S. Application Data

(63) Continuation of application No. 13/382,949, filed as application No. PCT/EP2010/059947 on Jul. 9, 2010, now abandoned.

(60) Provisional application No. 61/213,746, filed on Jul. 9, 2009.

(51) Int. Cl.
*G01C 21/34* (2006.01)

(52) U.S. Cl.
USPC .......................................... 701/527; 701/533

(58) Field of Classification Search
USPC ......... 701/527, 533, 410, 461, 468, 446, 517;
340/995.18, 995.19, 990; 342/357.41;
707/999.004, 999.1, 999.2, 999.201,
707/E17.005
See application file for complete search history.

(56) References Cited

U.S. PATENT DOCUMENTS

| | | | |
|---|---|---|---|
| 6,230,098 B1 * | 5/2001 | Ando et al. | 701/410 |
| 6,636,800 B1 | 10/2003 | Lauther et al. | |
| 7,024,307 B2 * | 4/2006 | Ito et al. | 701/446 |
| 7,082,443 B1 * | 7/2006 | Ashby | 342/357.41 |
| 7,403,852 B2 * | 7/2008 | Mikuriya et al. | 701/532 |
| 8,150,620 B2 | 4/2012 | Motoyama | |
| 2004/0249568 A1 | 12/2004 | Endo et al. | |
| 2005/0096842 A1 | 5/2005 | Tashiro | |
| 2007/0010941 A1 | 1/2007 | Marsh | |
| 2007/0208498 A1 | 9/2007 | Barker et al. | |
| 2009/0006399 A1 | 1/2009 | Raman et al. | |

FOREIGN PATENT DOCUMENTS

| | | |
|---|---|---|
| EP | 1 635 141 A1 | 3/2006 |
| JP | 2004 233230 A | 8/2004 |
| WO | 99/22205 A1 | 5/1999 |
| WO | 2009/053405 A1 | 4/2009 |

OTHER PUBLICATIONS

Andres Gemsa: "Arc-Flag Compression Student thesis", Universitat Karlsruhe (TH), Fakultat fur Informatik. Retreived from the Internet: URL:http://illwww.ira.de/extra/publications/g-afc-08.pdf [retrieved on Dec. 2, 2010] XP002612411.

(Continued)

*Primary Examiner* — Marthe Marc-Coleman

(57) ABSTRACT

A method of creating map data including search acceleration data arranged to increase the speed at which a route can be planned across an electronic map comprising a plurality of navigable segments, each navigable segment representing a segment of a navigable route in the area covered by the map.

18 Claims, 16 Drawing Sheets

(56) References Cited

OTHER PUBLICATIONS

Search Report issued Feb. 4, 2013 for European Patent Application No. EP12194985.3.
International Search Report issued Feb. 1, 2011 for International Application No. PCT/EP2010/059947.
XP002612394—Daniel Delling: "Engineering and Augmenting Route Planning Algorithms", PHD Thesis, Feb. 10, 2009 Universität Karlsruhe (TH), Fakultät für Informatik Retrieved from the Internet: URL:http://i11www.ira.uka.de/extra/publications/d-earpa-09.pdf [retrieved on Dec. 2, 2010].
XP002612373—Reinhard Bauer, Daniel Delling: "SHARC: Fast and Robust Unidirectional Routing", ACM Journal of Experimental Algorithmics, vol. 14,2.4, May 2009.
XP019107027—Daniel Delling Ed—Dan Halperin et al: "Time-Dependent SHARC-Routing", Sep. 15, 2008, Algorithms—ESA 2008; [Lecture Notes in Computer Science], Springer Berlin Heidelberg, Berlin, Heidelberg, pp. 332-343, ISBN: 978-3-540-87743-1.
XP002612372—Rolf H. Mohring, Heiko Schilling, Birk Schütz, Dorothea Wagner, Thomas Willhalm: "Partitioning graphs to speedup Dijkstra's algorithm", ACM Journal of Experimental Algorithmics, vol. 11, 2.8, 2007, pp. 1-29, ISSN: 1084-6654, DOI: 1187436.1216585.
XP019121077—Daniel Delling et al: "Engineering Route Planning Algorithms", Nov. 30, 2008, Algorithmics of Large and Complex Networks, Springer Berlin Heidelberg, Berlin, Heidelberg, pp. 117-139, ISBN: 978-3-64 2-02093-3.
XP000949386—Jakobsson M: "Huffman Coding in Bit-Vector Compression", Information Processing Letters, Amsterdam, NL, vol. 7, No. 6, Oct. 1, 1978, pp. 304-307, ISSN: 0020-0190, 001: DOi:10.1016/0020-0190(78)90023-6.
International Search Report issued Mar. 15, 2011 for International Application No. PCT/EP2010/059944.
M. Hilger, E. Koehler, R.H. Moehring, and H. Schilling, "Fast Point-to-Point Shortest Path Computations with Arc-Flags", Mathematical Programming, Feb. 2007.
M. Hilger, "Accelerating Point-to-Point Shortest Path Computations in Large Scale Networks", Master's thesis, Technische Universität Berlin, 2007.
P. Sanders, D. Schultes, and C. Vetter, "Mobile Route Planning", In Proceedings of ESA. 2008, 732-743.
H. Schilling, "Route Assignment Problems in Large Networks", Dissertation, Technische Universität Berlin, 2006.

* cited by examiner 8 regions, grouping to use 4-bits search acceleration data

Grouping from region A point of view

Grouping from region B point of view

NAVIGATION DEVICES

CROSS-REFERENCE TO RELATED APPLICATIONS

This application is a continuation application of U.S. application Ser. No. 13/382,949 filed Jan. 9, 2012, and which is the National Stage of International Application No. PCT/EP2010/059947, filed on Jul. 9, 2010, and designating the United States. The application further claims priority from U.S. Provisional Application No. 61/213,746, filed Jul. 9, 2009. The entire contents of each of these applications is incorporated herein by reference.

FIELD OF THE INVENTION

The present invention relates to a computerised method of generating map data and related systems. In particular, but not exclusively, the method of generating the map data is used to facilitate route planning between at least two points according to a predetermined cost function. Embodiments of the invention may generate search acceleration data which, when used in route planning, reduce the time taken to generate a route.

BACKGROUND OF THE INVENTION

Route planning devices (often referred to as Satellite Nav.'s, Portable Navigation Devices (PND's) or similar) together with web sites such as routes.tomtom.com are well known and allow a user thereof to plan a route between two points. Such technology may be referred to generically as electronic route planning or just route planning.

Map data for such electronic route planning comes from specialist map vendors such as Tele Atlas NV. When performed on a PND such route planning typically uses location data from a GPS system. However, other applications may allow a user to input his/her location or other point to be considered for routing planning purposes.

Such map data comprises a plurality of roads (and other navigable paths) which can be described as lines—i.e. vectors or road segments (e.g. start point, end point, direction for a road, with an entire road being made up of many hundreds of such segments, each uniquely defined by start point/end point direction parameters). A map is then a set of such road vectors, data associated with each vector (speed limit; travel direction, etc.) plus points of interest (POIs), plus road names, plus other geographic features like park boundaries, river boundaries, etc., all of which are defined in terms of vectors. All map features (e.g. road vectors, POIs etc.) are typically defined in a co-ordinate system that corresponds with or relates to the GPS co-ordinate system, enabling a device's position as determined through a GPS system to be located onto the relevant road shown in a map and for an optimal route to be planned to a destination.

Such map data can be extensive. It is known for maps to cover areas having in excess of 120,000,000 vectors and an example of such map data would be a map covering the area of Europe and Russia. As such, planning a route using such map data is complex and can be time consuming. Also, it is known that such route planning is a trade-off between accuracy and time.

Prior art which has considered ideas at improving the speed at which routing can occur includes U.S. Pat. No. 6,636,800 which discusses refinements to the A* best-first search strategy suitable for much smaller map sizes such as the highway road network of Western Europe (having roughly 400,000 vectors).

SUMMARY OF THE INVENTION

According to a first aspect of the invention there is provided a method of creating map data including search acceleration data arranged to increase the speed at which a route can be planned across an electronic map comprising a plurality of navigable segments, each navigable segment representing a segment of a navigable route in the area covered by the map, wherein the method comprises:
  a) reducing the number of navigable segments to be considered in the creation of the search acceleration data by removing navigable segments to form a core network of navigable segments;
  b) dividing the electronic map into a set of hierarchical regions such that the or each navigable segment is categorized into at least one region in each level of the hierarchy;
  c) using a time varying function associated with at least some, and generally each, navigable segment of the core network to determine whether that navigable segment is part of minimum cost route to at least one of the regions and recording this determination in the search acceleration data; and
  d) generating the map data.

Such a method is believed advantageous because it allows the search acceleration data to be calculated quicker than prior art methods. In turn, the search acceleration data is believed advantageous since it allows route planning using that map data to be performed quicker.

Typically the search acceleration data is calculated as a plurality of bit vectors. Some embodiments of the invention may calculate may indicate via a bit of the search acceleration data whether or not a road segment is part of a minimum cost route from an origin navigable segment to a destination region.

The skilled person will appreciate that generally each navigable segment, or may be node, within the map data has associated therewith the time varying function. For example, the time varying function may comprise the average speed on the navigable segment at various time intervals. For example, the average speed may be specified at 5 minute intervals or the like.

Conveniently, the core network is generated by removing navigable segments for which the search acceleration data can later be recovered. Such a method is advantageous since it allows search acceleration data to be determined for substantially all navigable segments within the electronic map thereby route planning to be accelerated from any navigable segment within the map.

Some embodiments of the invention may utilize any one or more of the following techniques to remove navigable segments from the electronic map prior to the creation of the search acceleration data:
  fulfil a predetermined criterion related to the road property;
  removing navigable segments from the network which form parts of the network that are sufficiently small according to some predetermined criterion and that could be disconnected from the rest of the network by removing a set of navigable segments that fulfils some further predetermined criterion;
  collapsing nodes, which occur at junctions between navigable segments, onto one another in predetermined situations; and collapsing nodes onto one another if they have two or less than two navigable segments connected thereto.

Such techniques are believed advantageous since they reduce the number of navigable segments that need to be considered during the generation of the search acceleration data which increases, perhaps significantly, the speed at which the search acceleration data can be created.

Additionally, or alternatively, embodiments of the invention may utilize any one or more of the following techniques to compress the search acceleration data once it has been created:

Computing the correlation of pairs of bits in the search acceleration data;
Coalescing substantially correlated bits in the search acceleration data in order to reduce the number of bits to encode in a lossless manner;
Coalescing correlated bits in the search acceleration data in order to perform lossy compression;
Re-ordering bits in coalesced search acceleration data according to their correlations;
Huffman encoding the search acceleration data;

In some embodiments the substantially correlated bits may be thought of as almost correlated with one another; i.e. there may small differences search acceleration data which is to be compressed. The closeness of the search acceleration data at which point they are coalesced may be tunable according to a predetermined criterion. Thus, embodiments of the invention that implement such lossy coalescing further reduce the memory footprint occupied by the search acceleration data at the expense of increasing the processing required to perform route planning using the search acceleration data.

Embodiments of which re-order search acceleration data are advantageous because he efficiency at which Huffman compression can compress the search acceleration data can be increased.

According to a second aspect of the invention there is provided a method of creating map data, including search acceleration data arranged to increase the speed at which a route can be planned across an electronic map, the method comprising using at least one processing apparatus to process the electronic map which comprises a plurality of navigable segments, representing segments of a navigable route in the area covered by the map, comprising causing the processing apparatus to:
 a. process the navigable segments in order reduce the number of navigable segments to be considered in the creation of the search acceleration data by removing navigable segments to form a core network of navigable segments;
 b. generate the search acceleration data for at least some of, and generally each of, the navigable segments of the core network indicating whether that navigable segment is part of a minimum cost route; and
 wherein step a. includes any one or more of the following:
  fulfil a predetermined criterion related to the road property;
  removing navigable segments from the network which form parts of the network that are sufficiently small according to some predetermined criterion and that could be disconnected from the rest of the network by removing a set of navigable segments that fulfils some further predetermined criterion;
  collapsing nodes, which occur at junctions between navigable segments, onto one another in predetermined situations; and
  collapsing nodes onto one another if they have two or less than two navigable segments connected thereto.

According to a third aspect of the invention there is provided a method of creating map data, including search acceleration data arranged to increase the speed at which a route can be planned across an electronic map, the method comprising using at least one processing apparatus to process an electronic map which a plurality of navigable segments each having a plurality of nodes associated therewith, representing segments of a navigable route in the area covered by the map and having at least one attribute associated therewith representing a parameter of the navigable route, the method comprising:
 a) assessing the at least one attribute;
 b) dividing the electronic map into a set of hierarchical regions such that the or each navigable segment is categorized into at least one region in each level of the hierarchy, wherein the categorization uses the assessment of step a. to ensure that the nodes associated with the navigable segments are balanced across the regions of the electronic map;
 c) generating the map data.

An advantage of such a method is that it can help to balance the number of navigable segments that are distributed between each of the regions which can in turn help to increase the effectiveness of the search acceleration data.

Steps a) and b) may be performed iteratively until a predetermined criterion measuring the balance of the nodes across the regions is met. For example, an upper threshold on the number of navigable segments that may occur in a given region may be such a criterion. Such a measure can help to ensure that the search acceleration data is calculated quicker; if the regions contain imbalances in the navigable segments contained therein then the speed at which the search acceleration data can be calculated may be compromised.

The attribute may include any of the following:
 the type of navigable segment;
 the average speed along the navigable segment;
 the length of the navigable segment;
 the connectivity of that segment to other navigable segments.

The method may be arranged to determine regions of the map to which journey times would be slower than a predetermined threshold and may further separate navigable segments within those regions from other regions of the electronic map.

The method may be arranged to separate navigable segments which are part of islands from other regions of the electronic map, which may be performed by determining that attribute for that navigable segment is a ferry line. Such a method is advantageous since travel to such islands can be slower than to other regions of the electronic map and inclusion of such islands may compromise the effectiveness of the search acceleration data and/or may slow down the calculation of the search acceleration data.

According to a fourth aspect of the invention there is provided a method of creating map data, including search acceleration data arranged to increase the speed at which a route can be planned across an electronic map, the method comprising using at least one processing apparatus to process an electronic map comprising a plurality of navigable segments each representing segments of a navigable route in the area covered by the map, the method comprising:
 a) dividing the map into a plurality of hierarchical regions belonging to at least a coarser level and a neighboring finer level such that each navigable segment is categorized into at least one region in each of the coarser and finer levels and wherein any one region of the coarser level contains a plurality of regions of the finer level;

b) determining, for a given destination region, the extent of a visibility area, comprising at least the coarser level region containing the destination region, by assessing whether regions close to the coarser level region containing the destination region should be added to the visibility area and adding those regions if the assessment is positive;

c) calculating, for at least some navigable segments, information on at least one minimum cost route to that destination region;

d) wherein the processing of a navigation segment includes the performance of a reverse search from the destination region back toward the navigable segment and includes substantially only navigable segments in the visibility area of the destination region; and e) generating the map data.

An advantage of such a method is that the use of the vicinity area allows the search space, used to generate the search acceleration data, is constrained and as such the speed at which the search acceleration data can be created is increased.

According to a fifth aspect of the invention there is provided a method of creating map data, including search acceleration data arranged to increase the speed at which a route can be planned across an electronic map, the method comprising using at least one processing apparatus to process an electronic map comprising a plurality of navigable segments each representing segments of a navigable route in the area covered by the map, the method comprising:

a) dividing the map into a plurality of hierarchical regions belonging to at least a coarser level and a neighboring finer level such that each navigable segment is categorized into at least one region in each of the coarser and finer levels and wherein any one region of the coarser level contains a plurality of regions of the finer level;

b) determining, for a given destination region, the extent of a visibility area, comprising at least the coarser level region containing the destination region, by assessing whether regions close to the coarser level region containing the destination region should be added to the visibility area and adding those regions if the assessment is positive;

c) calculating, for at least some navigable segments information on at least one minimum cost route to that destination region;

d) arranging the search acceleration data to comprise information on the at least one minimum cost route to the destination region for at least some and typically each navigable segment in the visibility area; and e) generating the map data.

An advantage of such a method is that the speed at which route planning using the search acceleration data can be performed can be increased. The search acceleration data may be thought of as a sign post to the destination region. Thereby increasing the number of regions that contain search acceleration data to regions contained within the vicinity area increases the number of regions that contain 'sign posts' to the destination region. Therefore, the time to generate the search acceleration data may be increased although the performance of the route planning using the search acceleration data will also be increased.

The assessment as to whether regions are close to the coarser level region containing the destination region may be based upon a predetermined criterion. This predetermined criterion may be any one or combination of the following: graph-theoretical distance, geographical distance, travel time, fuel consumption and/or $CO_2$ emission. Indeed, in some embodiments closer may be determined to be regions which are adjacent to the coarser level region containing the destination region.

Regions added to the visibility area may comprise at least one of the following: one or more regions of the coarser level and a portion of one or more regions of the coarser level.

Any of the above methods may include within the search acceleration data at least one additional route in addition to the minimum cost route wherein the additional route may reflect any one or more of the following:

different minimum cost routes at different times between a given departure and destination point;

different minimum cost routes between a given departure and destination point for different traffic situations;

different minimum cost routes between a given departure and destination point according to different cost function;

different minimum cost routes between a given departure and destination point for any dynamic changes in a given road network;

alternative routes between a given departure and destination point according to the same cost function; and different destination points in a similar direction to one another.

As such, the search acceleration data may include a plurality of 'minimum cost' routes each of which is generally judged against a different criterion. An advantage of such a method is that route planning using the minimum cost data may generate optimum routes for a variety of criterion.

According to a sixth aspect of the invention there is provided a a) dividing the map into a plurality of hierarchical regions at one or more levels of hierarchy;

b) processing at least some of the regions belonging to a particular level of hierarchy in the order of the level hierarchy, working from the finest level up to the coarsest, and for at least some of these regions, determining which navigable segments enter and/or leave that region;

c) processing at least some of the navigable segments within the map to determine at least one minimum cost route from that navigable segment to a destination region;

d) wherein the processing of a navigable segment includes the performance of a reverse search from the destination region back toward the navigable segment;

e) in the resulting search graph, identifying, for at least one region at the next-finer level, a set of regions at that next-finer level, such that each minimum-cost paths from the given region passes through at least one of the regions of the set, resulting in a correlation matrix;

f) in the resulting search graph, identifying which navigable segments are not contained in any path from a region different from their own to a further destination region, so they can be thought of as "non-transit segments", and removing those non-transit segments for the subsequent steps in order to reduce the number of navigable segments which are considered in the subsequent steps;

g) wherein the creation of search acceleration data comprises using the correlation matrix to assign search acceleration data to the non-transit segments which have been removed in all previous steps;

h) generating map data

Any of the above aspects of the invention may use one or more navigation devices to generate positioning data being constituted by at least a series of positions. Latterly the methods may process the positioning data to generate speed profiles therefrom which vary with respect to time, wherein the generated speed profiles are associated with the navigable segment on which the positioning data generating that speed profile occurred.

According to a seventh aspect of the invention there is provided a navigation device arranged to generate a route across an electronic map using a processor thereof, wherein the processor is arranged to:

perform a route search across the electronic map;

perform, in a cost calculation at nodes processed during the search which represent navigable segments in the electronic map, an assessment of whether navigable segments connected to those nodes are marked as being part of a minimum cost route; and if there are such navigable segments exploring only those navigable segments.

The search may compromise a tree search such as A* search, any other search method described herein, or the like. In other embodiments, the search may comprise a directed acyclic graph search.

According to an eighth aspect of the invention there is provided a method of generating a route across an electronic map comprising performing an A* search in a cost calculation performed at nodes of the graph tree which represents a navigable segment within the electronic map and including assessing search acceleration data to determine whether navigable segments connected to that node are marked as being part of a minimum cost route and if there are such navigable segments exploring only those navigable segments.

The search acceleration data is conveniently pre-generated and stored with or in association with the electronic map.

Such a method is thought to be advantageous since it may significantly increase the speed at which the route can be generated across the electronic map.

According to a ninth aspect of the invention there is provided a navigation device arranged to generate a route across an electronic map to a destination using a processor thereof to analyse map data, wherein the processor is arranged to:

perform a route search across the electronic map using information held in the map data;

perform, in a cost calculation at nodes processed during the search which represent navigable segments in the electronic map, an assessment of whether navigable segments connected to those nodes are marked, within the search acceleration data, as being part of a minimum cost route;

wherein said map data includes an indicator as to whether additional search acceleration data is present from that node to the destination, said additional search information providing further information on minimum cost routes; and if such minimum cost data is available, exploring only those navigable segments having such search acceleration data.

Such a device is advantageous because the indicator provided in the map data helps to provide information which constrains the number of routes which are explored by the navigation device.

The indicator may comprise a visibility area of the destination and the navigation device may be arranged to utilise the further information on minimum cost routes when it is within visibility region.

According to further aspects of the invention there may be provided computing apparatus arranged to perform any of the above methods.

According to further aspects of the invention there are provided machine readable mediums containing instructions to provide, when read onto at least one machine, any of the methods above.

According to yet further aspects of the invention there are provided machine readable mediums containing instructions to cause the or each machine onto which they are read to perform as the computing devices of any of the above aspects of the invention.

In embodiments in which the method is performed in parallel instructions may be read onto a plurality of machines.

The skilled person will appreciate that features of many of the features of the above aspects of the invention may be applied mutatis mutandis to other of the aspects of the invention.

In any of the above aspects of the invention the machine readable medium may comprise any of the following: a floppy disk, a CD ROM, a DVD ROM/RAM (including a –R/–RW and +R/+RW), a hard drive, a memory (including a USB memory key, an SD card, a Memorystick™, a compact flash card, or the like), a tape, any other form of magneto optical storage, a transmitted signal (including an Internet download, an FTP transfer, etc), a wire, or any other suitable medium.

The skilled person will appreciate that many of the methods and/or apparatus described herein may be performed in software, hardware or firmware. Indeed, a combination of these three may be suitable for at least some of the ideas.

Reference to generation of map data in any of the above aspects of the invention may in fact be an optional step and the skilled person will appreciate that such a step may well be optional to that method.

According to yet a further aspect of the invention there is provided a method of generating search acceleration data comprising pre-processing navigable segments to generate that data.

According to a further aspect of the invention there is provided a method of generating map data from positioning data, the method comprising using at least one processing apparatus to process an electronic map comprising a plurality of navigable segments, representing segments of a navigable route in an area covered by the map, the method comprising:

1. using one or more navigation devices to generate positioning data being constituted by at least a series of positions;
2. processing the positioning data to generate speed profiles therefrom which vary with respect to time, wherein the generated speed profiles are associated with the navigable segment on which the positioning data generating that speed profile occurred;
3. generating, for at least some of the navigable segments, search acceleration data where the search acceleration data indicates for at least one, and typically each of the regions, whether that navigable segment comprises part of a route to minimize a cost for a predetermined criterion to travel to the or each region, wherein the generation uses a time varying function for the predetermined criterion; and
4. generating map data.

In aspects of this invention, reference to a node, line or road may be taken to be a reference to a navigable segment and vice-versa and the skilled person will appreciate how to make the necessary changes.

BRIEF DESCRIPTION OF THE FIGURES

There now follows by way of example only a detailed description of embodiments of the present invention with reference to the accompanying drawings in which:

FIG. 1c is a schematic representation of an architectural stack employed by the navigation device of FIG. 1a;

DETAILED DESCRIPTION OF THE FIGURES

Figure 19:
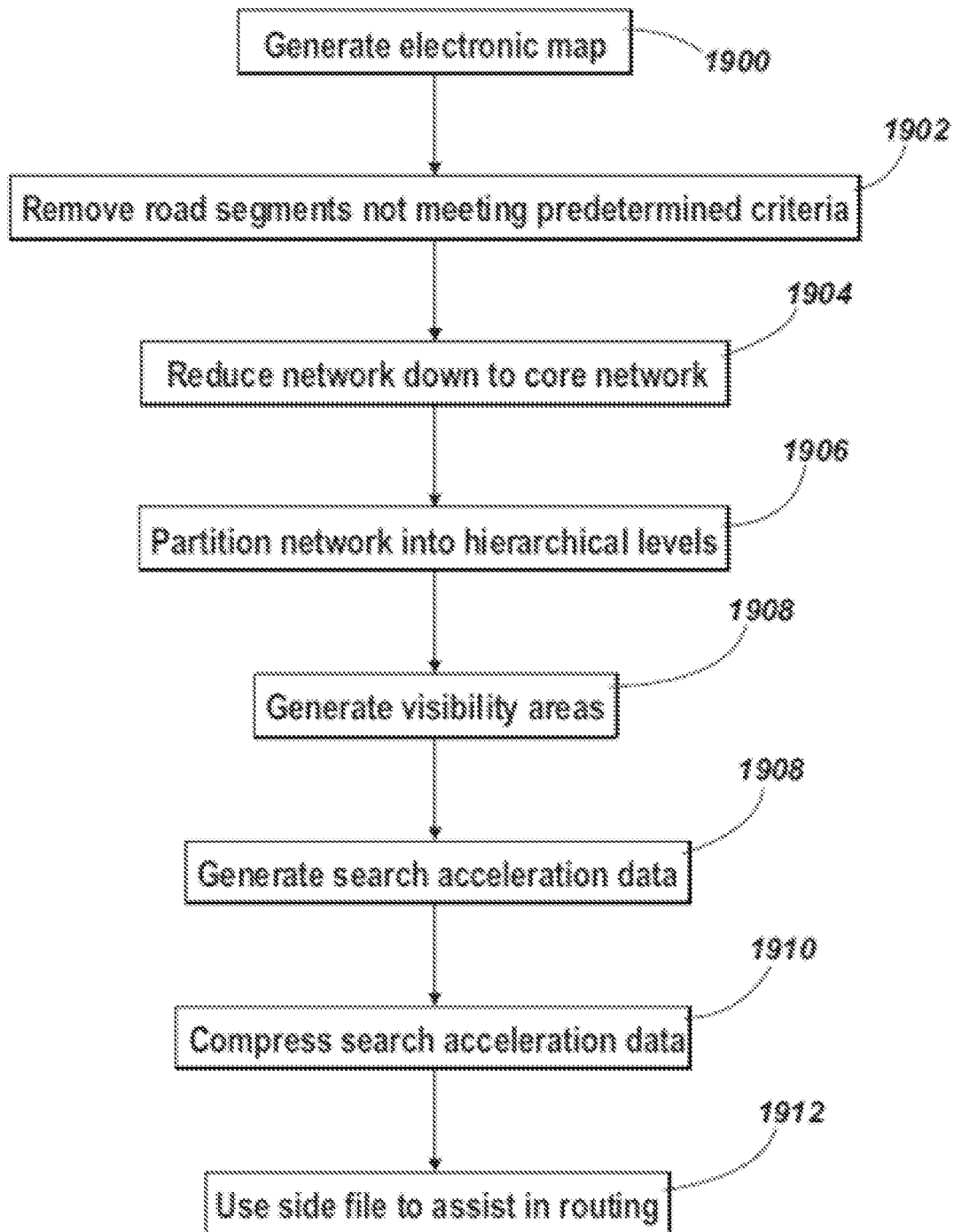
FIG. 19 shows a flow chart outlining steps of the method.

Throughout the following description the same reference numerals will be used to identify like parts. Throughout the description of the various embodiments reference is made to the flow chart of FIG. 19 which has reference numerals in the 19xx series.

Figure 1:
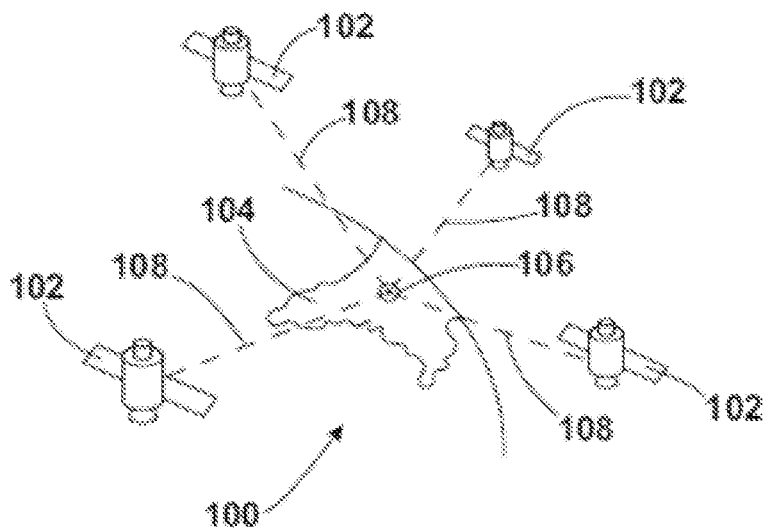
FIG. 1 is a schematic illustration of an exemplary part of a Global Positioning System (GPS) usable by a navigation device.

FIG. 1 schematically shows a Global Positioning System (GPS) which is a satellite-radio based navigation system which may be utilised to determine continuous position, velocity, time, and in some instances direction information for an unlimited number of users. Formerly known as NAVSTAR, the GPS incorporates a plurality of satellites which orbit the earth in extremely precise orbits. Based on these precise orbits, GPS satellites can relay their location, as GPS data, to any number of receiving units. However, it will be understood that Global Positioning systems could be used, such as GLOSNASS, the European Galileo positioning system, COMPASS positioning system or IRNSS (Indian Regional Navigational Satellite System).

The GPS system is implemented when a device, specially equipped to receive GPS data, begins scanning radio frequencies for GPS satellite signals. Upon receiving a radio signal from a GPS satellite, the device determines the precise location of that satellite via one of a plurality of different conventional methods. The device will continue scanning, in most instances, for signals until it has acquired at least three different satellite signals (noting that position is not normally, but can be determined, with only two signals using other triangulation techniques). Implementing geometric triangulation, the receiver utilizes the three known positions to determine its own two-dimensional position relative to the satellites. This can be done in a known manner. Additionally, acquiring a fourth satellite signal allows the receiving device to calculate its three dimensional position by the same geometrical calculation in a known manner. The position and velocity data can be updated in real time on a continuous basis by an unlimited number of users.

As shown in FIG. 1, the GPS system 100 comprises a plurality of satellites 102 orbiting about the earth 104. A GPS receiver 106 receives GPS data as spread spectrum GPS satellite data signals 108 from a number of the plurality of satellites 102. The spread spectrum data signals 108 are continuously transmitted from each satellite 102, the spread spectrum data signals 108 transmitted each comprise a data stream including information identifying a particular satellite 102 from which the data stream originates. The GPS receiver 106 generally requires spread spectrum data signals 108 from at least three satellites 102 in order to be able to calculate a two-dimensional position. Receipt of a fourth spread spectrum data signal enables the GPS receiver 106 to calculate, using a known technique, a three-dimensional position.

Thus, a GPS system allows a user of a device having a GPS receiver 106 to determine his/her position on the planet earth to within a few meters. In order to make use of this information it has become common practice to rely on electronic maps which allow the user's position to be shown thereon. Such maps are exemplified by providers such as TeleAtlas (http://www.teleatlas.com).

Not only do such electronic maps allow a user's position to be shown thereon using a GPS system (or by other means) but they allow a user to plan routes for journeys and the like (routing purposes). In order for this route planning to occur, the electronic map is processed by a navigation device, which may be provided by a general computing device.

Specific examples of a navigation device include Satellite navigation devices (Sat. Nav) which are convenient to refer to as Portable Navigation Devices (PNDs). It should be remembered, however, that the teachings of the present invention are not limited to PNDs but are instead universally applicable to any type of processing device that is configured to process electronic maps, generally so as to provide route planning and navigation functionality. It follows therefore that in the context of the present application, a navigation device is intended to include (without limitation) any type of route planning and navigation device, irrespective of whether that device is embodied as a PND, a vehicle such as an automobile, a portable computing resource, for example a portable personal computer (PC), a mobile telephone or a Personal Digital Assistant (PDA) executing route planning and navigation software or a server, or other computing device, providing such functionality across a network.

Figure 1A:
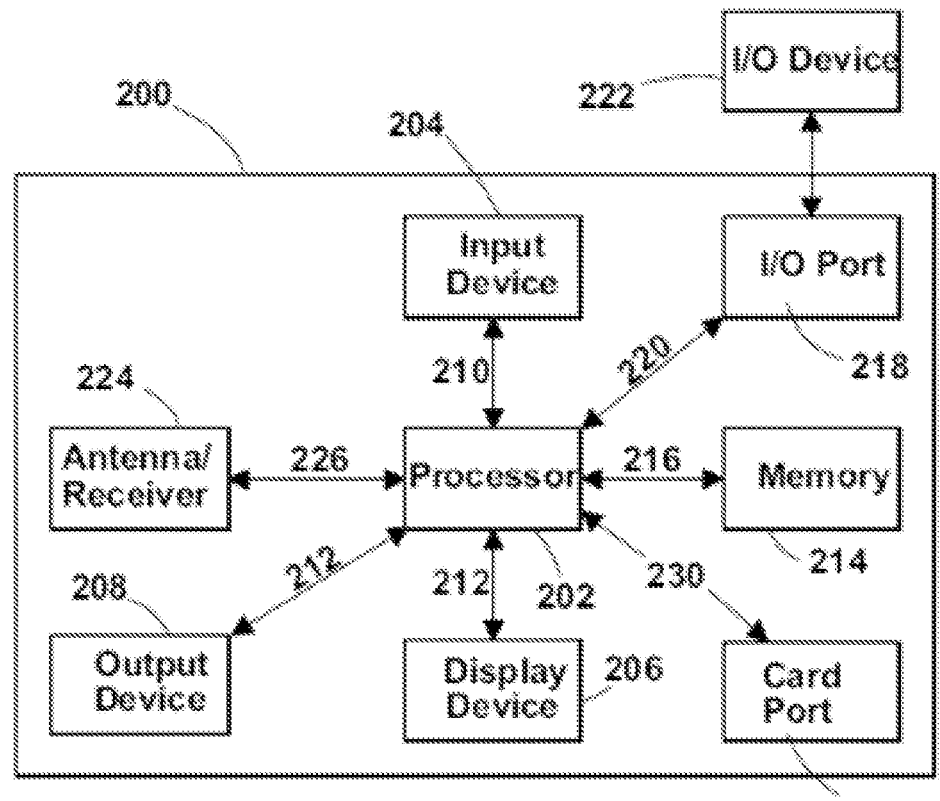
FIG. 1a is a schematic illustration of electronic components of a Portable Navigation Device (PND) or any other suitable navigation device.

An example of such a navigation device in the form of a PND is shown in FIG. 1a and it should be noted that the block diagram of the navigation device 200 is not inclusive of all components of the navigation device, but is only representative of many example components. The navigation device 200 is located within a housing (not shown). The navigation device 200 includes processing circuitry comprising, for example, the processor 202 mentioned above, the processor 202 being coupled to an input device 204 and a display device, for example a display screen 206. Although reference is made here to the input device 204 in the singular, the skilled person should appreciate that the input device 204 represents any number of input devices, including a keyboard device, voice input device, touch panel and/or any other known input device utilised to input information. Likewise, the display screen 206 can include any type of display screen such as a Liquid Crystal Display (LCD), for example.

In the navigation device 200, the processor 202 is operatively connected to and capable of receiving input information from input device 204 via a connection 210, and operatively connected to at least one of the display screen 206 and the output device 208, via respective output connections 212, to output information thereto. The navigation device 200 may include an output device 208, for example an audible output device (e.g. a loudspeaker). As the output device 208 can produce audible information for a user of the navigation device 200, it should equally be understood that input device 204 can include a microphone and software for receiving input voice commands as well. Further, the navigation device 200 can also include any additional input device 204 and/or any additional output device, such as audio input/output devices for example.

The processor 202 is operatively connected to memory 214 via connection 216 and is further adapted to receive/send information from/to input/output (I/O) ports 218 via connection 220, wherein the I/O port 218 is connectible to an I/O device 222 external to the navigation device 200. The external I/O device 222 may include, but is not limited to an external listening device, such as an earpiece for example. The connection to I/O device 222 can further be a wired or wireless connection to any other external device such as a car stereo unit for hands-free operation and/or for voice activated operation for example, for connection to an earpiece or headphones, and/or for connection to a mobile telephone for example, wherein the mobile telephone connection can be used to establish a data connection between the navigation device 200 and the Internet or any other network for example, and/or to establish a connection to a server via the Internet or some other network for example.

The memory 214 of the navigation device 200 comprises a portion of non-volatile memory (for example to store program code) and a portion of volatile memory (for example to store data as the program code is executed). The navigation device also comprises a port 228, which communicates with the processor 202 via connection 230, to allow a removable memory card (commonly referred to as a card) to be added to the device 200. In the embodiment being described the port is arranged to allow an SD (Secure Digital) card to be added. In other embodiments, the port may allow other formats of memory to be connected (such as Compact Flash (CF) cards, Memory Sticks™, xD memory cards, USB (Universal Serial Bus) Flash drives, MMC (MultiMedia) cards, SmartMedia cards, Microdrives, or the like).

FIG. 1a further illustrates an operative connection between the processor 202 and an antenna/receiver 224 via connection 226, wherein the antenna/receiver 224 can be a GPS antenna/receiver for example and as such would function as the GPS receiver 106 of FIG. 1. It should be understood that the antenna and receiver designated by reference numeral 224 are combined schematically for illustration, but that the antenna and receiver may be separately located components, and that the antenna may be a GPS patch antenna or helical antenna for example.

Figure 3:
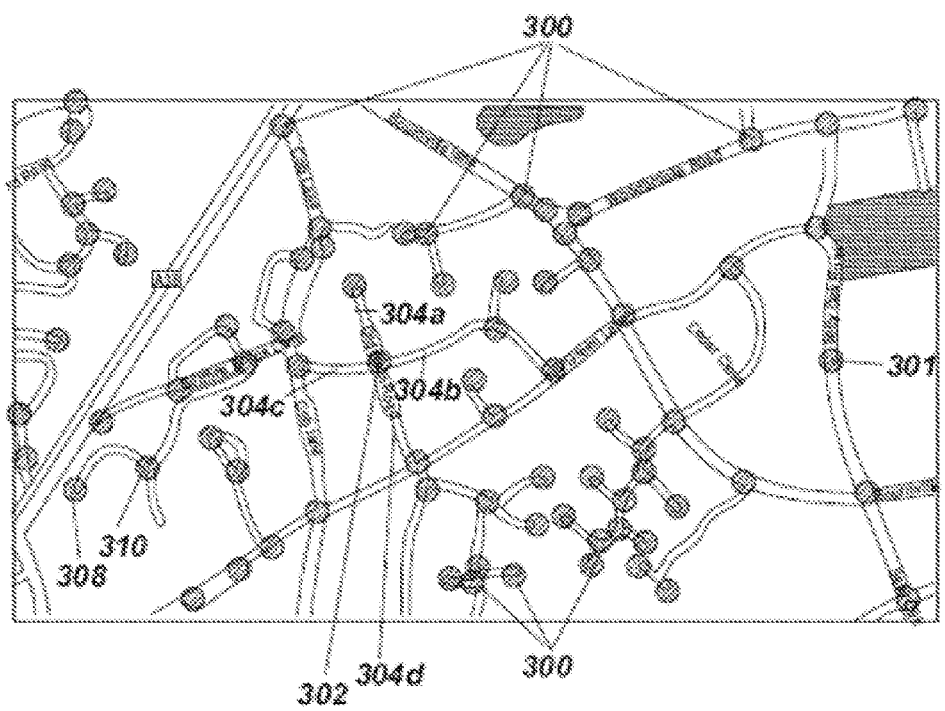
FIG. 3 shows the map of FIG. 2 on which nodes used for routing are shown.

In addition, the portable or handheld navigation device 200 of FIG. 3 can be connected or "docked" in a known manner to a vehicle such as a bicycle, a motorbike, a car or a boat for example. Such a navigation device 200 is then removable from the docked location for portable or handheld navigation use. Indeed, in other embodiments, the device 200 may be arranged to be handheld to allow for navigation of a user.

Figure 1B:
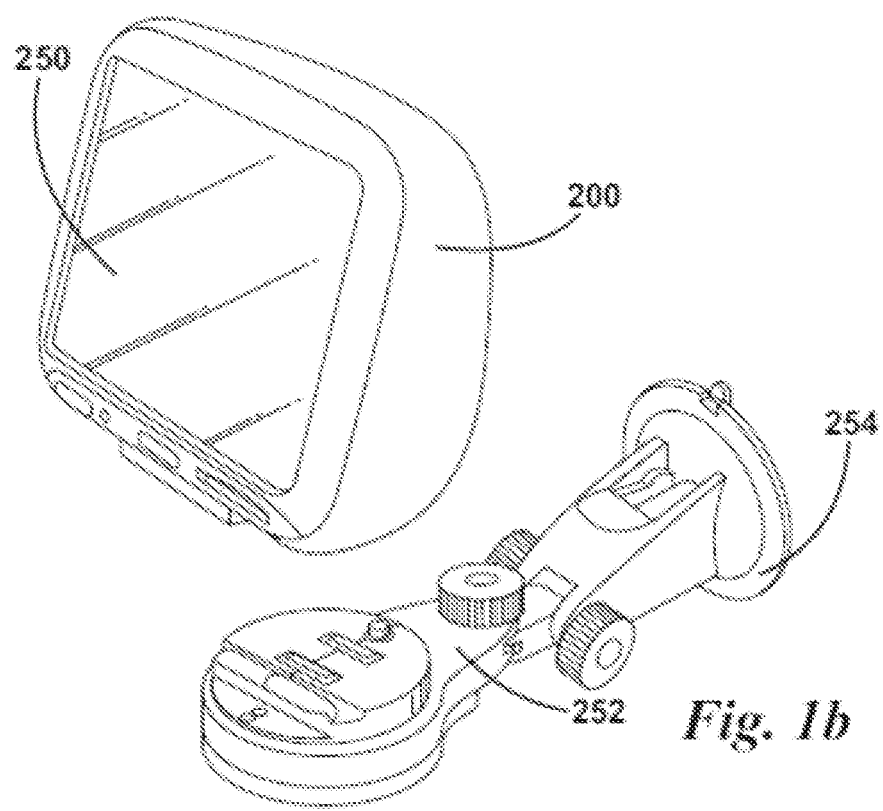
FIG. 1b is a schematic diagram of an arrangement of mounting and/or docking a navigation device.

Referring to FIG. 1b, the navigation device 200 may be a unit that includes the integrated input and display device 206 and the other components of FIG. 3 (including, but not limited to, the internal GPS receiver 224, the processor 202, a power supply (not shown), memory systems 214, etc.).

The navigation device 200 may sit on an arm 252, which itself may be secured to a vehicle dashboard/window/etc. using a suction cup 254. This arm 252 is one example of a docking station to which the navigation device 200 can be docked. The navigation device 200 can be docked or otherwise connected to the arm 252 of the docking station by snap connecting the navigation device 200 to the arm 252 for example. The navigation device 200 may then be rotatable on the arm 252. To release the connection between the navigation device 200 and the docking station, a button (not shown) on the navigation device 200 may be pressed, for example. Other equally suitable arrangements for coupling and decoupling the navigation device 200 to a docking station are well known to persons of ordinary skill in the art.

Figure 1C:
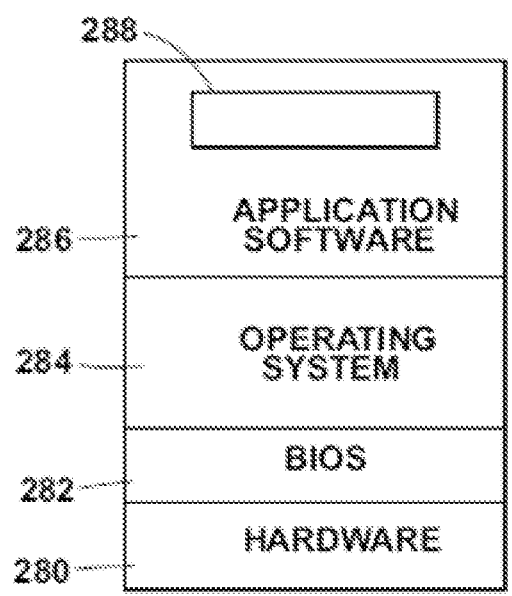

Turning to FIG. 1c, the processor 202 and memory 214 cooperate to support a BIOS (Basic Input/Output System) 282 that functions as an interface between functional hardware components 280 of the navigation device 200 and the software executed by the device. The processor 202 then loads an operating system 284 from the memory 214, which provides an environment in which application software 286 (implementing some or all of the described route planning and navigation functionality) can run. The application software 286 provides an operational environment including the Graphical User Interface (GUI) that supports core functions of the navigation device, for example map viewing, route planning, navigation functions and any other functions associated therewith. In this respect, part of the application software 286 comprises a view generation module 288.

In the embodiment being described, the processor 202 of the navigation device is programmed to receive GPS data received by the antenna 224 and, from time to time, to store that GPS data, together with a time stamp of when the GPS data was received, within the memory 214 to build up a series of positions of the navigation device. Each data record so-stored may be thought of as a GPS fix; i.e. it is a fix of the location of the navigation device and comprises a latitude, a longitude, a time stamp and an accuracy report. This series of positions may be thought of as positioning data.

In one embodiment the data is stored substantially on a periodic basis which is for example every 5 seconds. The skilled person will appreciate that other periods would be possible and that there is a balance between data resolution and memory capacity; i.e. as the resolution of the data is increased by taking more samples, more memory is required to hold the data. However, in other embodiments, the resolution might be substantially every: 1 second, 10 seconds, 15 seconds, 20 seconds, 30 seconds, 45 seconds, 1 minute, 2.5 minutes (or indeed, any period in between these periods). Thus, within the memory of the device there is built up a record of the whereabouts of the device 200 at points in time.

In some embodiments, it may be found that the quality of the captured data reduces as the period increases and whilst the degree of degradation will at least in part be dependent upon the speed at which the navigation device 200 was moving a period of roughly 15 seconds may provide a suitable upper limit.

Further, the processor 202 is arranged, from time to time, to upload the record of the whereabouts of the device 200 (i.e. the GPS data and the time stamp) to a server. In some embodiments in which the navigation device 200 has a permanent, or at least generally present, communication channel connecting it to the server the uploading of the data occurs on a periodic basis which may for example be once every 24 hours. The skilled person will appreciate that other periods are possible and may be substantially any of the following periods: 15 minutes, 30 minutes, hourly, every 2 hours, every 5 hours, every 12 hours, every 2 days, weekly, or any time in between these. Indeed, in such embodiments the processor 202 may be arranged to upload the record of the whereabouts on a substantially real time basis, although this may inevitably mean that data is in fact transmitted from time to time with a relatively short period between the transmissions and as such may be more correctly thought of as being pseudo real time. In such pseudo real time embodiments, the navigation device may be arranged to buffer the GPS fixes within the memory 214 and/or on a card inserted in the port 228 and to transmit these when a predetermined number have been stored. This predetermined number may be on the order of 20, 36, 100, 200 or any number in between. The skilled person will appreciate that the predetermined number is in part governed by the size of the memory 214/card within the port 228.

In other embodiments, which do not have a generally present communication channel the processor may be arranged to upload the record to the server when a communication channel is created. This may for example, be when the navigation device 200 is connected to a user's computer. Again, in such embodiments, the navigation device may be arranged to buffer the GPS fixes within the memory 214 or on a card inserted in the port 228. Should the memory 214 or card inserted in the port 228 become full of GPS fixes the navigation device may be arranged to deleted the oldest GPS fixes and as such it may be thought of as a First in First Out (FIFO) buffer.

In the embodiment being described, the record of the whereabouts comprises one or more traces with each trace representing the movement of that navigation device 200 within a 24 hour period. Each 24 hour period is arranged to coincide with a calendar day but in other embodiments, this need not be the case.

The server is arranged to receive the record of the whereabouts of the device and to store this within a mass data storage for processing. Thus, as time passes the mass data storage accumulates a plurality of records of the whereabouts of navigation devices 200 which have uploaded data. Generally, the server will collect the whereabouts of a plurality of navigation devices 200.

The server may then be arranged to generate speed data from the collected whereabouts of the or each device. This speed data may comprise s time varying speed profile showing how the average speed along navigable segments of a map vary with time.

Figure 2:
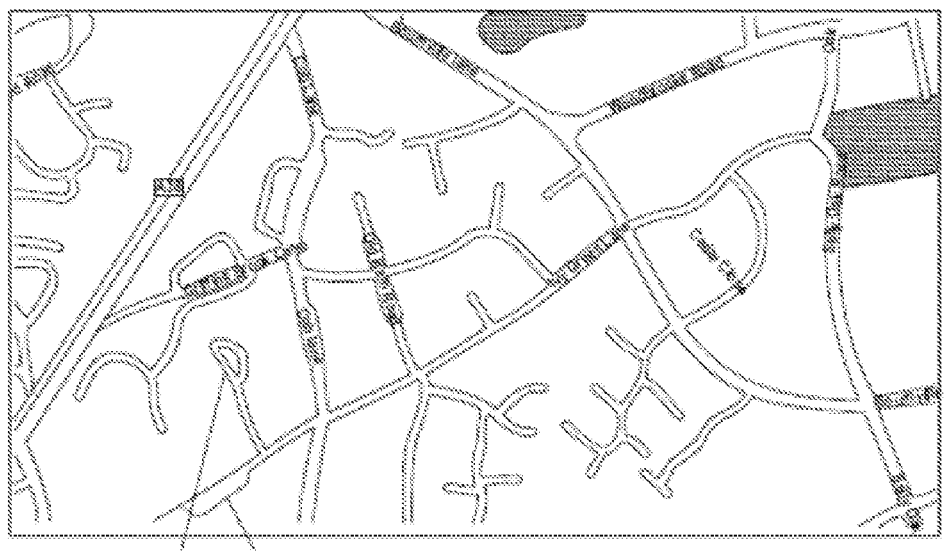
FIG. 2 shows a portion of an example map as generated by embodiments of the invention.

FIG. 2 shows an example of an electronic map which, in the embodiment being described, is viewed on a navigation device across a network which in this case is the Internet. A first step in any of the embodiments being described herein is generation of such an electronic map 1900. The map may be viewed at: http://routes.tomtom.com/

In order for the electronic map of FIG. 2 to be used for routing purposes to occur it has a series of nodes therein which are not typically seen by a user of the electronic map. As such, the nodes, etc. may typically be referred to as map data. However, some of the nodes 300 are shown in FIG. 3 for ease of understanding. These nodes are provided at intersections, end regions of roads, etc. and are used for routing purposes. When a user asks his/her navigation device to plan a route between two or more points the navigation device will generally plan the route between the relevant nodes of the map (although it is possible to plan a route to a group of nodes). As such, the map data can be used to generate a route according to at least one criterion set by a user of the navigation device.

The skilled person will appreciate that the electronic map also comprises further nodes which provide the shape of road segments, the location of entrances to buildings, etc.

Thus, each node 300 has at least a single, and generally a plurality, of road segments which a user may travel along emanating therefrom. For example, the node 302 has four such road segments 304a,b,c,d. Each road segment may be thought of as a navigable segment since it may refer to a route which is not a road such as a footpath, cycle path, canal, railway line, track, or the like. For convenience however reference is made to a road segment. Thus, the map as shown in FIG. 2 shows to a user thereof a plurality of road segments, each of which represents a portion of a navigable route in the area covered by the map.

Route planning methods (such as the Dijkstra method, A* method or Moore/Pape methods) are known. However, these can be prohibitively slow in terms of calculation times. An example of how the speed of such route planning may be increased is shown in U.S. Pat. No. 6,636,800, the teaching of which are hereby incorporated by reference.

Embodiments being described herein may generate, in a pre-processing step, a so-called side-file containing search acceleration data which is used to accelerate generation of a route when processing the electronic map. This information may be held as binary data in what may be termed a bit-vector; i.e. a string of 0's and 1's (or a compressed encoding thereof). As such, the side-file may also be thought of as map data but the side-file may be supplied with or without the electronic map (for example, as shown in FIG. 2). Thus, some embodiments of the invention may provide the map data as a map separable from a side-file, whereas other embodiments of the invention may combine the map and side-file data.

However, the skilled person will appreciate that if a side-file is used then it should be used with the electronic map for which the side-file was generated. If this is not performed then it is conceivable that incorrect routes will be obtained (eg routes which do not minimize the cost function set by a user thereof).

Also, different embodiments of the invention may specify different parameters for the generation of the search acceleration data (which in this embodiment are a series of bit vectors and will be conveniently referred to as bit vectors hereinafter). As such, if subsequent route planning using the generated map data uses different parameters to those used to create the bit vectors, the bit vectors are unlikely to be useful for that route planning.

For example, some embodiments may generate bit vectors for travel through the map by car. If subsequent route planning is used to generate a route for walking then the car specific bit vectors are unlikely to be useful. In another example, some embodiments may generate the bit vectors assuming that a user is happy to travel along a motorway, toll road, etc. If, in subsequent route planning, a user requests a route which does not utilise motorways, toll roads, etc. then the bit vectors are unlikely to be useful.

Some embodiments of the invention may generate a plurality of sets of bit vectors each having a different set of predetermined criterion. For example, embodiments of the invention may generate roughly any of the following: 2, 3, 4, 5, 6, 10, 15, or more sets of bit vectors.

Thus, in some embodiments and to generate the side-file, in a map pre-processing step the nodes are divided into a plurality of regions and as such, any map is divided into a known number of regions—for example N. This is explained in more detail hereinafter with reference to FIG. 5. This pre-processing generates data which can be utilised along-side the map in order to increase the speed of the route planning methods.

Figure 5:
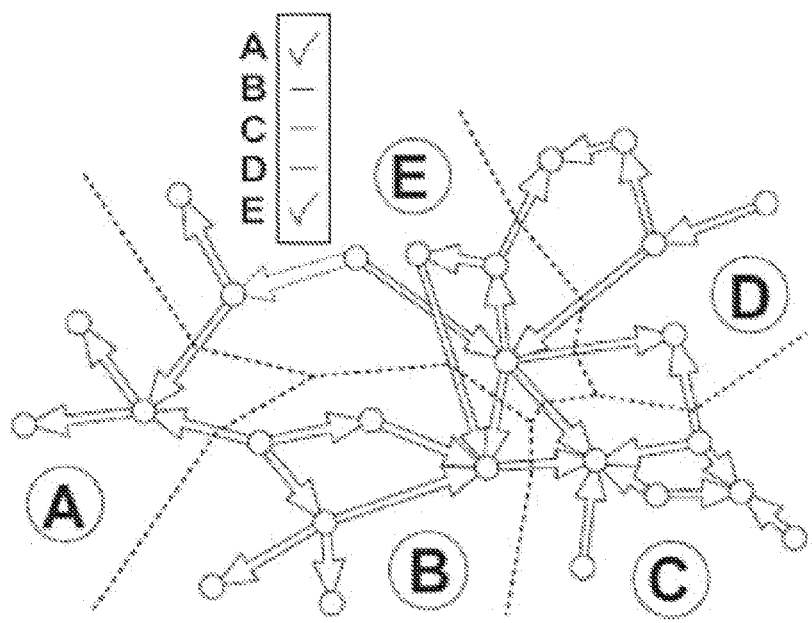
FIG. 5 shows an example of how nodes, in some embodiments, are allocated to the map of FIG. 3.

In an iterative process, which may be recursive, the nodes within the map data are divided into a set of hierarchical regions. Regions, as shown by the dotted lines in FIG. 5, are created each of which contain a plurality of nodes. The method moves those boundaries to include more or less nodes (and therefore navigable segments) and in moving those boundaries takes into consideration parameters of the road segments associated with the nodes. Some embodiments of the method aim to set an upper limit on the number of nodes contained within any one region. The method may also determine membership of a region according to the expected travel time along a navigable segment. For example, if a navigable segment has a slow average travel time (eg a ferry line) then those nodes may be moved to a separate region).

Typically the pre-processing is performed before the map data is used regardless of whether the map data is to be used on a web site or on a device such as a PND. As such, the pre-processing step is often referred to as a server side process.

Whilst any general computing device would be suitable for performing the pre-processing, the skilled person will appreciate that the higher the performance of the apparatus, the faster the pre-processing will be performed. Typically X86 architecture computing device will be utilised for the pre-processing. Such an X86 architecture device would typically run an operating system (OS) such as Microsoft™ Windows™, UNIX, LINUX, OSX™ etc. However, other embodiments may use other computing platforms such as a RISC architecture.

Also, as discussed elsewhere the pre-processing may be performed in parallel and as such may be performed on a plurality of computing devices, or at least on a plurality of processor cores (which may be virtual or real processor cores).

As a next pre-processing step, each road segment (eg 304a-d) within a region is processed to determine whether it is part of a least cost route to each of the number of regions (N) within the map and a bit vector is generated (the least cost assessment). Thus, the bit vector, for each road segment within a region, comprises a bit for each navigable segment within a region. That is the bit vector comprises N−1 bits (1 for each region less the region in question) which are either set to 0 or 1 depending on whether that route forms part of the shortest route to the region represented by the bit. Some embodiments, may add additional bits to provide further information such as headers, visibility areas, and the like. These terms are described hereinafter. This is explained in more detail hereinafter with reference to FIG. 5.

The skilled person will appreciate that in this sense the least cost route can be determined against a number of different cost criteria. For example the least cost may be judged against any of the following criterion: shortest distance; shortest travel time; least expensive (in terms of environmental impact); least petrol used; least $CO_2$ generated, etc. In the current embodiment the least cost is judged against the shortest travel time.

Thus, the skilled person will appreciate that for a map covering a significant area N is likely to be large. Thus, the pre-processing can take a significant amount of time.

Thus, in an example map, for example covering Europe and Russia there might typically be 50,000,000 nodes having 120,000,000 road segments. Assume that there are 100 regions within the map then N equals 100 and there are 120,000,000×100 (N) bits belonging to the bit vector; i.e. $12×10^9$ bits are needed to store the 99 (i.e. N−1) bits for each road segment of the map. Using embodiments of the invention described below, such a map may use roughly 500 Mb of additional storage.

WO2009/053410 discusses a method which assigns speed profiles which give the speed along a route of a map as a function of time. The contents of this application are hereby incorporated by reference. As such, and for routing purposes, whether or not a route constitutes part of the fastest route to another region will vary as a function of time. That is, as the traffic density increases/decreases, for example in rush hours and the like, it will become less/more desirable respectively to use a route.

Some embodiments may store a plurality of bit vectors for each road segment. The skilled person will appreciate that the higher the resolution at which the speed is recorded the higher the number of bit vectors required. However, other embodiments may make an assessment of the fastest route utilising a time varying function much as described in WO2009/053410.

When route planning across the electronic maps it is believed that it is necessary to be able to do this using a time granularity of roughly centi-second accuracy; that is to be able to specify the time of departure from a node to an accuracy of 0.01 of a second in order to correctly determine the lowest cost route.

Thus, when considering this level of accuracy it will be appreciated that for the map considered above having 50,000,000 nodes and 120,000,000 road segments has $120,000,000^2$ possible routes therethrough. When the time dimension is further considered the number of possible routes is further increases: 7 (i.e. days per week)×24 (i.e. hours per day)×3600 (i.e. seconds per hour)×100 (i.e. cent-seconds per second)× $120,000,000^2$=870.912.000.000.000.000.000(sextillion) possible routes. At current processing levels and using a naive approach in which each segment is explored at each time interval would take approximately 27,616,438,400,000,000 years. The map of Europe and Russia that the applicant currently is growing year on year thereby increasing this further.

Thus, it will be appreciated that a significant amount of data is required in order to store and process the data in the pre-processing stages.

As such, embodiments of the present invention use techniques in order to significantly reduce the amount of pre-processing. These techniques are now described in more detail and some embodiments of the invention may utilise all, whereas other embodiments may utilise only some of the techniques.

Different embodiments of the invention may use different combinations of the features outlined below. As such, some embodiments may utilise all of the techniques described to reduce the amount of information. At the other extreme, other embodiments may utilise none of the techniques to reduce the data.

Some embodiments of the invention do not calculate bit vectors for road segments which do not meet predetermined criteria—as shown as step 1902 (i.e. the road segments do not fulfil a predetermined criterion of the road property). For example, road segments may not have bit vectors calculated for them if it is not possible to travel along that road segment in a predetermined class of transport.

Thus, in an example where criterion of mode of transport is set to a car the following road segments may not have bit vectors calculated for them:
- railways;
- segments present in the map data which do not correspond to a navigable segment;
- one way road in wrong (illegal) direction;
- road segments which are non-navigable by a form of transport (eg pedestrian zones, footpaths, when considering driveability by car);
- road segments at a non-decision point (i.e. no turns away from road segment);

Reduction of Network

One technique is to reduce the size of the network that is considered for the assessment as to whether road segments forms part of a least cost route; reducing the number of road segments reduces the amount of time it takes to make the calculation as shown at step 1904.

Figure 4:
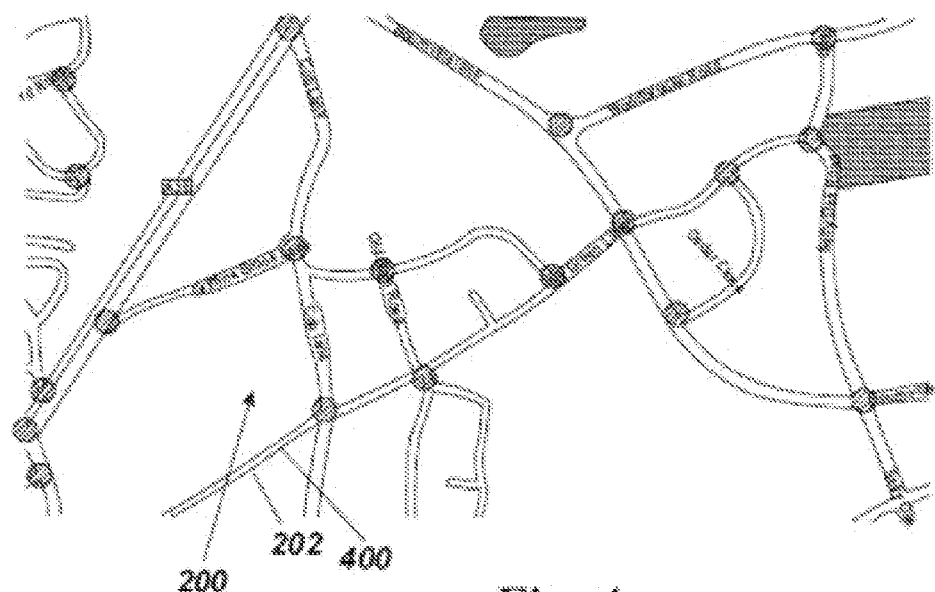
FIG. 4 shows the map of FIG. 2 following processing.

To illustrate this technique, the road network as shown in FIG. 2 is also shown in FIG. 4 but with road segments which are not useful for the least cost assessment deleted therefrom. This reduction of the network aims to provide the smallest sub network on which the least cost assessment should be made; thus the skilled person will appreciate that navigable segments have been removed to form a core network.

In mathematical terms the network that is left, and as illustrated in FIG. 4, can be described as the largest bi-connected component of the undirected representation of the largest strong component of the road network of FIG. 2. The core network is determined by applying standard techniques for both strong-connectivity (also known as bi-connectivity) with adaption to road traffic regulations such as turn restrictions and local access. The skilled person will appreciate that strong-connectivity indicates that travel is possible in both directions between two nodes (i.e. from A→B as well as B→A).

Thus, referring to both FIGS. 2 and 4 it can be seen that dead-ends such as the cul-de-sac 250, redundant loops 252, etc. have been deleted. However, it will be seen that a node (eg 400 in FIG. 4) remains at the origin of the road-segments that have been removed. This is for reasons discussed hereinafter.

Thus, in reducing the network of FIG. 2 to that shown in FIG. 4 navigable segments have been removed for which search acceleration data can subsequently be recovered; i.e. removing navigable segments have been removed from the network which form parts of the network that are sufficiently small according to some predetermined criterion and that may be disconnected from the rest of the network by removing a set of navigable segments that fulfils some further predetermined criterion. For example, the search acceleration data for node 302 may be readily used for the node at the distal end region of navigable segment 304a with little affect on the performance of any route planning.

Subsequent to the reduction down to the core network (eg as shown in FIG. 4), the core network is partitioned to provide the regions described above. In the embodiment being described, the network is partitioned according to multiway arc separators. The skilled person will appreciate that in such a network if the road segments (i.e. the arcs) which are bisected by region boundaries are removed then the road segments that remain in any one region would not be connected to any other region.

Partitioning Network—Step 1906

However, before partitioning is performed the following steps are made:
1. Islands are determined and partitioned independently. Islands tend to be physically separated from other parts of the network and link thereby by means such as ferry links, etc. These behave differently from typical road segments (i.e. average speeds are significantly lower, etc) and if such links are included in the partitioning then the method does not perform as well as may be expected.
2. Crossings, roundabouts and other junctions, which are represented by more than one node in the network are contracted so that nodes belonging to the same crossing, etc. do not end up in different regions.
3. Simple paths (i.e. connections between two nodes without turn possibilities) where all navigable segments share the same set of characteristics (eg ferry segments, segments belonging to pedestrian zones or gated communities, etc) are contracted to reduce the input size of the network passed to the partitioning system. For example, looking at FIG. 3, node 301 may be collapsed onto the node directly below it; i.e. nodes are collapsed onto one another if they have two or less than two navigable segments connected thereto.

In further embodiments, complex junctions between navigable segments may comprise a plurality of nodes. Such complex junctions may be collapsed onto a single node (i.e. nodes are collapsed, which occur at junctions between navigable segments, onto one another in predetermined situations).

Embodiments of the invention being described employ a divide and conquer approach which is outlined at http://labri.fr/perso/pelegrin/scotch. The methods outlined herein divides the map to comprise a number of regions which are not based upon an area of the map but which are based upon the number of nodes contained within a region. Having nodes which are so organised has the advantage that it can help to make routing using the regions more efficient because it helps to deliver regions having similar local search diameters.

Each node has identity numbers associated therewith including a region ID and as such, nodes in the same region have same region ID numbers. Nodes belong to regions at L hierarchical levels. Level 0 is by convention the coarsest level (used for long distance routing). Level L−1 is the finest level.

Rather than setting an absolute number of nodes to be contained within any one region it some embodiments of the invention may set a cap on the maximum number of nodes and allow some flexibility below this. For example, the method may specify a maximum number of 100 nodes per region which could result in a spread of nodes per region of typically 60 to 100 nodes. A cap is felt advantageous over a set number of nodes since a set number can result in regions of forced shapes which in turn lead to sub-optimal routing when using the regions.

Multiple Levels

Figure 6:
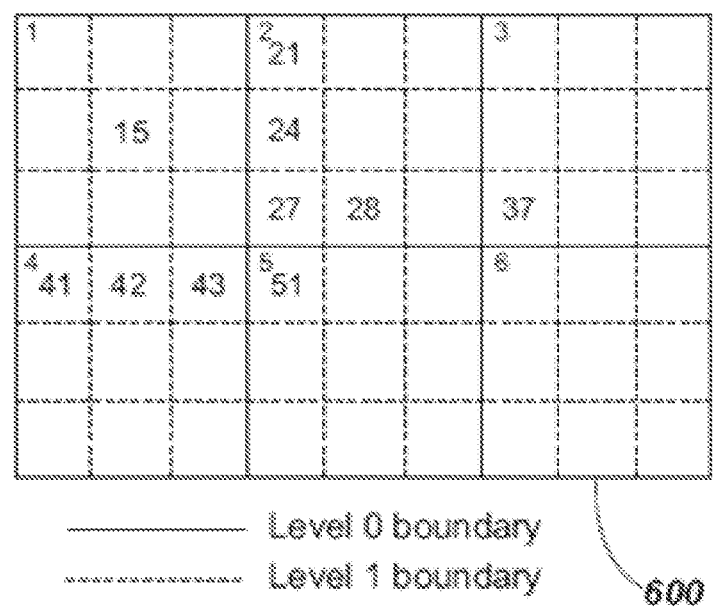
FIG. 6 illustrates an example of how a map may be partitioned into a plurality of nested regions.

In the embodiment being described, the partitioning is performed to provide a plurality of levels of nested regions which is conceptually exemplified in FIG. 6. It will be clear from FIG. 6 that a hierarchical nature exists with the coarsest level (0) being subdivided to provide level 1, which is in turn subdivided to provide level 2 which is the finest level.

The number of nodes in each region varies between levels and the coarser levels (which tend to cover a larger geographical area) have more nodes therein than lower levels. As such, the coarser level in the embodiment being described (eg level 0) is typically used for long range routing purposes whereas the finer levels (eg level 2) are used for routing at short range.

A portion of the bit vector for each road segments comprises bits for each of the levels. The number of bits is the number of regions in each level.

To give an idea of the amount of data to encode (in a typical embodiment the number of levels would typically be L=3):

global level=0 would typically have 100 regions.
intermediate level=1 would typically have 10 regions for each region of level 0 (i.e. 100×10).
most detailed level=2 would typically have 5 regions for each region of level 1 (i.e. 100×10×5).

Use of hierarchical levels is advantageous since it reduces, perhaps significantly, the amount of processing that is required. In the current embodiment being described 100×10×5 regions (i.e. 5000 regions). Thus, in a flat structure, having the same number of regions, would require methods outlined herein to refer to 5000 regions. However, embodiments described herein this can be reduced by referring to nodes in the appropriate level.

The number of levels and number of regions per level will typically be tuned once various factors are known for a map. For example, how much storage can be allocated to the map and speed at which routing should be performed. The skilled person will appreciate that there is a compromise in that as the amount of pre-processing is increased then the larger the map size becomes to hold the data, but the faster routes can be calculated using that map.

In one embodiment, there are 3 levels of regions. However, in other embodiments there may be any number of levels. For example, there may be roughly any of the following number of levels: 1, 2, 4, 5, 6, 7, 8, 9 or 10.

Thus, using the example above, a map of Europe and Russia which typically has 50,000,000 nodes and 120,000,000 road segments, the most naive encoding would use fixed size encoding for region ID for every node at each level, and fixed size bit vector for each road segment at each levels. Thus, the size of such a basic encoding can easily be calculated as follows:

each node region ID at level 0 would use log_2(100) bits=7 bits
each node region ID at level 1 would use log_2(10) bits=4 bits
each node region ID at level 2 would use log_2(5) bits=3 bits
each bit vector at level 0 would use 100 bits (100 regions minus 1 for the current region)
each bit vector at level 1 would use 10 bits (10 region minus 1 for the current region)
each bit vector at level 2 would use 5 bits (5 region minus 1 for the current region)

Figure 6A:
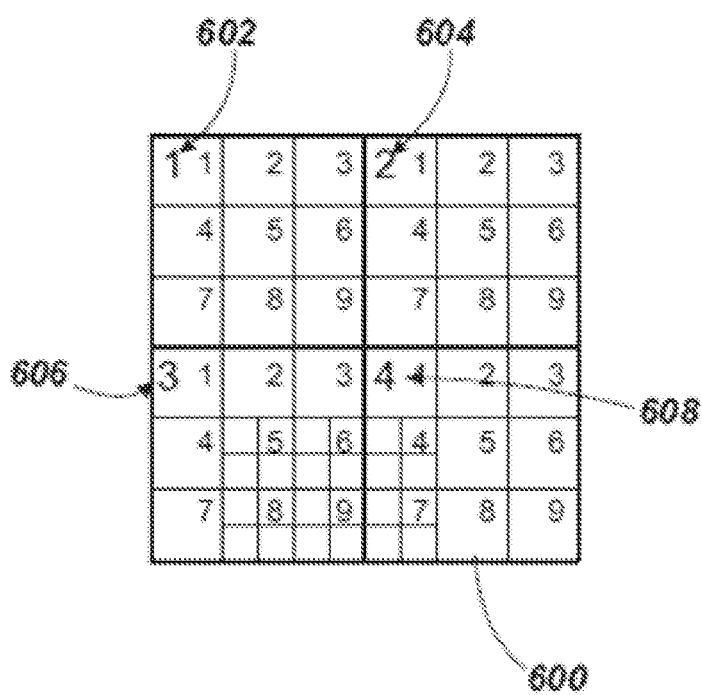
FIG. 6a illustrates an enhancement of the partitioning of FIG. 6.

FIG. 6 shows a coarsest level of region 600, which in the Figure provides 6 regions 1-6. Each of these regions is sub-divided into further regions, in this embodiment nine sub-regions, as represented by the dashed line within the coarse level of region 600. Thus, the 6 coarse level regions may be thought of as coarser level regions and the 9 sub-regions may be thought of as finer level regions which are in a neighbouring region to the coarser level. In the embodiment being described a further level of subdivision is used in which each of the regions provided by the dashed lines are also subdivided, thus providing three levels of partitioning but these are not shown in FIG. 6 for ease of reference (but are shown in FIG. 6a). Other embodiments may of course use more levels (eg 4, 5, 6, 7, or more levels) or fewer levels (eg 1 or 2 levels).

Thus, embodiments of the invention introduce so-called visibility areas for finer-level regions step 1908. A visibility area of a k-region is a set of (k−1) regions, where the region is distinguishable on its own bit in the flag sets. Naturally, the visibility area always includes the (k−1) region to which the given k region belongs. Additionally, it may contain some neighboured (k−1) regions. The visibility areas are to be computed during the pre-processing and stored in association with the bit vector. Here the k regions may be thought of as the finer regions and the (k−1) regions may be thought of as the coarser regions.

The relation between k regions and their (k−1) level visibility areas can be also seen from the opposite side: each (k−1) region knows its outskirts consisting of k level regions lying in the neighbourhood. Seen this way, it can be seen that the flag sets of the road segments are no more of fixed length throughout the whole map; instead, the bit vectors in each 1-region have their specific length A+B+C+Noutskirts 0+Noutskirts 1. Where A refers to the coarsest level of regions, B refers to the middle granularity regions and C refers to the finest granularity of regions (in an embodiment in which there are three levels).

Sub-sequent pre-processing computes the visibility areas prior to the shortest path calculations to generate the bit vectors. The method of finding the visibility area can be described as follows:

Then, for each region R at each level but the topmost, the neighbourhood graph is explored for each k-region, using a breadth-first search in the region adjacency graph until the following metrics exceed the selected thresholds:
graph-theoretical distance from R to the current region's node
Euclidian distance between the median points of R and the current region; or
any of the other distances described elsewhere herein.
then for each visited k-region, which lies close enough to the start region, add its containing (k−1)-region to the visibility area.
The "closeness" relation should take both the geographical metric (e.g. distance between the region median points) and graph-theoretical distance into account. (Thus, a region may be "close" if it geographically far but linked to the current region by fast connections. Likewise a region may be thought of as "distant" even if it is geographically close if it is difficult to travel between regions.)
The exact threshold values may be subject to experimental tuning, as they depend on the map specific characteristics like the average diameter of metropolitan areas, which are most susceptible for negative effects described above such as increased preprocessing, etc. Navigable segments with extraordinarily long traveling time (like ferries or road segments belonging to pedestrian zones) are hidden during the adjacency graph traversal, this way visibility areas are always confined to single islands or small archipelagos belonging to the same region.

Thus, the regions visited during the breadth first search constitute the neighborhood of R. The inclusion-minimal set of the regions of the next coarser level completely covering the neighborhood is called visibility area of R. The reverse relation is called vicinity: the vicinity list of a region Q (at level L) consists of all regions at level L+1 having Q in their visibility areas.

To give a specific example, and referring to FIG. 6, examples of the visibility areas are as follows:

If we decide that the minimal distance between each 1-region and the border of its visibility area should be at least 1, then the visibility areas for some selected 1-regions will consist of the following 0-regions (the own 0-region can be omitted, as it is always there):

15:
(i.e. level 1 region no. 15 has no visibility areas shown since the own 0-level region can be omitted as it is always present).

28: 5
(i.e. the visibility area of level 1 region no. 28 contains the level 0 region no. 5).

37: 2, 5, 6
(i.e. level 1 region no. 37 has three regions in its visibility area, namely level 0 regions no. 2, 5 and 6)

In addition to considering the level 0 neighbours of a level 1 region, the level 1 neighbours are also determined for each level 0 region. Thus as an example, 1: 21, 24, 27, 28, 41, 42, 43, 51
(i.e. for the level 0 region no. 1 the level 1 regions are: 21, 24, 27, 41, 42, 43, 51).

Thus, in this example, it can be seen that region 28 is listed despite it not being in the leftmost column of region 2. This for example might be because region 28 has fast links to region 1 and as such is close when considered in terms of time rather than distance. The skilled person will appreciate that closeness may be judged against other metrics such as greenness (least $CO_2$ or the like), etc.

Some embodiments may use the visibility area to reduce the amount of pre-processing required to generate the search acceleration data by constraining the calculation of the search acceleration data. For example, embodiments may use a reverse search from a destination region (e.g. region 24 of FIG. 6) to an origin navigable segment (e.g. in region 27 of FIG. 6). This reverse search may be constrained in such a way that it stops when all navigable segments in the visibility area of the destination region are reached by a shortest route. For example, assuming the visibility area of region 24 to be region 2, the reverse search will stop once all navigable segments in region 2 are reached by a shortest route. The skilled person will appreciate that shortest routes within region 2 might pass through regions not included in the visibility area of region 24. For example, the shortest route between two locations in region 2 might pass through region 1.

More specifically, this might be true for the shortest route between an origin navigable segment in region 27 and a destination in region 24. This route has to be considered in order to generate the correct search acceleration data for region 24. The skilled person will appreciate that the constrained search described above will generate correct search acceleration data for routes passing through region 1: inside region 2, in particular in region 27, a search that uses the search acceleration data will use search acceleration data for region 24; when it progresses to region 1, it will use search acceleration for the coarse region 2. Since region 1 is not in the visibility area of region 24, navigable segments in region 1 will have search acceleration data for the coarse region 2, but not for the finer region 24.

Additional, or alternative embodiments, may also use the visibility area to increase the search acceleration data stored for a given navigable segment. Whilst this may increase the amount of pre-processing required it can increase the speed at which route planning can be performed using the map data containing such search acceleration data. Assuming the visibility area of region 51 to include both region 5 and region 4, an accelerated search to destinations in region 51 will already use acceleration data specific to region 51 present in region 4; i.e. the road segments within region 4 have additional search information added thereto indicating that they contain further minimum cost data to region 51. This additional information may be referred to as a relevant bit. This is regarded advantageous to prior art which would only apply acceleration data to level 5 in region 4, thereby suffering from a much broader search front close to region 51.

Encoding of Neighbour Lists

FIG. 6a shows more detail of the levels that may be employed when compared to FIG. 6. Level 0 is the coarsest level and may be thought of as level k−1. For ease, in FIG. 6a only regions 1 to 4 are shown (i.e. 602; 604; 606; 608). Each of these k−1 regions is further divided into 9 regions (1-9) which may be referred to a k level regions or level 1 regions. Further, each of these level 1 regions is divided into 4 k+1 level regions (i.e. level 2 regions).

Generation of Bit Vector

Figure 7:
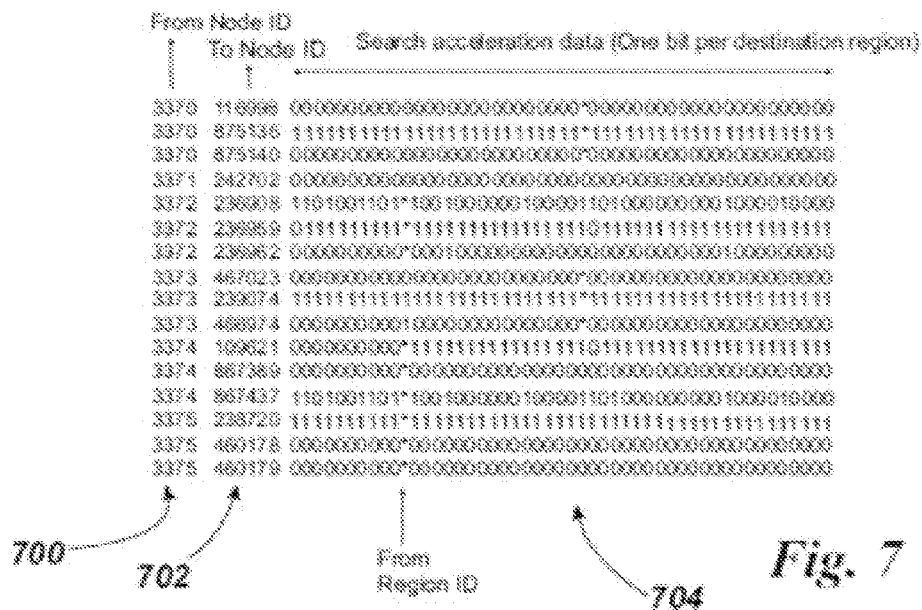
FIG. 7 shows an example set of bit vectors utilised by embodiments of the invention.

Once the network has been partitioned into the hierarchical levels of regions (3 in the embodiment being described) it is processed to determine the least cost route to each of the regions and a bit vector is created for each road segment within a region step 1910. Thus, as discussed above each road segment within any one region is analysed with respect to a cost function to determine whether it is part of a lowest cost route to each of the other regions. A bit vector is generated for every road segment in a region as is shown in FIG. 7 which, for ease of comprehension, shows a simplified bit vector.

It should also be appreciated that the lowest cost route is determined, not just a single time period, but is calculated for a plurality of time periods as described hereinafter.

This calculation is performed for the network shown in FIG. 4 (i.e. the reduced network). Portions of the network in FIG. 3 which have been removed are effectively collapsed onto the node from which they originated. For example, the end-node of road segment 304a shown on FIG. 3 is collapsed onto the node 302 in FIG. 3.

It will be seen that each bit vector comprises three columns: a leftmost column 700 containing an identity number for the node at the start of the road-segment under consideration; a second column 702 containing the identity number for the node at the end of the road-segment under consideration and a third column 704 containing the bit vector for that road segment. Thus, it will be seen that each road segment is identified by two nodes, one at each end thereof.

Any suitable routing method may be used to determine whether a road segment is part of the lowest cost route. In this particular embodiment the well known Dijkstra method is used to explore the whole network.

However, the amount of processing time may be reduced by employing various strategies. The skilled person that the techniques for reducing the network described above will also reduce the amount of processing time. Embodiments of the invention may employ any one or more of the following:

calculate all bit vector entries corresponding to a region at once. The shortest path tree is calculated in the reverse graph for each navigable segment lying on the boundary. Such an approach is advantageous as each region may be processed in parallel thereby decreasing the processing time.

reduce recalculations of similar shortest path subtrees.

do not recalculate bit vectors which have already been generated.

Thus, in summary one embodiment may perform the following in order to generate the bit vectors:

Preparation Steps:
1. As the skilled person will appreciate the search through the electronic map can be represented by a directed acyclic graph (DAG). This graph and the adjoined data structures (turn costs and long extension tables) are reversed.
2. The simple road segments with respect to the finest level are contracted (i.e. the end nodes are collapsed onto one another as discussed elsewhere). A road segment (i.e. path) is called simple if it consists of one or more nodes of degree=2, all lying in the same region of the given level, and the navigable segments have identical attributes: for example "is a ferry", "is NoThrough", and "IsNoDriving".
3. For each region, the road segments of the road network are sorted into three groups: outbound, inbound, and inner road segments, depending on whether the head (i.e. from_node) and/or tail (i.e. to_node) node belongs to the region. That is, if both the head and tail are within the same region the road segment is termed an inner road segment; if the head is within the region but the tail is not then the road segment is termed an outbound road segment; and if the tail is in the region but the head is not then the road segment is termed an inbound road segment.
4. Special turn restrictions are put on all road segments leaving the NoThrough and NoDriving areas.

The pre-processing routine proceeds in bottom-up manner, starting with the finest partitioning level—i.e. level 2 in the embodiment being described. At each level of regions, the following steps are repeated for each region R:
1. Determine the exploration area of R. At the topmost level (eg region 0 in the embodiment being described) it is the entire graph, on finer levels it is the subgraph confined by the visibility area of R (as described above).
   Thus, at the intermediate level (i.e. level 1) the following steps are only performed for the visibility area of the level 0 region in which those level 1 regions are contained. At level 0, which should be remembered is used for long range routing, the road segments of the entire graph are considered.
   Collect the inbound road segments of the visibility area, that is, road segments leading from nodes outside the area into the area. Then collect the frontier road segments, that is, road segments following the inbound road segments. The road segment L 2 is called following L 1 (and L 1 preceding L 2) if head(L 1)=tail(L 2) and the turn from L 1 into L 2 is not forbidden. The complex crossings are contracted to single nodes for the purpose of finding the frontier road segments. Ferry lines and road segments with "NoDriving" attribute are not considered as frontier road segments.
   Collecting the inbound road segments in this manner can reduce, perhaps significantly, the amount of processing required in the exploration steps described hereinafter. The exploration step(s) can reduce exploration of the graph to consider those routes to a given region which include an inbound route.
2. For each outbound road segment of R, find the root road segments and the number of exploration steps. If the outbound road segment is a sole successor of at least one of its predecessors lying within R, this outbound road segment is the only root road segment, and a single exploration step is performed. Otherwise, if the outbound road segment is bidirectional (that is, drivable in both directions), then the road segment itself and its opposite (inbound) road segment are taken as root road segments of a single exploration step. Otherwise, if the outbound road segment is unidirectional, then each preceding inner road segment (and, if present, its opposite road segment) is taken as a root road segment for a separate exploration step. Finally, regardless of the kind of the outbound road segment, for each traffic extension path running through the outbound road segment, the starting road segment of the extension (if it lies within R) is taken as a root road segment for a separate exploration step.
   On finer levels (i.e. all levels except level 0), the outbound ferry lines are treated specially. As noted above, ferry lines are ignored when determining the region's neighborhood. If the head region of a ferry line does not belong to the visibility area of R, then a single exploration step will be performed with the ferry line being the sole root road segment and the exploration area being constrained to the head region itself.
3. Perform the scheduled exploration steps (described below).
4. Trace back the shortest paths from the road segments within the exploration area to the root road segments. At all levels except the topmost (i.e. Level 0), the ordering of the road segments at which the respective trace starts is affects the results. Suppose R is a level-L region (where L>0), then the outbound road segments of level-(L−1) regions are processed first, then the remaining outbound road segments at level L, and so on towards the finest level; road segments which are inner with respect to the finest level (and have not yet been removed) are processed last. Whenever a road segment is encountered that has already been visited in an earlier trace, there is no need to follow that path a second time. While tracing, the appropriate target bit vectors are set for each visited road segment. At all but the topmost level (i.e. level 0), additional actions take place:
   after the path has first crossed some level-L region boundary, that boundary line and all further road segments on the way to the root road segment are marked with a transit line flag;
   the nodes where the shortest path makes a U-turn are marked with a U-turn flag.
   Finally, at all but the finest level, the correlation matrix entries are filled.

After all regions of the level are processed, the graph is simplified for the next level. First, all road segments not marked as transit lines are removed. Then the accruing new simple paths are contracted; nodes marked as U-turn nodes are preserved.

Finally, the bit vectors are propagated to the road segments removed before processing this level, according to the correlation matrix.

Correlation Matrix

Some embodiments of the invention use a correlation matrix which stores relationships between target regions needed to set the bit vectors on the road segments. At each level L except the finest level, a new correlation matrix is created and used. At level L, the rows of the matrix are indexed by level-(L+1) regions, the columns are indexed by level-L regions, and each matrix entry is a set of zero or more level-(L+1) regions. At the lower levels, most matrix entries are equal to the empty set, i.e. the matrices are sparse.

The purpose of a correlation matrix is to help setting bit vectors on road segments which have been deleted at earlier stages. These road segments are not contained in the directed acyclic graphs resulting from the level-L exploration steps, but they would be if they had not been deleted. More precisely, the correlation matrix is used to set bit vectors to some level-L region S (where L is not the finest level) on road segments in the exploration area of S which have been deleted during the computations at some level>L. For a level-(L+1) region R contained in the exploration area of S, the matrix element M[R, S] will finally be a set of level-(L+1) regions at the boundary of the visibility area of R, such that all shortest paths (in the reversed graph) from S to R pass through one of those regions.

When the matrix is created, all entries are initialized to the empty set. Then, for all level-L regions S, the following two actions are performed.

1. Matrix build-up: For each exploration step with a root road segment/in or on S and the resulting directed acyclic graph D, for each level-(L+1) region R contained in the exploration area of S, and for each inbound road segment l' of R, the matrix element M[R, S] is updated as follows:

Denote by A the exploration area of R (as computed earlier for level L+1). Trace the path in D from l' back to l and check whether it leaves A: if a road segment on this path goes from a level-(L+1) region T to a level-(L+1) region T', where T is still contained in A, but T' is not, then T is added to the set M[R, S], and the next l' is processed.

2. Reading the matrix: for each road segment in the exploration area of S which had been deleted before the level-L computations started, let R be the level-(L+1) region where that road segment ends (again, with respect to the reversed graph). Now the bit vector bit for region S on that line is set to the logical OR of the bit vector bits for region T, where T ranges over all elements of M[R, S].

Note that the bit vector bit for each T will have been set at an earlier level either directly from some directed acyclic graph or in the analogous procedure involving a correlation matrix at some lower level.

Exploration

The exploration step consists of building a directed acyclic graph of shortest paths rooted at the given road segment (pair). This is accomplished by using a variation of the well-known Dijkstra method for shortest path (i.e. minimum cost) computation. The term "shortest" is chosen due to the tradition; actually, the objective function to be minimized can be freely chosen, for example, as the travel time or estimated fuel consumption, or any of the other factors discussed elsewhere.

One embodiment uses a weighted sum of travel time, path length, and other penalty terms suppressing undesired turns and manoeuvres.

The following modifications are made to the classical (Dijkstra) method:

1. It works on the road segment graph, i.e. the items being visited, relaxed, etc. are road segments, not nodes. This is useful to allow the method to account for turn restrictions and/or traffic extensions.
2. The objective function in the label is a vector of pairs (travelling time, cost) for a fixed set of arrival time slots at the root road segment. The time slots are chosen such that all relevant traffic modes are covered (free flow, weekday morning rush hour, evening rush hour, etc.). This is expanded on further below in the discussion about assessing the cost function at a plurality of time periods.
3. More than one label can be stored for a given road segment. If the sets of pending (unfinished) traffic extensions on two labels are not equal, then the labels itself are called independent and both keep propagating over succeeding road segments. Otherwise, if the relation between cost function values for different arrival time slots is not alternating, i.e. one label is unambiguously better than another, the worse label is discarded. Otherwise, a new label is created by merging the better values for each time slot, which is propagated in lieu of the original one. The predecessor set of the merged label is then the union of the predecessor sets of original labels.
4. Special U-turn labels are created on each bidirectional road segment. They encode the possibility of starting the real (non-reversed) route in both directions. U-turn labels are not propagated and may not be merged with normal labels. However, they influence the backtracking phase when the bit vectors are set: a shortest path is flagged only if the starting label is not worse than the U-turn label on the same road segment.
5. At the finer levels, where the exploration area is restricted to a set of regions, the frontier road segments, as defined above, are permanently watched. As soon as all frontier road segments are reached by the search front, the watch comb is built up from the largest (=worst) cost function values per time slot. Then a label on a road segment outside the exploration area, when popped off the heap, is propagated only if its cost function value lies below the current watch comb in at least one time slot. If an exploration area stretches over several islands, a separate watch comb is maintained for each island.

Time Varying Functions

Figure 7A:
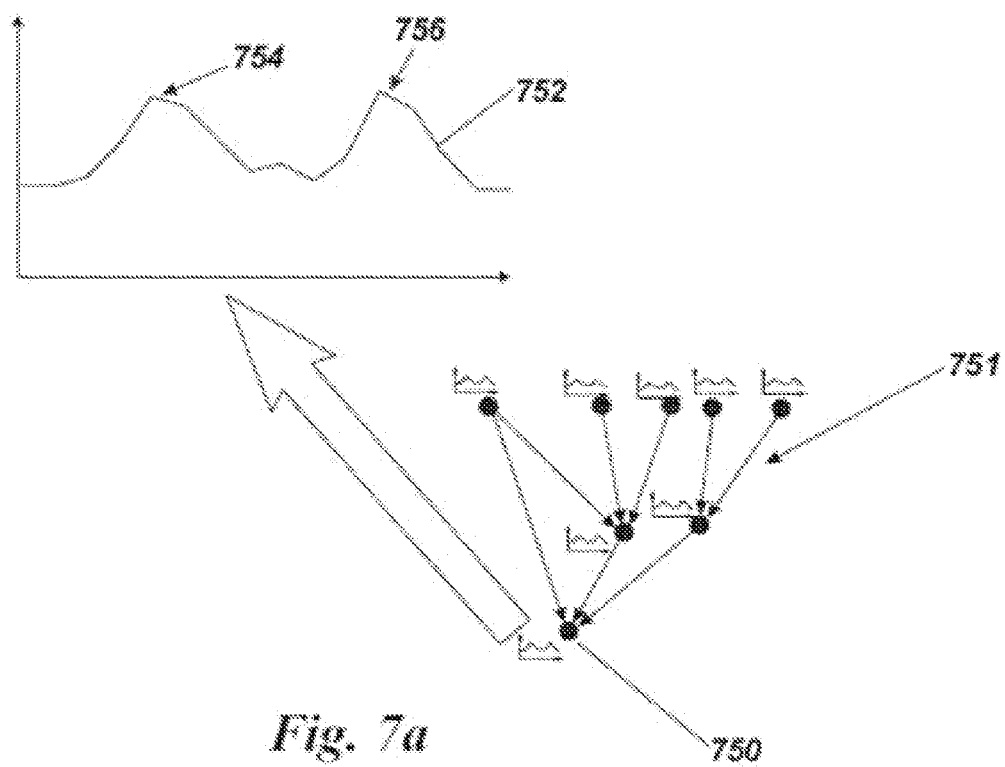
FIG. 7a illustrates how time profiled information is utilised during a Dijkstra exploration of a network.

Some embodiments of the current invention may calculate the bit vector showing the minimum cost route across the network at a plurality of time periods rather than at a single time. The skilled person will appreciate that the lowest cost route through a road network may vary with time due to the influence of traffic density, etc. Therefore, for any one node there may be two or more minimum cost paths, each one for a different time. In this embodiment, the bit vector is not coded with a time reference for when the minimum cost paths are applicable. The bit vector is simply set to identify a navigable segment as either being part of a minimum cost path or not. Therefore, when routing using the minimum cost data, the routing algorithm will have to consider all possible minimum cost paths from a node. This process is now briefly described with the aid of FIG. 7a.

In a standard Dijkstra exploration of a network, as the network is explored, the method uses the total cost incurred to date to get to that point in the network plus the expected cost yet to be incurred.

Thus, some embodiments utilise a function as opposed to a discrete value to make the cost evaluation at each node. Thus, in FIG. 7a each node (eg 750) of the graph 751 that is being explored has a cost function associated therewith which identifies how the parameter being explored (eg time, fuel expended or the like) varies with time. The node 750 may be thought of as an origin node. In some embodiments, an origin node may be synonymous with an origin navigable segment.

The cost function may be associated with a road segment as opposed to node.

The method then processes the expended cost to add the estimated costs by summing the function at the current node with the cost that has been accumulated to date to generate new function. The example shown in FIG. 7a at 752 shows a cost function that has been generated at node 750 by the search method and shows how the travel time (y axis) varies with the departure time (x axis). It will be seen that the travel time increases at points 754 and 756 due to the morning and evening rush hours.

In one particular embodiment, the cost function (for example the average speed on a road segment) is stored at 5 min. intervals; i.e. it is a quantised rather than continuously varying function with a time period of 5 min.

The bit vector for a road segment is set if that road segment is part of the lowest cost route at any time period.

Projecting Core Data to Full Network

Above it was described how the network contained in the map was reduced in order to reduce the number of road segments and nodes that must be considered by the partitioning method. However, the nodes that were deleted in the reduction step should also be considered further in order that routing methods can still generate routes to or from the deleted road segments and nodes.

As such, the deleted nodes and road segments are assigned to the same regions as the node to which they are connected in the core network.

Compression

As discussed, the generated bit vectors are significant in size and therefore it is desirable to compress the information. Embodiments of the invention may perform this in different manners. However, one embodiment utilises various techniques to compress, coalesce and/or correlation of the bit vectors followed by a subsequent Huffman encoding of the bit vectors.

Thus, some embodiments may try and ensure that there is an uneven distribution of bit vectors since this can help to ensure that the Huffman encoding is more efficient than would otherwise by the case.

For example if the bit vectors are distributed as follows:
00000 . . . (49% of the time)
11111 . . . (49% of the time)
????? . . . (2% of the time)
then it may be desirable to manipulate the bit vectors prior to Huffman encoding to having a more uneven distribution such as:
00000 . . . (79% of the time)
11111 . . . (19% of the time)
????? . . . (2% of the time)

Reduction in Generated Bit Vectors

In order to reduce the amount of Bit Vectors that need to be generated embodiments of the invention may use any one or more of the following strategies:
  region IDs are not used for all nodes and are only generated for navigable nodes (eg nodes corresponding to railways are ignored).
  bit vectors are not needed for all road segments and may be used for decision road segments around decision nodes. Decision nodes & decision road segments can be determined by looking at road segment data (as described in this document).
  even though there are many possible bit vectors, some are far more frequent than others, so special encoding can be used for the most frequent ones (eg 000 . . . 000 and 111 . . . 111).
  bit vectors that are not 000 . . . 000 or 111 . . . 111 still often have either most of their bit set to 1, or most of their bit set to 0. So Huffman code of partial blocks should encode them fairly efficiently.
  bit vectors are often identical in nodes close to each other, so delta encoding can encode them efficiently.
  different regions can be made to have more similar bit vector patterns by reordering destination region IDs per source region (idea is described in this document)
  Or of all bit vectors around road segments of a node should always give 111 . . . 111. That properly can be used to encode bit vectors more efficiently.

Some of these are discussed in further detail below.

It is worth noting at this point that techniques described here aim to reduce the size of the bit vectors. However, it is noted that random access to the data is required by devices which use the map data for routing purposes. Generally, efficient encoding of data requires a variable size which would however prevent random access to the data.

As such, embodiments of the invention may use a trade-off in which data is encoded as a series of pages, which are indexed, and then utilises variable encoding within those pages. In such embodiments, random access is achievable to each page (through the indexing). Once a page has been accessed embodiments, may subsequently decode the entire page. This provides a trade-off between efficiency and map size—increasing the number of nodes per page reduces the map size but slows data access. One particular embodiment of the invention uses 16 nodes per page. It will be appreciated that any one node may well have a different number or road-segments leaving that node. As such, even though there may be the same number of nodes there may be a variable amount of road segments per page. Further, different compression may well occur for each of the bit vectors stored on each page.

Figure 8:
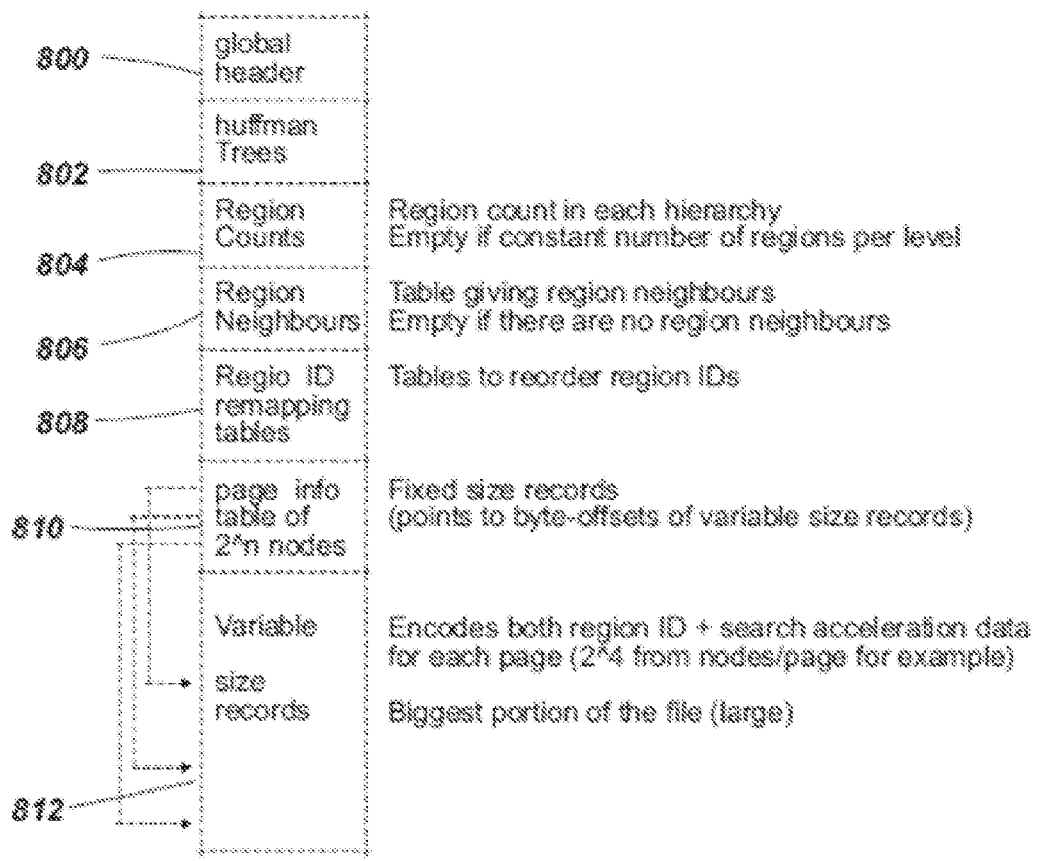
FIG. 8 shows an example file format for a file of an embodiment of the invention.

Such a structure may lead to a map format as shown in FIG. 8. In this The number 'n' is stored within the header and may be altered for different maps in order to optimise the performance for that map.

Tuning 'n' is a trade-off between map size and access speed when decoding map data:
  a large value of n will group many nodes together which is good for map compression, but bad for speed of random access to the data.
  a small value of n will group few nodes together which is good for speed of random access of the data but bad for map compression.
  'n' may be set to 4 for example i.e. pages of 16 from-nodes (a from node being at start end of a road segment—i.e. column 700 of FIG. 7) but keep in mind that each from-node has several to-road segments so assuming 3 to-road segments on average, each means that each page store the equivalent of ~48 road segments.

Figure 9:
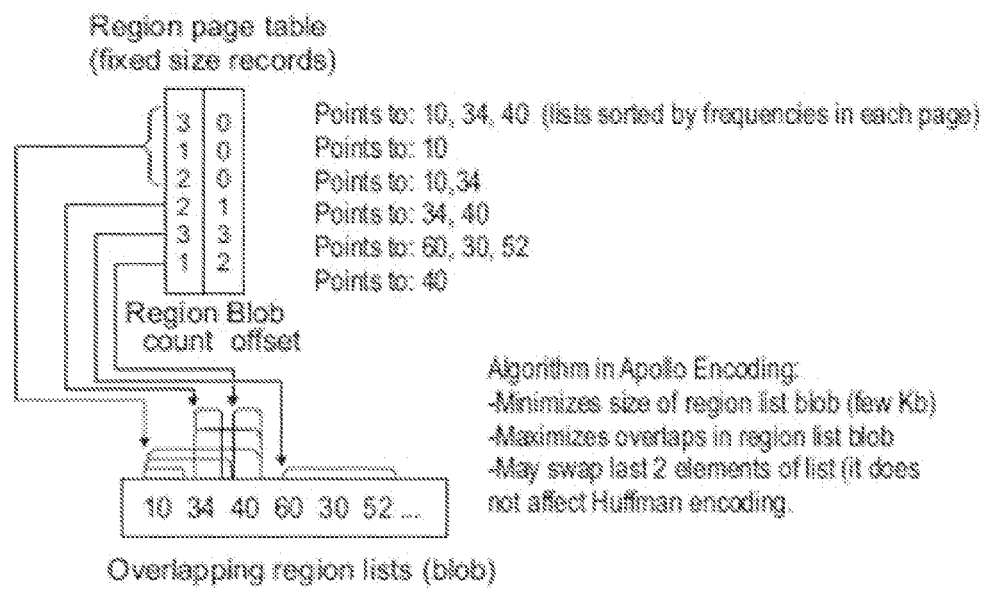
FIG. 9 shows an embodiment of how the region remap table and region ID lists of FIG. 8 may be encoded.

In this format, there is a different format for data depending upon the level of region that is encoded. FIG. 9 shows an example of a format for level 0 (i.e. the coarsest regions) and FIG. 9 shows an example format for other levels of region.

The bit vectors and related information are stored in a data structure, the format of which is shown in FIG. 8 which comprises the following: a header 800; Huffman trees 802 used in Huffman encoding described later; region count in each hierarchy 804 (empty if constant number of regions per level); Region neighbours 806 (empty if no region neighbours); region ID remapping tables 808; bit vector page index ($2^n$ nodes) 810; and the region ID and bit vectors 812. The data structure holding the bit vectors may be held within a single file or may be held within a plurality of files.

In some embodiments the map header 800 is arranged to contain further information indicating the following:
  maximum number of levels
  length of the shortest neighbour list.
  length of the longest neighbour list.
  byte offset of the section which contains all the neighbour lists.

The or each file holding the information may have a section to encode the neighbour lists. The size of all lists are encoded first. Each length of list is encoded relatively to the shortest list length, on a fixed number of bits determined by BitsRequired(longestListLength−shortestListLength). Notice that if all list have the same length, then no bit is needed to encode the lengths.

Then follow the content of all lists. Each list is made of several tuples of neighbour region IDs: pairs at level 0, 3-element tuples at level 2, etc.

Notice that the from-region tuples (portion before ':' in ASCII file) are not encoded. They are implicit since lists are stored for all regions in ascending order. For example, if a map has 3 levels with 100×10×5 (100 regions at level 0, 10 regions at level 1, 5 regions at level 2), then:
- at level 0, the lists are stored for from-regions 1, 2, 3, . . . 100 (100 lists in that order). Each of these lists contains pairs.
- at level 1, the lists are stored for from-regions 1.1, 1.2, 1.3, . . . 1.10, 2.1, 2.2, . . . 2.10, 3.1, . . . 100.9, 100.10 (1000 lists in this order). Each of these lists contains 3-element tuples.
- at level 2: nothing is stored since it's the last level so there are no neighbors.

Each component in a tuple is stored as n bit. The number of bits for each level is determined from the number of regions at the corresponding level. So it is possible to access a list at random. In the case of 3 levels 100×10×5, encoding a tuple a.b.c would use 7 bits for a (because there are 100 regions at level 0), 4 bits for b (because there are 10 regions at level 1), and 3 bits for c (because there are 5 region at level 2).

Example: let's assume a partitioning of 100×10×5 regions: 100 regions at coarse level 0, 10 at intermediate level 1 and 5 at detailed level 2.

In file at level 0, the section containing the neighbour lists will contain:
- 100 numbers indicating the length of the lists for the 100 regions at level 0. Number of bits is computed from BitsRequired(longestListLength−shortestListLength). Each number is relative to the shortest list at the level (shortest list being stored in header).
- Then follow the content of the 100 lists (100 pairs). The first element of each pair is encoded on 7 bits (because there are 100 regions at level 0) and the second element of each pair is encoded on 4 bits (because they are 10 regions at level 1).

In file at level 1, the section containing the neighbour lists will contain:
- 100*10=1000 numbers indicating the length of the lists for the 1000 regions at level 1.
- the follow the content of the 1000 lists (10003-element tuples). The first element of each tuple is encoded on 7 bits (because they are 100 regions at level 0), the second element of each tuple is encoded on 4 bits (because they are 10 regions at level 1 in each level-0 region) and the third element of each tuple is encoded on 3 bits (because there are 5 regions at level 2 in each level-1 region).

In file at level 2, nothing needs to be stored since it is the last level.

Header 800

Typically, the header used in embodiments of the invention is small, and as such the size does not need to be optimized in order to reduce its size. Typically everything is byte or word aligned for convenience:
- (4 bytes) encoding version (increased every time map format changes)
- (4 bytes) map flags (to turn on or off features, 0 initially but can be used later if we need to add optional features)
- (4 bytes) total number of nodes in map
- (4 bytes) total number of road segments in map
- (4 bytes) byte offset of section Huffman trees
- (4 bytes) byte offset of section region blob
- (4 bytes) byte offset of section region page infos
- (4 bytes) byte offset of section bit vector page infos
- (4 bytes) byte offset of section variable size records
- (4 bytes) maximum bit vector page in bits (can be used by route planning methods to pre-allocate worse case for bitstream decoder at startup)
- (4 bytes) average bit vector page size in bits (used to interpolate bit vector page position)
- (4 bytes) minimum bit vector page delta (used to make all deltas>=0, avoiding to store bit sign)
- (2 bytes) maximum size of bit vector history (can be used by route planning methods to pre-allocate history buffer at startup)
- (2 bytes) maximum number of road segments per page (currently not used)
- (1 byte) Apollo level of this file.
- (1 byte) bits per bits vector
- (1 byte) bits per bit vector page delta (field in fixed size record of bit vector pages)
- (1 byte) bits per blob index (field in fixed size record of region page info)
- (1 byte) bits per region count (field in fixed size record of region page info)
- (1 byte) bits per non trivial bit vector block
- (1 byte) log__2( ) of region node page size
- (1 byte) log__2( ) of bit vector page size
- (1 byte) number of Huffman trees to encode local region IDs
- (1 byte) number of Huffman trees to encode bit vector history codes Huffman Trees 802
- Huffman tree to encode number of road segments around each node: tiny, only 10 codes or so, only present in file at level 0)
- Huffman tree to store a block of non trivial bit vector: largest Huffman tree, the larger the better for compression but the more memory is required in route planning methods (trade-off between map compression and memory usage in route planning methods).
- Huffman tree of bit vector delta codes when history size is 0: tiny, only 3 codes
- Huffman tree of bit vector delta codes when history size is 1: tiny, only 4 codes
- Huffman tree of bit vector delta codes when history size is >=n: tiny (number of Huffman trees stored in header)
- Huffman tree for region ID when there are 3 regions in a region page: tiny, only 3 codes
- Huffman tree for region ID when there are 4 regions in a region page: tiny, only 4 codes
- Huffman tree for region ID where there are >=n regions in a region page: tiny (number of Huffman trees stored in header).

Region Remap Table 804 and Region ID Lists 806

Figure 11:
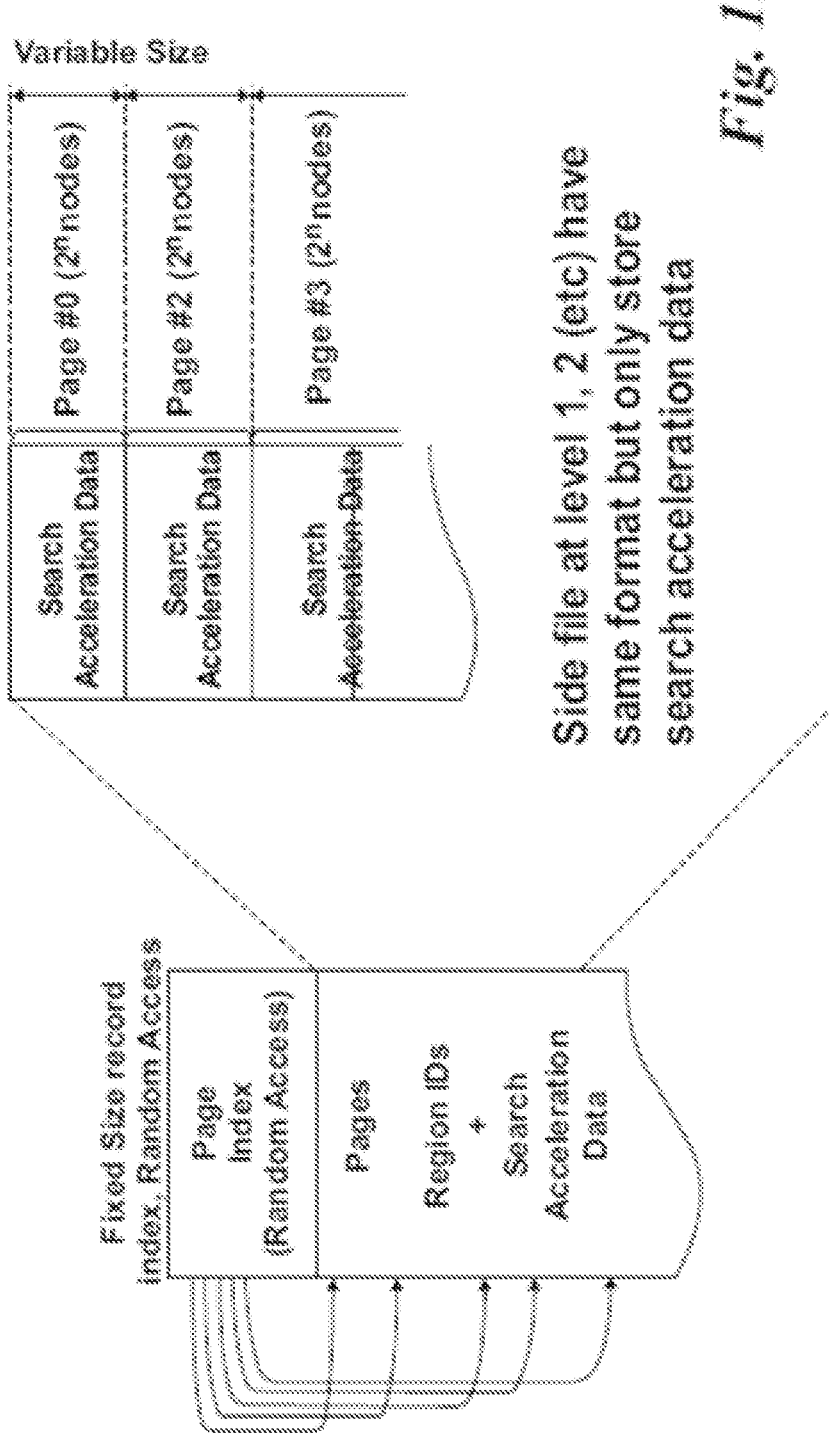
FIG. 11 shows an example file format for nested regions other than the coarsest.

Although smaller than other parts of the file format of FIG. 8, the region ID's 806 may also be compressed as is exemplified in FIG. 11. In this, geographical correlation may be used in order to reduce the amount of data used.

Each region page stores a list of the distinct regions in that region page. This list is expected to be small in most cases (in fact many pages are likely to contain only 1 region at least at level 0). Lists of region have variable size. The data within the pages should be accessible on a random basis (i.e. Random Access) and as such a fixed table size is used to allow this.

Each list of distinct regions is ordered by frequency of nodes in each region: the first element of the lists corresponds to the region with the largest number of node in the page, the last element of the list is the region with the least number of nodes in the page.

Each nodes in region pages, we can encode its region ID using a local region ID (local to the page). This local ID is the index of the region in the page (which is a small integer, often 0 since 0 corresponds to the most popular region in the region page.

Region IDs of nodes are stored as follow:

A Region Array, containing region ID', stores all possible overlapping lists of regions in pages. Lists of region are consecutive region IDs in that array. Lists can (and do) overlap. The array does not store the start and end of each list (this is done by the region page info table).

The region page info table is a fixed size record table (hence accessible at random) and each record contains the index in array of beginning of a list+number of items in the list.

Each node contains a local node ID (local to it's page).

Each of these concepts are further defined hereafter.

Region Array

The region array encodes all possible region lists of pages. It is a simple array of region IDs where list of region IDs can overlap. Its size should be small since lists overlap. The region array is further described in the section Region page infos.

Region Pages Infos

Specifying a list of region IDs in region page table uses 2 fields in the fixed size record of region page info table:
  a region count (number of regions in this page, expected to be small).
  an offset into an array of region lists (where list of region begins).

In one embodiment, this is as described as in FIG. 9.

The offset field points into the region array: fixed size records with 1 byte per region ID are enough, for example, assuming that there are always less than 256 regions in each level, which is a fair assumption (but making it larger than 8 bits is easily possible if 256 region max per level is deemed too restrictive). The region count in the region page table record indicates how many regions are to be considered in the array at the specified offset.

If several regions have the same list, they can point to the same location, which should be compact since we can expect many pages to either share to same lists, or to share portions of the same lists.

This is explained in more detail with reference to FIG. 9 which shows an embodiment having pages of 2^nr nodes (nr=9 for example to group 512 nodes).

Notice how compact the array 900 of region IDs can be because several pages can point to the same location or overlapping locations in the array (labelled region blob in the figure). In fact, increasing the number of pages may not increase the size of the array because each page then overlaps less regions so the possibility of combinations is reduced. So this array should allow to create many pages without requiring too much map space nor much memory on the device in which the generated map data is loaded.

The method aims to keep the array 900 containing list of region ID as small as possible. The method aims to reuse the same list of region ID as often as possible in the array. The method is free to reorder the last 2 elements of the list since they would not influence the size of Huffman codes.

For example, when a list contains 2 region 10 and 34, it is equivalent to store the list 10, 34 or 34, 10 (regardless of the frequencies) since the Huffman tree uses only 1 bit in all cases when there are 2 nodes only. In other words, the ordering by frequency is relaxed for the last 2 regions. Similarly, a list of 3 elements 10, 34, 40 can also be stored as 10, 40, 34, since only the first code 10 (most frequent) will use 1 bit and the other codes 40 and 34 and both use 2 bits (regardless or the order).

Thus, looking at FIG. 9, it can be seen that the array 900 stores two values: a length and an offset from the beginning of the region data. Thus, taking the first row (3:0), this refers to three pieces of data offset by 0 from the start of the file (i.e. 10, 34, 40). Taking as a further example, the array entry (1:2) refers to a single region (i.e. a length of 1) with an offset of two from the beginning of the file; (i.e. region 40).

In an alternative embodiment, the region page information is encoded according to the following method:

This section encodes the number of sub-regions in each region. The number of sub-regions may be variable per level. However, often the number or sub-regions is constant for each level. The number of sub-regions is encoded relatively the min number of regions at each level and using log_2 (max_number_of_regions−min_number_of_region) bits. So if the number of regions is constant, then 0 bits are used to encode the region count and this section is empty. The min and max number of regions are stored in the header of the side-file.

Encoding of region neighbours section (neighbourhoods being discussed in relation to FIGS. 6 and 6a)

This section encodes for each region hierarchy at given level L a list of region neighbours at the more detailed level L+1. For example, a region 3.9 at level L=1 may have the following list of neighbours at level L=2: 3.5.4 3.6.3 3.6.4 4.7.1 4.7.3. As discussed elsewhere the list of neighbours may be used to increase the speed of the pre-processing used to generate the or each side-file. This section is split into 2 sub-sections:
  a subsection to encode length of all neighbour lists (as many as there are regions at the given level). The length is encoded relatively to the shortest list and then umber of bits is computed as log_2 (length_longest_list−length_shortest_list). If all lists have same length, then 0 bits is used to encode lengths (and thus section is then empty).
  a subsection to encode all the neighbor lists (as many as there are regions at the given level).

Encoding of Region ID Remapping Tables

This section is encoded in the side-file of level 0 only. It encodes a bi-dimensional table which is used to reorder and coalesce bits in each region at level 0 (in order to encode bit-vectors efficiently, coalescing and bit reordering are described further below in this document). Reordering and coalescing of bits in bit vectors is done to optimize Huffman encoding of bit vectors. This table is used by route planning methods to find the bit position in the bit vector to decode when knowing:
  the from-region ID of the current node
  the original to-bit index (i.e. bit index after decoalescing bit vector bits)

The 2 indices of the bi-dimensional table are:
from-region ID
destination-bit index (region of destination)

This section is made of 2 sub-sections:
  a section to encode the number of coalesced bits for each region at level 0. The number of bits used to encode each number is log_2(max_number_of_coalesced_bits)
  a section to encode the bit remapping table. Since when routing, the destination-bit does not change (destination remains the same while routing) but the from-region ID changes (depending on nodes explored while routing) the matrix stores by rows of destination-bit. In each row, the bit-reordering number is stored for each from-region. Route planning methods should typically load only 1 row in memory corresponding to a given routing destination while routing. The route planning method does not need to store the entire bidimensional matrix in memory. Route planning methods can access that row at random. The number of bits used to encode each remapping entries is computed as log_2(max number of coalesced bits).

Figure 10:
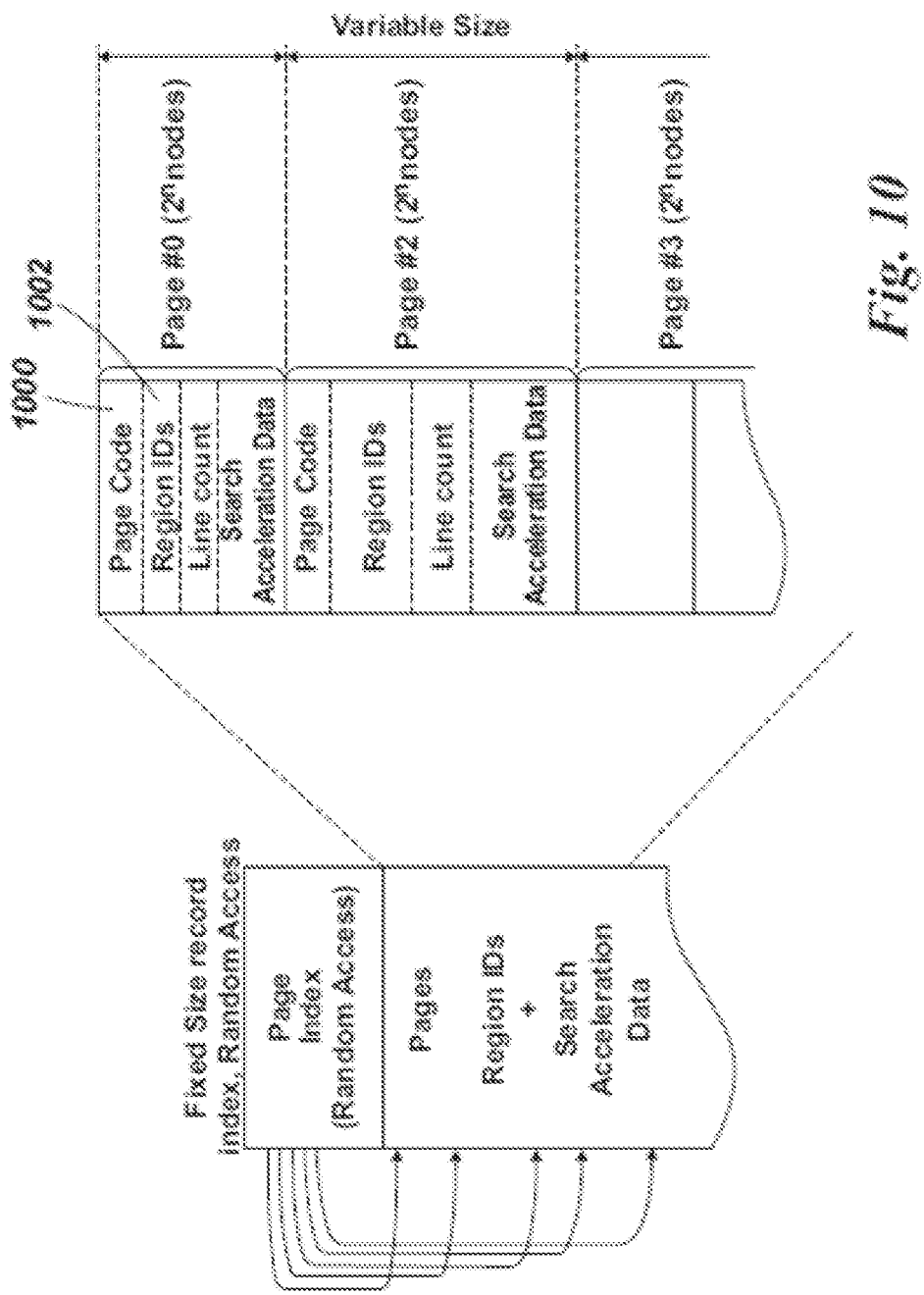
FIG. 10 shows an example file format for the coarsest nested region as illustrated in FIG. 6.

FIG. 10 expands the bit vector section 812 of the file shown in FIG. 8 for the level 0 region (see FIG. 6). It is seen that each page comprises a road segment count, regions ID's and the bit vectors.

FIG. 11 expands the bit vector section 812 for the file shown in FIG. 8 for levels other than level 0. It can be seen that for other regions only the bit vectors are stored and not the road segment count or regions ID's which are stored for level 0.

This is because at the finer levels because each node has its region numbers for all levels stored in the side-file at level 0. The reason for storing it that way is to reduce the number of files that have to be accessed during any route planning using the side-file Encoding of Bit Vectors 810, 812

The table 810 contains fixed size records. From-node IDs are grouped in pages of $2^n$ together.

It is convenient to group data in pages of multiple consecutive nodes because it is expected that bit vectors have similar patterns for several road segments in the same neighbourhood. By using pages, it is possible to encode several road segments in delta and achieve good compression. Similarly, it is possible to encode region IDs of nodes in delta in pages. On the other hand, it means that accessing data of one road segment requires to unpack data of several road segments (no direct random access). Having to unpack several nodes or road segments to access the data of one road segment or node may be deemed acceptable since:

data can be cached so extra data read when accessing one road segment is often not useless. It may be that this extra data will be useful shortly afterwards (this is similar to read-ahead parameter of disk caching).
  Routing using the bit vectors reduces the size of the expansion search by an order of magnitude when compared to Dijkstra A* routing. By grouping data by pages, only a small portion of the map still needs to be decoded (pages along the actual path).
  it should significantly reduce the encoded data size thanks for delta compression of region ID & bit vectors.
  pages reduce the size of indexing since the data will be stored in a side-file as described.

Each record within the table 810 contains a 'delta' field which is used to find the position of the beginning of the variable size of each page (delta to an interpolated position). The number of bits for each delta is stored in the header.

In order to access the region ID and bit vectors 812 a decoder may compute the estimated offset of the beginning page by doing a linear interpolation:

interpolated_offset=from_node_id*avg_page_size

Where avg_page_size is the average page size in bits stored in the header (possibly in fixed point to improve precision). The offset of the data can then be computed as follows:

offset=interpolated_offset+min_delta+delta

Where min_delta is the minimum value of all delta fields for all pages (stored in header) and delta is the unsigned field stored in the page. The min_delta value ensure that all delta fields are positive value (no bit sign to store).

Variable size records are accessed through 'delta' field of the previously described bit vector page infos.

Each record contains the data of $2^n$ nodes (region IDs of from-nodes and bit vectors of their attached road segments at all levels). The same indexing scheme will thus be used for all levels.

Variable size records store:
  page code—a code indicating for the entire page as to whether or not the nodes within that page are part of the same region;
  the number or road segments around each node in the bit vector page (only stored at level 0 since it would be the same for all levels);
  region IDs of the from-nodes in the page, one ID per level (information for all levels stored in file at level 0)
  bit vectors of road segments around nodes in page (only around nodes which have >2 attached road segments) at level i only. This is the biggest portion of data.

Encoding of number of road segments around each node

For each of the $2^n$ nodes in a bit vector page, a Huffman code encodes the number of road segments around the node. This information is not specific to all levels and it is only stored in the file at level 0 (ap_0_*.dat).

Knowing the number of road segments around node is used to decode the bit vectors (see 1000, FIG. 10). This information is redundant with information already present in the in other files but it makes it easier and faster to decode bit vectors in pages without having to look up that information elsewhere; thereby a small increase in size provides an increase in performance.

Encoding of Region IDs in Variable Size Records

Region ID of nodes 1002 are encoded in the variable size records right after encoding of number of road segments 1000 around each nodes. In order to perform routing using the bit vectors generated in the pre-processing access is generally needed to region IDs 1002 at all levels for a given node, region IDs of all levels are stored in the same file near each other rather than splitting them in different files per level.

A bit vector page of $2^n$ nodes (n=4 for example) and with 3 Apollo levels would thus store node IDs as follows:

node#0: local_region_id_level_0  local_region_id_level_1  local_region_id_level_2 node#1: local_region_id_level_0  local_region_id_level_1  local_region_id_level_2 node#2: local_region_id_level_0  local_region_id_level_1  local_region_id_level_2

...

node#15: local_region_id_level_0  local_region_id_level_1  local_region_id_level_2

Additionally:

Nothing is encoded around nodes with 1 or 2 attached road segments (i.e. for nodes for which we store 0 as number of attached road segments).

When the bit in page code is set at a given level, then it is knows that all nodes are in the same region ID at that level and the region ID at that level is then encoded only once (for the first node with >=3 attached road segments). The number of bits to encode the region ID is log_2(regionCount−1).

Except for the first node in a page where a region ID is encoded, a bit is also encoded before encoding each region ID. This bit indicates whether the region ID is identical to previously encoded node ID at the same level. When this bit is set, there is no need to encode the region ID since it is the same as previously encoded at that level. When this bit is 0, we encode a region ID with log_2(regionCount−1) bits. Since many consecutive nodes are in the same region, we often only need 1 bit to encode the region ID.

Huffman encoding of the local region index is efficient because:

regions are sorted by frequencies in each region page (so local index 0 is more frequent than local index1, . . . )

there are distinct specialized Huffman trees for each number of region in page (1 Huffman for 3 region in page, 1 Huffman tree for 4 regions in page, etc). Huffman trees are small and as such it is possible to store several without using significant amounts of memory.

having 3 regions or more should be rather rare anyway, at least at level 0 (but it won't be rare at other levels).

Encoding of Bit Vectors in Variable Size Records

Each variable size record contains bit vectors for all road segments around nodes in the page. Bit vectors are encoded only around nodes with 3 or more attached lines (road segments). For nodes with 1 or 2 attached road segments, routing methods can implicitly give bit vectors values 111 . . . 111) to those nodes.

The to-nodes are not encoded.

With reference to FIG. 7, it is noted that a road segment may be specified by two nodes; one at each end thereof. Thus, when direction is considered a node at the beginning of a direction may be referred to as a from_node and a node at the end may be referred to as a to_node.

Various properties about the bit-vectors are used within the encoding to make it efficient:

Many of the bit vectors are 000 . . . 000 or 111 . . . 111.

For other values of bit-vectors (i.e. non 000 . . . 000 or 111 . . . 111) there is likely to be repetition and the same value will likely be repeated.

Bit vectors are encoded as a first Huffman code and optional further Huffman codes. The first Huffman code indicates whether the bit vector is:

code 0 for trivial bit vector 000 . . . 000 code 1 for trivial bit vector 111 . . . 111 code 2 or to indicate a non-trivial bit vector not yet encountered in the page. In that case, and only in this case, other Huffman code follow to encode the newly encountered bit vector.

a code>=2 when bit vector is identical to a previously encountered bit vector in the current page (ignoring trivial bit vectors 000 . . . 000 and 111 . . . 111). This encoding thus uses the history of previously encountered code in the page. The code then actually gives the index in history of all previously encountered codes.

Other than this Huffman code, more information needs to be encoded only in the case of non-trivial bit vectors not found in history (code=2). In that case, right after Huffman code==2, is encoded:

a negated bit

Several Huffman codes to encode by blocks of N bits the bit vectors for n regions (N and n are given in the map header). For example. Encoding 100 regions (99 bits bit vectors) using blocks of 11 bits requires encoding 9 Huffman codes (9×11=99).

Since most bit vectors contain either mostly 0s or either mostly 1, the negated bit indicates whether the bit vector is stored negated or not. This enables storage of codes in Huffman tree containing by far mostly 0s (thus improving Huffman encoding of the blocks). The negated bit exists only if the size of the blocks is smaller than the number of regions, which is the case in practice at level 0 but at level 1 or 2, the whole bit vector might be encoded in 1 block only so negated bit is not needed.

If there are 100 regions; N=100 (hence 99-bit bit vectors), the first block encode bits for destination regions 1 to 11, the second block encodes region 12 to 22, etc. In the first block, the LSB (0x1) corresponds to destination region 1, the next bit (0x2) corresponds to region 2, the next bit (0x4) corresponds to region 3, etc.

For bit vectors using history, the depth of the history array is the number of previously encountered distinct bit vectors in the page (without taking into account trivial bit vectors 000 . . . 000 and 111 . . . 111). A different Huffman tree is used whether the history vector contains 0 elements, 1 element, 2 elements, 3 elements, etc. Multiplying the Huffman trees is acceptable since all the Huffman trees are small and as such significant storage is not required:

when history has 0 elements, Huffman tree has 3 codes: 0 for 000 . . . 000, 1 for 111 . . . 111, 2 for new bit vector.

when history has 1 element, Huffman tree has 4 codes: 0 for 000 . . . 000, 1 for 111 . . . 111, 2 for new bit vector, 3 for same as element #0 in history.

when history has 2 elements, Huffman tree has 5 codes: 0 for 000 . . . 000, 1 for 111 . . . 111, 2 for new bit vector, 3 for same element #0 in history, 4 element #1 in history.

etc.

The size of the bit vector page is expected to be small ($2^n$ from-nodes for example) so the number of Huffman tree is expected to be small.

However, it is possible to limit the size of the Huffman tree to a maximum value: eg. whenever history contains more than H elements, a single Huffman tree will be used (value H is stored in map header).

This encoding encodes only distinct bit vectors in each page+some codes.

The encoding is more efficient in size with large index pages but at the cost of slowing down decoding in order to use the bit vectors for routing purposes (more bit vectors to decode in pages).

Statistics

Here are detailed statistics for a file format when encoding Benelux in 254 regions (1 level). The following input parameters were used:

number of bits per bit vector block: 11 number of nodes per bit vector page: $2^4=16$ number of nodes per region page: $2^9=512$ Statistics are provided to give an idea of the map form in term of map size and illustrate the description of the map format on some real data:

| Global statistic counters: | | |
|---|---:|---:|
| node count | 1598632 | |
| line count | 1598632 | (100.000%) |
| skip lines around nodes with 1 lines | 220180 | (13.773%) |
| skip lines around nodes with 2 lines | 727138 | (45.485%) |
| Stats at level = [0]: | | |
| Map counters | 87437736 | (100.000%) |
| encoded trivial arp-flags 000 . . . 000 | 1310914 | (31.651%) |
| encoded trivial arp-flags 111 . . . 111 | 913348 | (22.052%) |
| encoded arp-flags in history | 362432 | (8.751%) |
| encoded arp-flags not in history | 607717 | (14.673%) |
| negated blocks | 235171 | (5.678%) |
| Map size (in bits) | 87437736 | (100.000%) |
| global header | 496 | (0.001%) |
| Huffman trees | 28808 | (0.033%) |
| region blob | 52664 | (0.060%) |
| region pages infos | 56216 | (0.064%) |
| arp-flag page infos | 2497880 | (2.857%) |
| variable size records | 84801672 | (96.985%) |
| line count around nodes | 2847844 | (3.257%) |
| node region IDs | 2112451 | (2.416%) |
| arp-flags | 79841370 | (91.312%) |
| code trivial 000 . . . 000 | 1689322 | (1.932%) |
| code trivial 111 . . . 111 | 1826696 | (2.089%) |
| code found in history | 1668053 | (1.908%) |
| not found in history | 74657299 | (85.383%) |
| code not found in history | 1463183 | (1.673%) |
| negate bit | 607717 | (0.695%) |
| blocks | 72586399 | (83.015%) |

All sizes are in bits. Total map size is 87,437,736 bits (10,929,717 bytes).

The indentation reflects the hierarchy. The variable size record information are by far the largest piece of information (96.975% of map size). In the variable size records, the sub items (indented) gives more details. The bit vectors are by far the biggest piece of information to store in variable size records (91.312%). And in the bit vectors, storing the non-trivial bit vectors not yet encountered in history constitutes the biggest portion of the map (83.015%).

Statistics on Huffman Trees

This section gives statistics for Huffman trees when encoding Benelux in 255 regions (i.e. for the map data shown above).

Huffman Tree of the Number of Road Segments Around Each Nodes

| [Huffman trees: NrLines] | | | |
|---|---|---|---|
| bits: | 1 value: | 3 code | 0 |
| bits: | 2 value: | 2 code | 10 |
| bits: | 3 value: | 1 code | 110 |
| bits: | 4 value: | 4 code | 1110 |
| bits: | 5 value: | 5 code | 11110 |
| bits: | 6 value: | 6 code | 111110 |
| bits: | 7 value: | 7 code | 1111110 |
| bits: | 7 value: | 8 code | 1111111 |

Most nodes have 3 attached road segments, but in 2nd and 3rd position in the Huffman tree we find nodes with 2 and 1 attached road segments (which are not decision nodes).

Huffman Tree of Non-Trivial Bit Vector Blocks

This is the biggest Huffman tree since storing blocks of trivial bit vectors is the biggest map size contributor by far (83.015% in the example of Benelux 255 region).

| [Huffman trees: NonTrivialArpFlagBlock] | | | |
|---|---|---|---|
| bits: | 1 value: | 0 code | 0 |
| bits: | 6 value: | 1 code | 100000 |
| bits: | 6 value: | 2 code | 100001 |
| bits: | 6 value: | 4 code | 100010 |
| bits: | 6 value: | 8 code | 100011 |
| bits: | 6 value: | 16 code | 100100 |
| bits: | 6 value: | 32 code | 100101 |
| bits: | 6 value: | 64 code | 100110 |
| bits: | 6 value: | 512 code | 100111 |
| bits: | 6 value: | 1024 code | 101000 |
| bits: | 7 value: | 128 code | 1010010 |
| bits: | 7 value: | 256 code | 1010011 |
| bits: | 7 value: | 384 code | 1010100 |
| bits: | 8 value: | 5 code | 10101010 |
| . . . snip, too large . . . | | | |
| bits: | 24 value: | 1534 code | 111111111111111111111011 |
| bits: | 24 value: | 1717 code | 111111111111111111111100 |
| bits: | 24 value: | 1741 code | 111111111111111111111101 |
| bits: | 24 value: | 1830 code | 111111111111111111111110 |
| bits: | 24 value: | 1973 code | 111111111111111111111111 |

Storing a block made of all 0 is the most frequent pattern and are encoded in only 1 bit according the above Huffman tree (which means 50% or more of blocks encode value 0, even though trivial bit vectors 000 . . . 000 are not encoded by blocks). This is because most non-trivial bit vector contains either mostly 0s (and a few 1s)

or mostly 1s (and a few 0s)

The encoding scheme negates (~) bit vectors containing mostly is so in the end, encoding blocks of bit vectors mostly encodes blocks containing 000 . . . 000 in 1 bit only. The next most frequent blocks are blocks where only 1 bit is set (1, 2, 4, 8, 16, 32, 64 . . . ). They have more or less the same frequencies hence same (or almost the same) number of bits.

Huffman Trees of Local Region IDs

Since list of regions are stored by frequency in each page, we can see that storing local region ID 0 takes less bits (in fact only 1 bit) than other location region IDs. The different Huffman trees corresponds to pages with 3 regions, 4 regions, 5 regions, etc.

| [Huffman trees: Regions__0] | | | |
|---|---|---|---|
| bits: | 1 value: | 0 code | 0 |
| bits: | 2 value: | 1 code | 10 |
| bits: | 2 value: | 2 code | 11 |
| [Huffman trees: Regions__1] | | | |
| bits: | 1 value: | 0 code | 0 |
| bits: | 2 value: | 1 code | 10 |
| bits: | 3 value: | 2 code | 110 |
| bits: | 3 value: | 3 code | 111 |
| [Huffman trees: Regions__2] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 4 value: | 4 code | 1111 |
| [Huffman trees: Regions__3] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 5 value: | 4 code | 11110 |
| bits: | 5 value: | 5 code | 11111 |
| . . . snip . . . | | | |

Huffman Trees of Bit Vector History Codes

Code 0 (meaning trivial bit vector 000 . . . 000) is the most frequent (and encoded in 1 bit only in most cases). Code 1 (trivial bit vector 111 . . . 111 is then the next most frequent (and encoded in 1 bit only). The next most frequent code (2) is for non-trivial bit vector encoded by blocks. The other codes (>2) for bit vector found in history.

| [Huffman trees: ArpFlag__0] | | | |
|---|---|---|---|
| bits: | 1 value: | 0 code | 0 |
| bits: | 2 value: | 1 code | 10 |
| bits: | 2 value: | 2 code | 11 |
| [Huffman trees: ArpFlag__1] | | | |
| bits: | 1 value: | 0 code | 0 |
| bits: | 2 value: | 1 code | 10 |
| bits: | 3 value: | 2 code | 110 |
| bits: | 3 value: | 3 code | 111 |
| [Huffman trees: ArpFlag__2] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 4 value: | 4 code | 1111 |
| [Huffman trees: ArpFlag__3] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 5 value: | 4 code | 11110 |
| bits: | 5 value: | 5 code | 11111 |
| [Huffman trees: ArpFlag__4] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 5 value: | 4 code | 11110 |
| bits: | 6 value: | 5 code | 111110 |
| bits: | 6 value: | 6 code | 111111 |
| [Huffman trees: ArpFlag__5] | | | |
| bits: | 2 value: | 0 code | 00 |
| bits: | 2 value: | 1 code | 01 |
| bits: | 2 value: | 2 code | 10 |
| bits: | 4 value: | 3 code | 1100 |
| bits: | 4 value: | 4 code | 1101 |
| bits: | 4 value: | 5 code | 1110 |
| bits: | 5 value: | 6 code | 11110 |
| bits: | 5 value: | 7 code | 11111 |
| . . . snip . . . | | | |

Influence of Input Parameters on Map Size

There are a number of input parameters which control the file format shown in FIG. 8 and which can influence map size. Tweaking the parameters can be a trade-off between map size and memory usage or speed of decompression depending on parameters.

Embodiments of the invention may use the following input parameters:
  region page size
  bit vector page size
  bit vector block size
  bit vector Huffman codec count
  region Huffman codec count Influence of Bit Vector Block Size

| value | map size | (bits) |
|---|---|---|
| 4 | 35548192 | |
| 5 | 33648792 | |
| 6 | 32290344 | |
| 7 | 30853616 | |
| 8 | 31103200 | |
| 9 | 30436696 | (default) |
| 10 | 30051792 | |
| 11 | 29266784 | |
| 12 | 28934696 | |

Increasing the Huffman block size for the bit vectors improve map compression. The higher the block size, the better the compression. But increasing block size comes at the price of requiring more memory to store a bigger Huffman tree of $2^n$ values. The above table illustrates this.

Influence of this parameter is expected to become more significant when we introduce the optimization to remap region IDs per source region: this optimization will hopefully result in significant maps size reduction when using large bit vector block size.

Influence of Bit Vector Page Size

| value | map size | (bits) |
|---|---|---|
| $2^1$ | 55563944 | |
| $2^2$ | 42502936 | |
| $2^3$ | 34898840 | |
| $2^4$ | 30436696 | (default) |
| $2^5$ | 27389952 | |
| $2^6$ | 25165032 | |
| $2^7$ | 23635936 | |

Increasing page size helps to compress maps better. But big pages unfortunately slow decompression of the data in the file format by routing methods, since accessing bit vector of a random road segment requires to decode all road segments in page. The above table illustrates this.

Influence of Bit Vector Huffman Codec Count

| value | map size | (bits) |
|---|---|---|
| 1 | 30866920 | |
| 2 | 30748024 | |
| 3 | 30634168 | |
| 5 | 30504504 | |
| 7 | 30467944 | |
| 9 | 30436696 | (default) |
| 11 | 30423688 | |

Increasing the number of bit-vector Huffman codec helps to increase compression slightly and this is illustrated in the above table. There is almost no drawback to increasing the value since those Huffman trees are small anyway. Increasing beyond 9 Huffman trees (default value) does not give any significant improvement. Increasing this parameter might be more effective with larger bit vector pages.

Coalescing & Reordering Bits in Bit Vectors

Bit vectors have patterns. Those patterns differ significantly for each source region (i.e. region of the node where bit vector is stored). The number of bits to store N-bits bit vectors can be reduced by storing small translation tables for each source region. These tables perform 2 functions further described in this section:
  bit coalescing
  bit reordering The idea can be understood intuitively as follows: when in Spain, it is clear that a road segment which leads to Sweden (bit=1 for destination region Sweden) is most likely to also lead to Norway (i.e. bit for destination Norway is then also 1). If another road segment does not lead to Sweden (bit=0), then it also does not lead to Norway in most cases. So when in Spain, the values of the bit vector bits for the destination regions Sweden and Norway are almost always equal. In fact, they are even always strictly equal for many destination regions. Which bits are well correlated with which bit depends greatly on the from region.

When in Finland for example, bits for destination region Norway and Sweden are far less correlated. On the other hand, in Finland, bits for destination region Spain and Portugal are likely to be 100% correlated (or at least very close to 100%).

Bit coalescing exploits the property that some bits are always equal (fully correlated). Those bits can be coalesced into a single bit. Coalescing bit reduces the number of bits to encode in each region—see FIG. 20.

Figure 20:
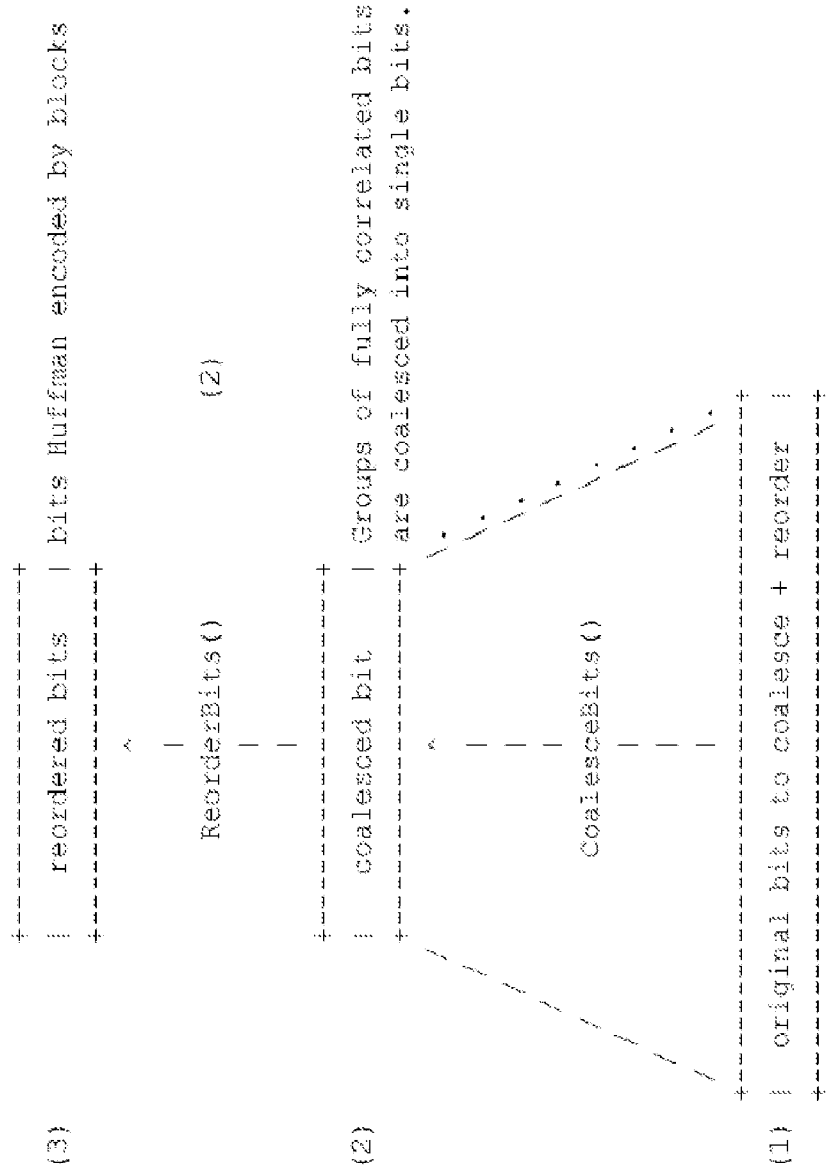
FIG. 20 shows a flow chart outlining the steps of bit coalescing and bit reordering.

Bit reordering exploits the property than some bits are fairly well correlated (but not 100% correlated) in order to shuffle bits in such a way as to optimize Huffman encoding of bit vectors (and/or reduce size of Huffman trees)—see FIG. 20.

Before computing tables to coalesce bits and reorder bits, the correlations of all pairs of bits in all from-regions are calculated. The number of distinct pairs is:

$$C(N,2)=N!/(2!*(N-2)!)=N*(N-1)/2$$

... where N is the number of regions. This number is thus fairly high when the number of regions is high. Computing all bit correlations is the slowest part of the method to generate the file format shown in FIG. 8. The complexity of the method is n*N*N where n is the number of bit vectors and N is the number of regions. For each pair of bits (i.e. pair of distinct columns in bit vectors) in each region, we compute a tri-dimensional table:

$$bitCorrelation[fromRegionId][bitI][bitJ]$$

Each entry in table contains a struct of 4 fields which counts:
- the number of times bitI=0 and bitJ=0 in all bit vectors of fromRegionId
- the number of times bitI=0 and bitJ=1 in all bit vectors of fromRegionId
- the number of times bitI=1 and bitJ=0 in all bit vectors of fromRegionId
- the number of times bitI=1 and bitJ=1 in all bit vectors of fromRegionId Although expensive in terms of processor time (and therefore slow) to compute, this process can be easily parallelized since computing bit correlations for each from-region is completely independent from other from-regions.

Embodiments of the present invention use multi-threading to speed up computation of correlation of all bits to efficiently use SMP (Symmetric Multiprocessing) machines. In one system, a 1-CPU machine computing bit correlation of Benelux with 300 regions takes about 8 minutes. But parallelism scales well and when enabling threads and using the 4 CPUs computing bit correlation then takes 2 minutes (4 times less).

Bit Coalescing

When several bits are fully correlated (i.e. always all 0 or all 1), we can coalesce them into only 1 bit without loosing any information. Referring to a set of bits which are fully correlated in a given region as a 'group' then bit vectors of a given region are made of several groups. If N-bit bit vectors are made of n groups, then encoding N-bit bit vectors uses n-bits+a small table to indicate which bits are equivalent in each region.

Such bit coalescing has the advantage that size of the resultant file is reduced in a lossless manner. This advantage is likely to be increased as the number of regions increases since more bits are likely to be coalesced. So map size increases in a sub-linear way with number of regions.

In one embodiment the following data was obtained:

|  | minimum number of groups | average number of groups | maximum number of groups |
|---|---|---|---|
| Benelux 255 regions | 12 | 84 | 152 |
| Benelux 300 regions | 13 | 90.017 | 163 |

As such, in the Benelux example having 255 regions there is at least 1 region which has only 12 groups (i.e. requires only 12 bits to encode its 255 bits bit vectors (i.e. the bit vector is the same length as the number of regions) even before Huffman encoding (and thus even less after Huffman encoding).

On average, regions require 84 bits for Benelux 255 regions. In this example, the worst region requires 152 bits (152 groups) before Huffman encoding.

As another example and taking region Id=3 in the above 255 region Benelux example which has the following 18 groups as taken from the encoded data.

```
regionId=(3) has (18) groups:
#1 ( 0 )
#2 ( 1 )
#1 ( 2 )
#141 ( 3 4 5 7 8 11 12 15 16 19 20 21 22 23 24 25 26 27 28 29 30
    31 32 33 36 37 38 39 40 42 43 44 45 46 50 51 59 60 62 63 66
    67 69 71 72 73 74 :75 76 80 81 82 83 84 86 88 89 90 95 96 97
    98 100 101 102 103 104 105 106 108 110 112 113 119 120 123
    127 129 130 133 135 136 139 142 143 147 148: 149 150 153 154
    155 156 157 159 160 165 166 167 171 172 173 174 176 177 178
    179 181 182 183 190 192 200 203 205 207 210 211 212 213 214
    215 218: 219 220 221 222 226 227 229 235 237 241 242 243 244
    245 247 249 250 252 )
#1 ( 6 )
#1 ( 9 )
#1 ( 10 )
#30 ( 13 14 35 48 49 57 68 85 93 109 115 117 118 128 131 134 138
    153 158 164 168 169 187 189 195 209 217 224 238 239 )
#59 ( 17 18 47 53 54 56 65 91 92 99 107 114 116 121 124 125 126 132
    137 140 141 144 145 146 152 161 162 163 170 175 180 184 185
    186 191 193 194: 196 198 199 201 202 204 206 208 216 223 225
    228 230 231 232 233 234 236 240 246 248 251 )
#1 ( 34 )
#5 ( 41 78 79 111 197 )
#3 ( 52 77 87 )
#1 ( 55 )
#3 ( 58 61 94 )
#1 ( 64 )
#1 ( 70 )
#1 ( 122 )
#1 ( 183 )
```

Each line represents a group (18 groups for regionId=3). The numbers in parentheses are bit indices which coalesced in each group. The number after # is the number of bits in each group.

In this example, 1 group is very large and contains as many as 141 regions. This is not unusual. In general, regions on the border of the map coalesce more bits than region in the middle of the map.

In this example, the number of bits has been reduced on average by a factor ~3 (~=255/84). Of course that does not mean that map size is reduced by a factor 3 since the remaining bits to encode have more entropy than original bits (so are more difficult to encoder with Huffman blocks). But bit coalescing bits may still reduce map size, perhaps significantly.

Figure 12:
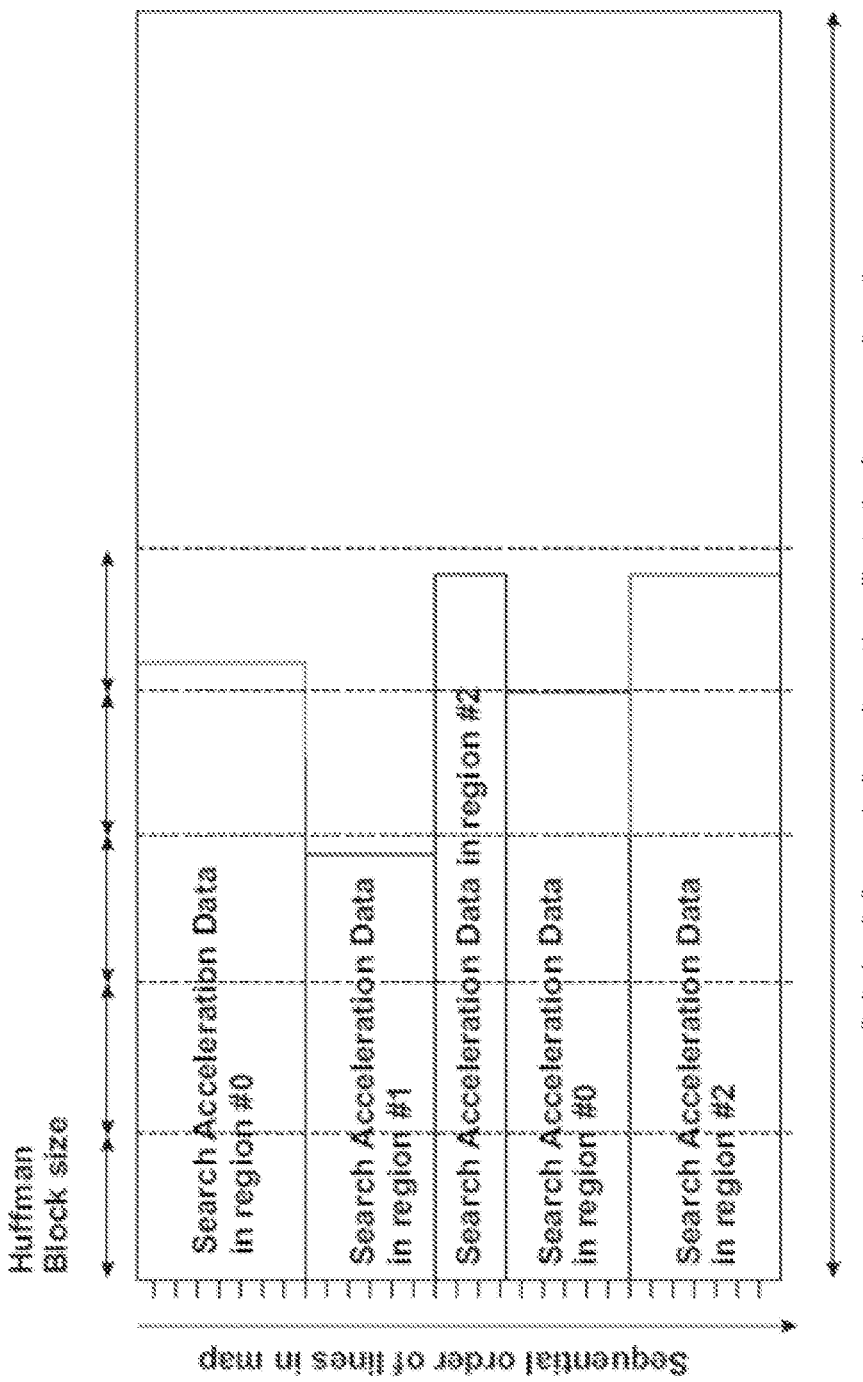
FIG. 12 exemplifies coalescence of bits within an encoding scheme.

When coalescing bits in each region, bit vectors in each region have different number of bits as result (but identical number of bits for bit vectors of a given from-region) as illustrated in FIG. 12. The shading illustrates the from-region ID of each bit-vector. The y axis expresses the sequential order of the segments. For instance, the block at the top might represent 1043 lines, the next block might represent 507 lines, etc.

Once table bitCorrelation has been computed, identifying groups of fully correlated bits is fairly easy and fast. All pairs of bits where we find no 01 or 10 patterns are fully correlated and can be coalesced into 1 bit.

To give a further example of bit coalescing, the table below gives an example of 6 bit vectors, each of 15 bits. These have not been coalesced.

```
100111101111100

000001101110100

011001010010111

111110010001011

011000010000011

000000101100000

...
```

These 15-bit bit vectors can be coalesced into only 4 groups—hence 4 bits per bit vector before Huffman encoding. This is shown in the following table:

| 1 | 2 | 3 | 4 | 5 | 6 | 7 | 8 | 9 | 10 | 11 |   | 1,3,9 | 2,11 | 5,7 | 4,8,10 |
|---|---|---|---|---|---|---|---|---|---|---|---|---|---|---|---|
| 1 | 00 | 11 | 1 | 1 | 0 | 11 | 1 | 1 | 1 | 00 | → | 1 | 0 | 1 | 1 |
| 0 | 00 | 00 | 1 | 1 | 0 | 11 | 1 | 0 | 1 | 00 | → | 0 | 0 | 1 | 1 |
| 0 | 11 | 00 | 1 | 0 | 1 | 00 | 1 | 0 | 1 | 11 | → | 0 | 1 | 0 | 1 |
| 1 | 11 | 11 | 0 | 0 | 1 | 00 | 0 | 1 | 0 | 11 | → | 1 | 1 | 0 | 0 |
| 0 | 11 | 00 | 0 | 0 | 1 | 00 | 0 | 0 | 0 | 11 | → | 0 | 1 | 0 | 0 |
| 0 | 00 | 00 | 0 | 1 | 0 | 11 | 0 | 0 | 0 | 00 | → | 0 | 0 | 1 | 0 |

The heading of the right hand portion of the table shows which bits the 4-bit coalesced vector in the left hand portion of the table. To clarify, the first bit of the 4-bit coalesced vector represents the 1st, 3rd and 9th columns of the left hand portion. As such, since the 1st, 3rd and 9th bits of the left hand portion (i.e. the 15-bit original vector) are always the same in the above example, they may be represented by the 1st column of the right hand side of the above table.

Thus, in summary a table of concordance between the left and right hand sides is as follows:

| original bit | coalesced bit |
|---|---|
| 0 | 0 |
| 1 | 1 |
| 2 | 1 |
| 3 | 0 |
| 4 | 0 |
| 5 | 3 |

-continued

| original bit | coalesced bit |
|---|---|
| 6 | 2 |
| 7 | 1 |
| 8 | 2 |
| 9 | 2 |
| 10 | 3 |
| 11 | 0 |
| 12 | 3 |
| 13 | 1 |
| 14 | 1 |

What coalescing bits effectively does, is to group nearby destination regions and destination regions in the same angle sector from the from-region as illustrated in FIG. 13.

Figure 13A:
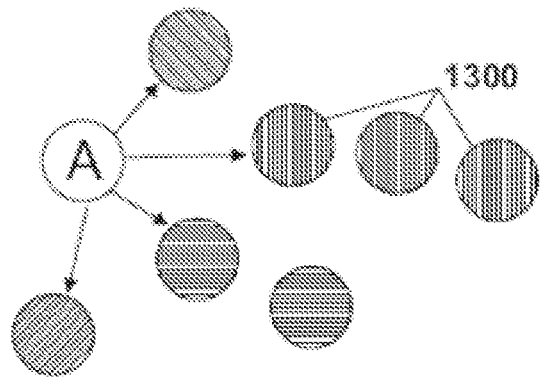
FIG. 13 exemplifies the effect of coalescing bits.
Figure 13B:
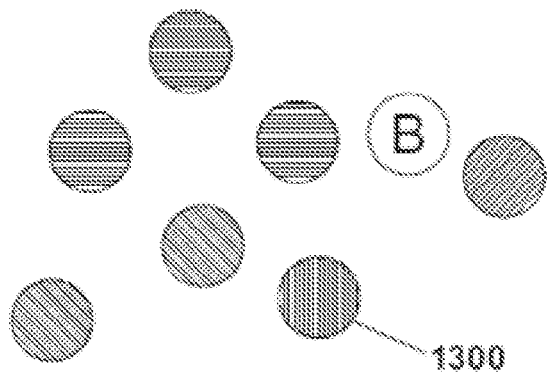

The shading in FIG. 13 indicates groups of regions which are coalesced together. The 2 Figures (i.e. FIGS. 13*a* and 13*b*) show the same regions coalesced from the point of view of 2 different from-regions: A and B. Which region coalesced together depends on the region ID of the from node as shown by the Figure. In this Figure, the 8 regions are coalesced into 4 groups. Coalescing bits is different from the point of view of from-region A or from-region B in these Figures. Notice how the vertical striped region (1300) are coalesced because they are in the same direction when seen from the from-region A.

Figure 14:
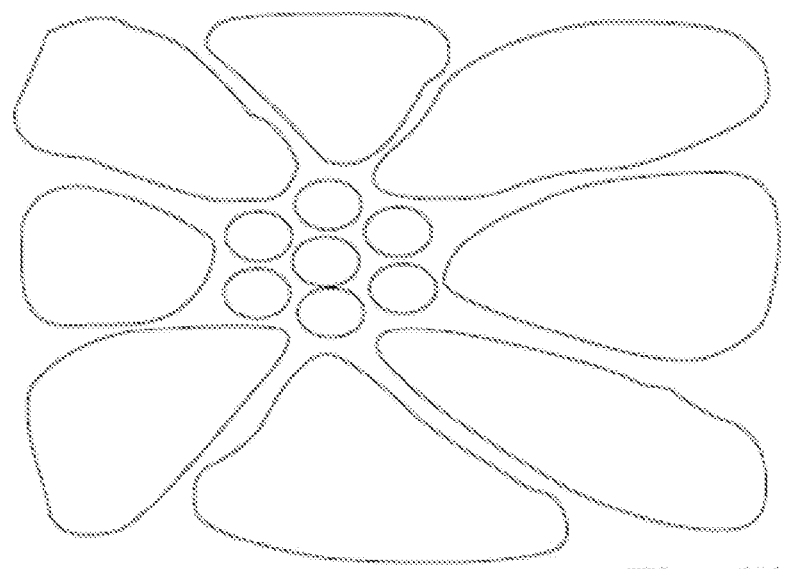
FIG. 14 also exemplifies the effect of coalescing bits.

This is further exemplified in FIG. 14 which illustrates that coalescing bits groups nearby destination regions and destination regions in +/− the same angle sector, from each from-region point of view.

After coalescing bits, the number of bits to encode for bit vectors differ for each region. In the case of Benelux 255 regions for example, the number of bits bit vector for each region is:

```
from
region -> coalesced bits
    1 -> 57
    2 -> 93
    3 -> 18
    4 -> 12
    5 -> 63
    6 -> 75
    ... snip ...
  251 -> 21
  252 -> 46
  253 -> 117
  254 -> 80
```

The method is exact (it is not a heuristic). It thus finds the ideal number of groups of bits.

In some embodiments, coalescing bits is implemented in a lossless way: region are only coalesced when they always have the same bits. But in other embodiments, this may be extended to make it lossy; i.e. such that full recovery of the original data is not possible. Such lossy embodiments may introduce a threshold (i.e. a measure of closeness): if a pair of bits differ by less than X times, then we could coalesce the bits if replacing one or more 0's with a 1 in some of the bit vectors allowing those bit vectors to be coalesced. Thus, in some embodiments such coalescence is performed on bits which are substantially correlated.

An example of such a lossy coalescence would be to coalesce 0000001100 with 0000001110. An advantage of such an approach is that there is better compression of the data but a disadvantage is that further road segments will be assessed by routing methods using the bit vectors since extra 1's will indicate that a road segment is part of a fastest route.

In the case of lossless coalescing, the threshold is 0. Increasing the threshold would allow to coalesce further regions, at the cost of introducing a few bits 1 in the bit vectors. But if the threshold is kept low, it would have almost no impact on the speed at which routing may be performed using the data format. For example, if 2 bits are almost always identical in thousands of bit vectors, except for say only 1 bit vector, it my be acceptable to alter this unique bit vector where it differs to make it possible to coalesce more bits. The higher the threshold, the more map compression we can expect.

Bit Reordering

In some embodiments, once bits have been coalesced as described above, bits may be reordered. Reordering bits does not reduce the number of bits to encode (before Huffman encoding) but helps to make Huffman encoding more efficient, hence reducing map size and also can help to reduce the number of distinct codes in bit vector Huffman codes, hence reducing memory requirement for Huffman trees.

Unlike bit coalescing, bit reordering is a heuristic method so it finds a good reordering but it may not find the best one.

Bit vectors are encoded by blocks. Block size is customizable and stored in the map header 800. In the explanation given below, and as an example, the block size is set to 11 bits. The number of bits in bit vectors may not be divisible by 11, so the last block may be smaller than 11 bits. The last block uses a different Huffman tree than the one for full blocks of 11 bits. Encoding each bit vectors thus encodes:

several full blocks using a Huffman code for 11 bit-blocks (in this example)

1 last block which may another Huffman code when less than 11 bits remain.

The following picture depicts the bits to Huffman encode by blocks with bit vectors in 2 regions (which have different number of bits after coalescing):

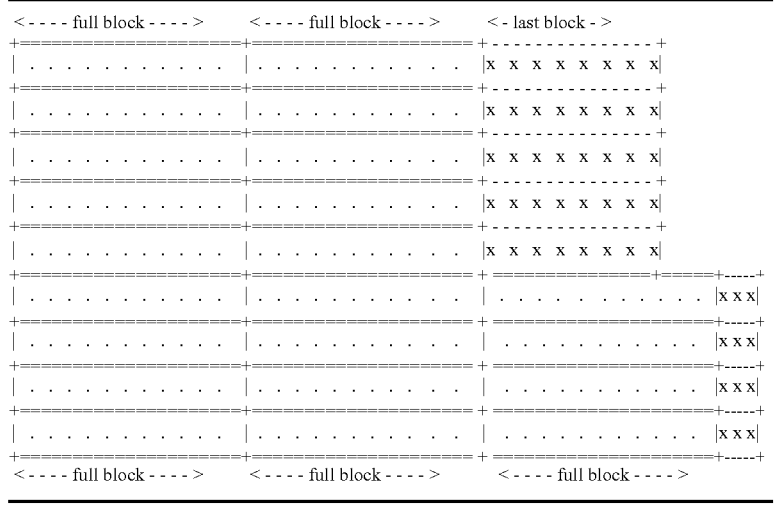

Having Huffman trees for each region would likely be too expensive in memory. So in some embodiments, the same Huffman tree is shared for all regions. Since correlated bits are different in each region, it pays-off to reorder bits in each region, so that the correlated bits are put systematically at the same positions in all regions. So sharing of Huffman tree across all regions becomes more efficient.

The table to reorder bits for each region is stored in map data. Note that we do not need to encode a separate table to coalesce bit and table to reorder bit but we can instead encode only 1 table which is the composition of both transformations (coalescing+reordering).

The method to reorder bits in full blocks proceeds as follows: for each region, find the pair of bits most correlated. Since fully correlated bits have already been coalesced, none of the remaining bit are fully correlated. However, some pair of bits are far more correlated than other. The most correlated pair of bits (a, b) are remapped to bit #0 and #1 in the first full block:

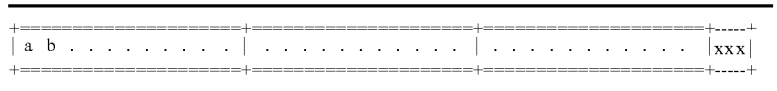

As a result of grouping pairs of bits most correlated, Huffman trees of full blocks have less distinct codes (which has the advantage of using less memory to store the data) and the statistics are more skewed (making Huffman encoding more efficient). Rather than containing random sequences of bits, the first 2 bits for example contain in the vast majority of the cases either 00 or 11 but almost never 10 or 01 (same for other bits). Without reordering bits, the first 2 bits would contain all kind of patterns 00, 01, 10, 11.

After remapping the first 2 bits, method then finds the next most correlated (c, d) pair of bits and remap them to store them in the first 2 bits of the second block:

```
+===================+===================+===================+-----+
| a b . . . . . . . | c d . . . . . . . | . . . . . . . . . |xxx|
+===================+===================+===================+-----+
```

Then method finds again the next most correlated (e, f) pair of bits and remap them to store them in the first 2 bits of the third block:

```
+===================+===================+===================+-----+
| a b . . . . . . . | c d . . . . . . . | e f . . . . . . . |xxx|
+===================+===================+===================+-----+
```

When reaching the last full block, the method goes back to the first full block and remaps the next most correlated pair of bits (g, h). If several pairs have same correlation, a tie breaker selects the pair most correlated with the previous pair in the same block (i.e. pair most correlated with (a, b)):

```
+===================+===================+===================+-----+
| a b g h . . . . . | c d . . . . . . . | e f . . . . . . . |xxx|
+===================+===================+===================+-----+
```

The algorithm method proceeds as above until all pair of bit in full blocks have been remapped:

```
+===================+===================+===================+-----+
| a b g h m n s t y z . | c d i j o p u v A B . | e f k l q r w x C D . |xxx|
+===================+===================+===================+-----+
```

In this example, since block size has an odd number of bits (11 bits) a non-remapped bit still exists in each full block. The method then finds the bit most correlated with 'z' and stores it in the first block. Then finds the bit most correlated with B and stores it in the second block, etc. until all full blocks are remapped:

```
+===================+===================+===================+-----+
| a b g h m n s t y z E | c d i j o p u v A B F | e f k l q r w x C D G |xxx|
+===================+===================+===================+-----+
```

At this point, all bits are remapped in full blocks. The method then remaps bits in the last block trying to group the pair of bits most correlated as was done for the full blocks. Reordering bits in the last block can help to reduce map size but it does not help as much as reordering bits in the full blocks for 2 reasons:

Full blocks are more important. In this example, each code uses 3 Huffman codes for full blocks whereas it uses only 1 Huffman code for the last block, so it is normal that full blocks contribute more to the overall map size than the last incomplete last block and it is more useful to optimize Huffman encoding of full blocks.

Since we already picked all the most correlated bits to remap them in the full blocks, the bits left to remap in the last block are less correlated. So entropy of bits in the last block is thus higher than for bits in the full blocks. In other words, Huffman encoding of the last block is not as efficient as Huffman encoding of the full blocks.

```
+==================+==================+==================+-----+
| a b g h m n s t y z E | c d i j o p u v A B F | e f k l q r w x C D G |H I J|
+==================+==================+==================+-----+
```

It should be remembered that the same Huffman tree is used for all full blocks of all regions. Encoding the bit vector in the above example thus encodes with the same Huffman codes all the full blocks and finally encodes the last block with a different Huffman codec:

```
+==================+
| a b g h m n s t y z E |
+==================+
| c d i j o p u v A B F |    (3 full blocks using same Huffman codec)
+==================+
| e f k l q r w x C D G |
+==================+
+-----+
|H I J|                      (1 last block using another Huffman codec)
+-----+
```

The reason for the method to remap first bits of each block (rather than remapping all bits in first block before jumping to second block) should be clearer when seeing the above figure. Since the same codec is used for all full blocks, it is desirable to have all codes for all blocks as identical as possible. If we were to remap all bits in first block, then all bits in second block (etc), then each block would have quite different patterns: first blocks would have the most correlated bits, second block would have less correlated bits, third block would have even less correlated bits, etc. It would be possible to create several Huffman codec for each column of the full blocks but that is believed to be too expensive in memory. The method so-far outlined works well while sharing the same Huffman codec for all full blocks.

Possible Other Optimizations

This section describes optimizations that may be used in further embodiments in order to compress the data further.

Pages of Pages

Figure 15:
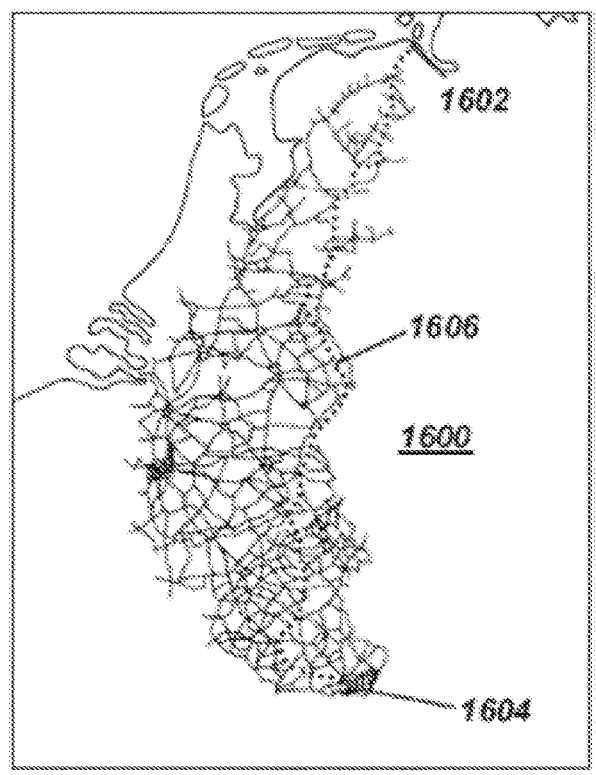
FIG. 15 shows a map highlighting routes considered using PRIOR ART routing techniques.

The page info stores a delta field which is used to find the beginning offset of each bit vector page. The delta field is stored using a linear interpolator of the offset. But the offsets are not very linear because bit vectors around small node ID's (level 0, motorways) require more bits than bit vectors around high node ID's (level 5, destination roads). The graph of FIG. 15 shows the delta field for the map of Benelux with 300 regions.

Encoding of bit vector page info is not as advantageous as may be desired because the interpolator does not precisely predicts the actual offset. By improving the interpolator, it would be possible to improve the encoding of the bit vector page info table to make it more efficient.

Some embodiments of the invention may use bit vector pages (and possibly region pages) having 2 levels rather than only 1 level. The pages of $2^n$ nodes to group the data (let's call them subpages) can be grouped into pages of $2^N$ subpages.

As such, the linear interpolation parameters would be stored per page rather than globally (in header). For example, index level 2 might group $2^4=16$ nodes as earlier in subpages, and index 1 might group $2^{10}=1023$ of those subpages in pages. The linear interpolation then happens for $1024*16=16K$ nodes rather than on the entire node count (50,000,000 nodes in a map of Europe and Russia) so the linear interpolation of variable size offsets becomes much more accurate and the delta fields in index2 are thus smaller.

The size of the extra index1 is small if pages are large (small enough to fit in memory). Being able to fit within a memory of a device is advantageous since it should not slow down routing using the data. Rather than storing the average page size in header, the average page size could then be stored for every entry in the index1 table.

```
index1              index2
pages of            subpages of

2^N subpages        2^n nodes
+------+ ........>+------+
|      |          |page0 |------>+----------+
+------+ ....+    +------+       | variable |
|      |    .     |page1 |       | size data|
+------+    .     +------+       | for 2^n  |
|      |    .     |page2 |       | from-nodes|
+------+    .     +------+       +----------+
            .     |      |
            .     +------+
            .     .   .
            .     .   .
       +...>+------+
            |page256|
            +------+
            |page257|
            +------+
            |      |
            +------+
            .   .
```

Interleave Bit Vector Pages

As described above, the interpolator for page offset is not accurate because bit vectors are different for important roads (many non trivial flags) and minor roads (many trivial flags). One simple way to make the interpolator more linear is to interleave pages of different network levels and this may be used in embodiments of the invention.

The file described in the above embodiments stores the following pages:

0

1

2

3

4

...

$n-3$

$n-2$

$n-1$

In other embodiments which may be more efficient it is possible to store in an interleaved manner as follows:

```
#0
#n – 1
#1
#n – 2
#2
#n – 3
#3
#n – 4
...
```

To access page #x (for example by a route planning application) the page is accessed by loading page #x' where:
x'=2*x (when x is even)
x'=2*(x–(n–1)) (when x is odd)

Such an embodiment should be advantageous since it will reduce size of indexing by several bits per page. However, data may be less well grouped for caching which may slow down data access (less hits in file system cache).

Do not Store Region IDs for all Nodes

Region IDs does not need to be stored for nodes at dead ends and nodes with 2 attached road segments. These nodes can be ignored for routing. Going to one of these nodes can be transformed into going to their neighbour decision nodes.

Store Extra Information at Page Level and or at Node Level

Looking at map data, there are lots of bit vector pages which only contain trivial bit vectors 000 . . . 000 or 111 . . . 111. Some embodiments may store 1 bit for each page to mark those pages, then storing bit vectors in those pages can be more efficient since we only need a single bit for each bit vector to indicate whether it's 000 . . . 000 or 111 . . . 111. Not only it will reduce size of pages which only contain trivial bit vectors, but it will also make Huffman tree of bit vector codes better optimized for pages which have non-trivial bit vectors (the number of bits to indicate non trivial vectors will be reduced since the frequency of those codes will significantly increase in percentage). In the finer network level (eg level 3), most of the pages only contain trivial bit vectors so there may be only 1 bit vector per page in about half of the pages.

Store Bit Vectors Only at Decision Nodes

As discussed above, some embodiments might not store bit vectors for nodes with 1 or 2 attached road segments. However, other embodiments may be more aggressive and generalize the idea to only store bit vectors around decision nodes.

Concepts of decision node and decision road segment are introduced because they can be advantageous in encoding of map data: bit vectors do not need to be encoded for non-decision road segments as is now discussed.

A decision node is node where there is an incoming road segment for routing such that there are multiple choices to leave the node (without making a U-turn).

A non-decision node is a node which is not a decision node. So regardless of the where routing comes from, there is always only one way out to leave the node.

A decision road segment is a road segment which is legal in order to leave a decision-node.

A non-decision road segment is a road segment which is not a decision road segment.

All decision road segment s are thus around decision nodes. But not all road segment s around decision nodes are decision road segment. All road segments around non-decision nodes are non-decision road segments.

Bit vectors will be encoded only for decision road segments. Bit vectors are implicit (000 . . . 000 or 111 . . . 111) for non decision-road segments since routing techniques using the data can make a determination from information already present in road segments.

How to determine whether a node is a decision node? The criterion we can be reduced to:

```
isDecisionNode = (lineCount >= 3) && (lineGoingOutCount >= 2)
Where:
   lineCount: is the total number of lines attached to node
      ignoring non routable line types (railways, reference lines),
      ignoring lines closed in both directions and ignoring
      no-through roads (residential areas).
   lineGoingOutCount: is the number of lines attached to
      a node which are legal to take for leaving the node.
```

Whether or not it is legal to take a road segment to leave the node depends on road segment attributes:
    road segment type (railways & reference lines are always illegal)
    forward/backward flow of way (stored in road segment flags)
    no-through attribute in road segment flags (no-through road segment s do not have any bit vectors)

In some embodiments ignoring non decision road segments can discard roughly 40% of the road segments. It has been found that this percentage is quite consistent regardless of the map. Avoiding to encoding of 40% of bit vectors is advantageous but it saves less than 40% of the map size, since it mostly removes trivial bit vectors.

Removal of bit vectors around nodes with less than 3 attached road segments (dummy nodes) removes non-trivial bit vectors, so a map size saving for this category of non-decision road segments can be bigger than for the non-decision road segments. On the other hand, filtering requires a decoder (such as a routing method using the map) to decode road segment types and road segment flags of lines and apply a logic on them in order to figure out bit vectors that are implicit, which may slow down the process.

In theory embodiments could also look at manoeuvres (i.e. turn restriction) to decide whether a road segment going out is legal, but such a technique adds complexity. Ignoring manoeuvre means that embodiment may encode more bit vectors than strictly necessary but a simplification in the method is achieved.

Example of Non Decision Nodes a--<->--b--<->--c

In this example, (b) is attached to 2 road segments navigable in both directions. (b) is not a decision node, because there are <=2 attached road segments.

So bit vectors of both road segments leaving node (b) will not be encoded. Decoder can implicitly set them to 111 . . . 111.

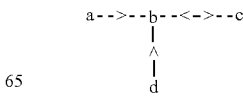

Arrows > in this example show the legal direction of flow. (b) is not a decision node, because there is only one way out. So none of the road segments around (b) need bit vectors.

Bit vectors for the road segment (b)→(c) leaving node (b) are not encoded, it will implicitly be 111 . . . 111. Bit vectors for illegal road segments leaving (b) are not encoded either, they will implicitly be 000.000.

Examples of Decision Nodes

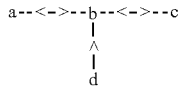

(b) is a decision node because when coming from (d), there is a choice: routing can continue towards (a) or toward (c).

Notice that in this example, when coming from (a), there is no choice: routing can only continue toward (c). But node (b) is still a decision node because there is at least a choice when coming from (d) so bit vectors should be stored for the 2 decision road segments around node (b).

Bit vectors are stored for road segment (b)→(a) and road segment (b)→(a) since they are decision road segments.

A bit vector is not stored for road segment (b)→(d) since this road segment is illegal to take according to backward/forward flow of traffic. It is implicitly 000 . . . 000.

OR-ing Bit Vectors

Let's suppose that a node has 3 attached road segments and that the first 2 decoded road segments have the following bit vectors:

00000000000000000000
00000000000000000000

Then the third bit vector does not need to be encoded because it can only be:

11111111111111111111

This can only work if bit vectors of road segments around node a happen to be in this order: all bit vectors 000 . . . 000 and the last one is 111 . . . 111. In practice it seems to happen fairly frequently in the finer level (eg level 3) network (which is where most of the road segments are).

Taking the first 2 bit vectors to be:

00000000000000000110
00000000000000000010

Then the third bit vector has can only have all its bits set to 1 except 2 bits which are unknown and need to be somehow encoded.

11111111111111111??1

Since in the above example, most of the bits are already known, it should be possible to use this information to encode the 2 unknown bits more efficiently than encoding the whole bit vector. Thus, in this example, it is only necessary to encode 2 bits.

A possible fast decoding scheme using this property would be to compute a bit-mask of all decoded bit vectors in the road segments of the current nodes by OR ing all previous bit vectors in the road segment. Using the same example as earlier, if a node has 3 attached road segments and if the previous 2 road segments have the following bit vectors:

00000000000000000110
00000000000000000010
. . . then the OR bit mask is:
00000000000000000110

Taking the 3rd and last bit vector to encode around the node as:

11111111111111111001

Instead of encoding the Huffman code of 11111111111111111001 which may be rare, the encoder is free to encode any other code (otherCode) as long as:

value_to_encode=~bitMask|otherCode

In this example, otherCode=0000000000000*0000000 qualifies since:

value_to_encode=11111111111111111001=~
0000000000000*00001100000000000000*0000000

Encoding 00000000000000000000 is much more efficient than encoding 11111111111111111001 since 00000000000000000000 is far more frequent. Decoding is fast, since decoding only needs to compute the bitmask (or operation) whenever it decodes a bit vector and apply the bitmask to the last decoded bit vector:

actual bit vector=bitmask & decoded bit vector
=~00000000000000000110 & 00000000000000000000
=11111111111111111001

This optimization works well if road segments around nodes are stored in such a was so as to have the one with most 1 in the bit vector at an end region. However, this can prove difficult:

sorting road segments around a node is performed before computing bit vectors (unless we use the bit vector information a posteriori to re-encode)

road segments are already sorted by road names. It is possible to sort road segments around nodes when road names are identified.

Using Network Levels

In addition to the levels of the regions, road segments within the map data are categorised according to a road segment level. There should be a strong correlation between bit vectors and road segment network levels around from-nodes: routing to another region will generally prefer to take the high level road segment network eg motorways, or the like. The most important road segment network level is probably the motorway level which may be level 1.

The following example depicts an intersection with road segments at different network levels:

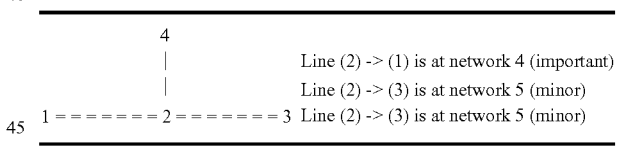

The bit patterns are likely to be as follows:

| 2 | 1 | ???????????? |
|---|---|---|
| 2 | 3 | ???????????? |
| 3 | 4 | 000000000000 |

Not Storing Bit Vectors for Nodes at Unimportant Road Segment Network Levels

Routing almost never go through unimportant road segment network levels, such as network level 5, except close to the destination or starting point. Thus, it is possible not to store bit vectors at level 5 and as such, there should be a minimal impact on routing, even though the number of road segments at level 5 is large. Routing in most cases will only explore few road segments at the most unimportant network level at the start or the end of a route since it will quickly reach some more important road segment network levels, and the search acceleration data on those nodes will almost always tell the router to skip a navigation segment that goes back to the most unimportant network level and to use a navigation segment that leads to or stays on the more important network levels. This is true at the most important network level since that network level is used when the destination is still far away.

In addition to dropping bit vectors at the most unimportant road segment (eg level 5), we could also not encode region IDs at that network.

Transform a Few 0s into 1s in Bit Vectors

This is also a lossy compression scheme.

If a bit vector only contains only one 0 (or possibly less than a small threshold), then it may be possible to transform it into 1 if it results in (i.e. setting that road segment to be part of a fastest route):

a trivial bit vector 111 . . . 111 (since trivial bit vector are encoded in a more compact way than non-trivial bit vector)

or a bit vector already found in the history of the current bit vector page (since those are also encoded more efficiently)

Transforming 0s into 1s in bit vector does not affect the routing outcome, it only makes it slower by having routing consider more road segments (because they are now set to be part of the fastest route). However, some embodiments of the invention may employ this method—particularly if the map saving is large with a small performance hit in terms of routing speed.

Routing

FIG. 15 shows a map 1600 covering an area and having a start node 1602 and a destination node 1604 together with a plurality of road segments that have been explored by the prior art A* search method. The selected route is shown by the dotted line 1606.

Figure 16:
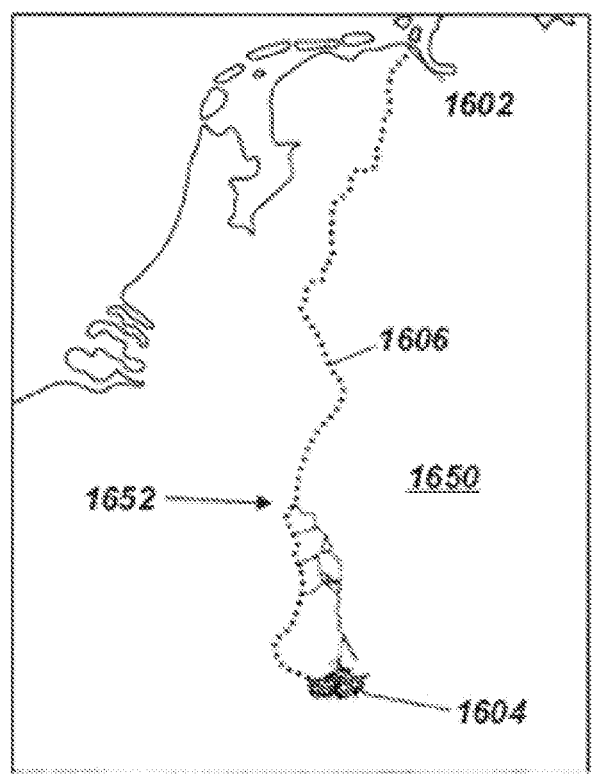
FIG. 16 shows a map highlighting routes considered by embodiments of the current invention.

FIG. 16 shows a map 1650 covering the same area as the map of FIG. 15 and also showing the same start node 1602 and destination node 1604. The Figure also highlights the roads that were explored using an embodiment of the present invention which utilised the same road network and same criterion as used to generate the route of FIG. 15 (eg both are travelling by car, wishing to used speed as the cost function to minimise, etc.). The route selected by the method is again shown with the dotted line 1606 and it should be noted that the line is the same as that calculated in FIG. 15. As such, it is noted that the routes calculated by embodiments of the current invention may be so-called mathematically exact and find the best/optimal route with respect to the given cost model that was selected to be minimised. Thus, it will be apparent that the road-segments explored by the embodiment of the current invention is significantly less when compared to the prior art. As such, the method of the embodiment of the invention is quicker, and generally significantly quicker, than the prior art A* method.

It should also be noted that as the route 1606 approaches the destination 1604 more routes are explored when compared to the beginning; i.e. when the route 1606 proceeds beyond the point 1652 roads are explored other than the lowest cost route. One explanation of this is that the method has switched from the level 0 region to the level 1 region at point 1652. It will further be seen that further road segments are explored in the vicinity of the destination 1604. Again, this can be explained by noting the route planning method will switch from level 1 to level 2 in this vicinity.

Thus, when routing at long range, there will typically be only one fastest route. However, as the method switches to a finer level (eg from level 0 to 1) there may be more than one route which is marked as the 'lowest cost' and therefore needs to be explored.

Once the map data has been created and the bit vectors calculated and stored, it can be used for calculating routes between two points.

Figure 17:
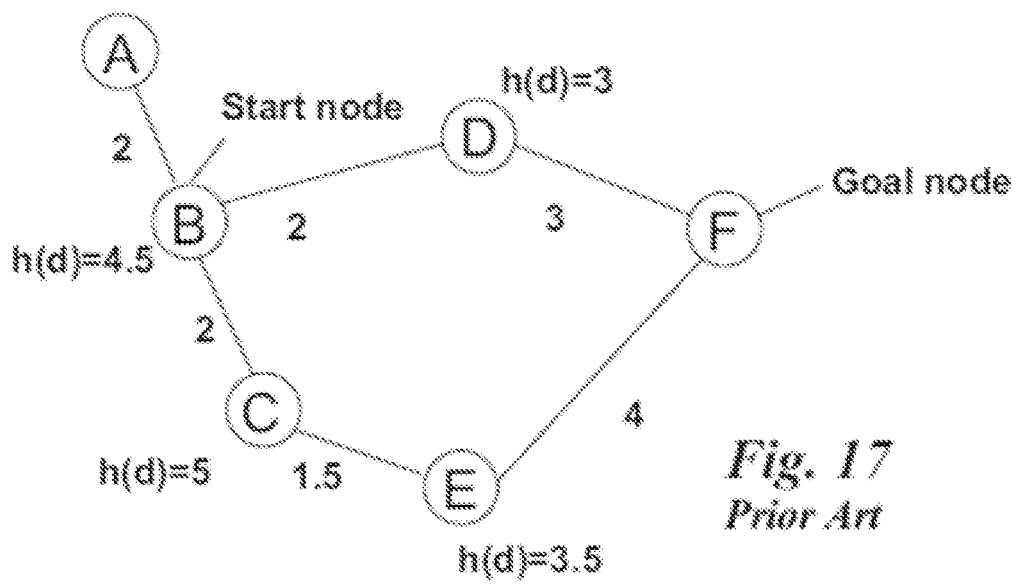
FIG. 17 shows an example of the A* search method (PRIOR ART)

FIG. 17 shows the prior art A* method in which a network is explored by a route planning application wherein a decision is made at a node as to which road segment to explore further. In order to achieve this the cost to travel to the next node is added to the estimated cost of moving from the next node to the goal. The path having the minimum cost from a given node is then explored further. The method keeps a total of the cost that has so far been incurred as the method proceeds and at each iteration the minimum cost is considered.

For example, starting at node B, it can be seen that both nodes C and D are 2 cost units away from B, the start node. However, from node D the estimated cost of reaching node F is 3 units and from node C the estimated cost of reaching node F is 5 units. Thus, the A* method would explore the route to node D in preference to the route to node C since the cost to the next node plus estimated cost to goal is less for the road segment to node D. (i.e. BC=2+5=7 whereas BD=2+3=5).

When considering route planning is performed using the bit vectors of embodiments of the present invention, the bits for each road segment (i.e. column 704 of FIG. 7) identify which road segments are candidates for being part of a lowest cost route to a destination region. As such, the A* method described in relation to FIG. 17 is modified to that shown in FIG. 18.

Figure 18:
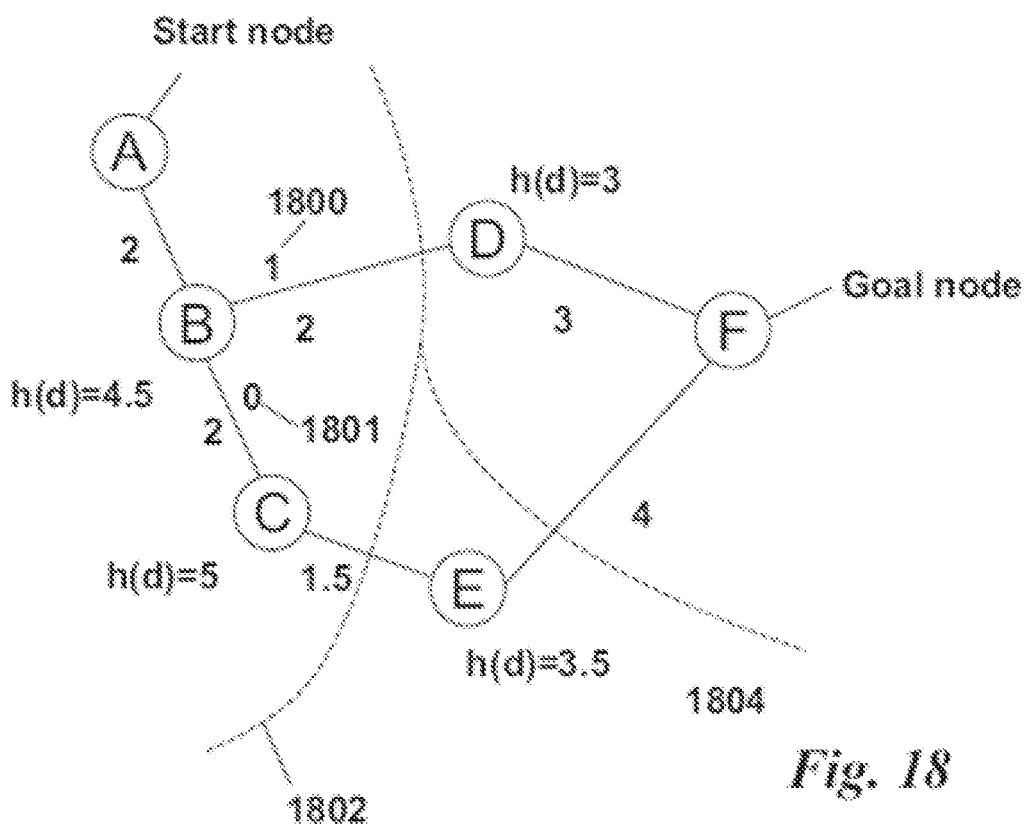
FIG. 18 shows a modification to FIG. 17 used by at least some embodiments of the invention.

Typically route planning is performed using the bit vectors as described in relation to FIG. 18. However, some embodiments of the invention may allow route planning to fall back to A* (or other prior art methods) in various circumstances. Different embodiments may utilise any of the following: bit vectors information is missing (thereby allowing the system to function even in the absence of the bit vectors); a cost function is used; the routing other than the cost function for which the bit vectors were calculated (typically fastest route but not necessarily so); a user specifies criteria different to those used to pre-calculate the bit vectors (for example user wishes to avoid motorways); the vehicle type is different to that used for the pre-calculation of the bit vectors (eg. the user is on foot and not in a car); and the route is below a threshold length (eg the start and end points of the route are within the same region).

Two extra digits, 1800, 1801 are shown on FIG. 18 when compared to FIG. 17. Additionally, regions are denoted on the Figure by the hashed lines 1802 and 1804. The '1' 1800 indicates that the road segment BD is part of one low cost route from node B to the region in which the goal node is situated (as described elsewhere there may be other low cost routes in addition). The '0' 1801 indicates that the road segment BC is not part of any low cost route from node B to the region in which the goal node is situated.

As such, when starting from node A embodiments of the invention would use the A* outlined above to explore nodes from A. However, once node B had been reached there is no need to use the exploration further since there is an explicit notation that only the road segment BD is a possible part of the lowest cost route. As such, once the A* method has been used and found the lowest cost route it will subsequently select the lowest cost route by looking at the relevant bits within the bit vectors.

However, the minimum cost data may identify more than one minimum cost path between a pair of the regions if different minimum cost paths exist between the pair of regions at different times. Therefore, a routing between a start node and goal node (origin and destination) may find more than one minimum cost path and have to decide between competing minimum cost paths, for example if both digits 1800 and 1801 for road segments BD and BC have a value "1" indicating that each road segment is part of a minimum cost path at a certain time. In this embodiment, the bit vector does not identify the time at which each road segment is part of a minimum cost path. Accordingly, the routing algorithm carries out a cost analysis for both possible minimum cost paths based on a time at which segments of the path are travelled. This time may be determined from a time of departure from the origin/start node.

Associated with each segment is a speed profile, as shown in FIG. 10a, of how the expected speed of travel through the segment varies with time. From these speed profiles, the expected speed at the relevant time can be determined and this can be used to determine the cost of travelling along that road segment at that time. By summing up the costs of travelling the road segments of each minimum cost path, the cost for each minimum cost path can be determined. The navigation device may then select for the route the minimum cost path having the lowest cost for that time.

In order to perform the routing so far described, bit vector information is obtained from the encoded side file described in relation to FIGS. 8 to 10 using a decoding process.

The output of the pre-processing described above comprises:
  an assignment of hierarchical regions to most of the nodes, and
  an assignment of bit vectors to the outgoing road segments at these nodes.

Map Loading
Consistency Checks

When map data is loaded, the set of side-files should be present in the map directory, otherwise the decoder will deactivate the search acceleration data so that the route search is carried out without search acceleration data. There are several checks which help to ensure data integrity, which are now listed.

The side-files follow a naming convention.

The number of levels is given by the number of side-files, but it is also stored in the header of each side-file and equals the number of side file.

Each side-file stores the number of regions at its respective level, which is the same as specified in the side-file names. Moreover, the side-files store the following information, which should be the same for all side-files:
  the side-file version.
  the number of nodes per "bit vector page" (explained below).
There are also checksums in each side-file which identify
  the particular side-file set as a whole
  the map as a whole.
These should be correct for the side-files associated for a given electronic map. If any of the above checks fails, the search acceleration data feature will not be activated for this map.

Data Structures which are Loaded into Memory

The decoder reads the side-files in an external-memory implementation. This means that the contents of the bit vector side-files are not loaded entirely into memory, but only read as needed. However, some general data is loaded into memory at the beginning and held there as long as the map is loaded.

Header Information

Each side-file starts with a header section, which contains the data described in relation to FIGS. 8 to 10 above. This information is stored in memory for each side-file.

Huffman Tree Definitions

The side-files contain the definitions of several Huffman trees. Each Huffman tree definition gives the complete description of a particular Huffman encoding and is used later to decode a part of the side-file bitstream into the original data (i.e. to decode a sequence of bits from a side-file into a number or some other particular value). The following Huffman tree definitions are read from each side-file and held in memory.

A Huffman tree for decoding the number of road segments at each node. (The encoded number of road segments can be smaller than in the underlying map. Note than the decoder is independent of the underlying map, i.e. it does not need to read the map.) This Huffman tree is only stored in the level-0 side-file.
  A Huffman tree for decoding the page code (explained below).
  Several Huffman trees for decoding bit vector blocks. The number of tree definitions is given by the regular bit vector block length as stored in the side-file header; it equals the block length minus one. (The entire bit string of bit vectors for a road segment is split into blocks. If the length of the bit vector bit string is not a multiple of the regular block length, then the final block is shorter. There is one Huffman tree for each block length from 2 up to the regular block length. No Huffman tree is used for a block of length one, because this is just a bit and is stored directly.)
  Several Huffman trees for selecting the decoding method for bit vectors. The number of these trees is specified in the header; their use is explained below.

Neighbour Lists

At each level except the finest level, the side-file encodes neighbour lists. A neighbour list for a region at level k is a list of zero or more level-(k+1) regions which are called neighbours of the level-k region. The neighbour list section at the level-k side-file has two parts.

The first part contains the number of neighbour regions for each level-k subregion. For example (k=1), if there are 4000 regions at the global level 0, and each global region is subdivided into 10 level-1 regions, then the level-1 side-file contains 4000*10 level-1 subregions. For each of these, the length of the individual neighbour list (which consists of level-2 regions) is given.
  The second part contains the actual neighbour lists, whose respective lengths are known from the first part. Each neighbour list is a list of level-(k+1) subregions.

Thus, the neighbour lists specify for a given destination region regions lying the visibility area of that destination region. As such, an indicator is provided which identifies, to a navigation device using the map data, the extent of a visibility area. As such, route planning using the search acceleration data can identify whether further search acceleration data is available to a destination region which can be used to constrain the navigable segments which are explored, thus speeding up the route planning.

Region Remap Table

The side-files store bit vectors in a compressed format eg by coalescing and reordering, etc. The side-file at level k has a region remap table which is used to decompress bit vectors encoded by blocks. It consists of two parts:

The first part is an array which is indexed by the level-k subregions. For each subregion at level k, it contains the length of the compressed bit vector. This is relevant for those outgoing road segments of nodes in the respective subregion for which the bit vector is encoded by blocks.

The second part is a two-dimensional array indexed by (1) the bit position in the uncompressed bit vector and (2) the level-k subregion. The array entries specify the bit position in the compressed bit vector for the given bit position in the uncompressed bit string read by blocks.

Note that only the first part is held in memory; the second part is only used on demand during decoding because it is large. Currently, the region remap table is only stored at the global-level side-file (k=0).

Initiating a Route Query

The decoder is used to accelerate the route search from a departure position to a set of destination nodes. (An example where the destination consists of more than one node is when an entire road stretch is used as destination.) The destination nodes define a set of one or more target regions.

Note that a target region is a sequence of region IDs, one for each partitioning level, starting at level 0. At the beginning of each new search, the set of target regions is built up by clearing the previous target region set and passing the new destination nodes to the decoder. The decoder will determine a list of target regions without duplicates. The mechanism for finding the region of a given node is the same as during the search; see below for details.

Scanning a Node During Route Search

The remaining discussion assumes that a set of target regions has been set. A feature of the decoder is a function which, given a node ID of the road network, returns a bit array (the bit vectors for this node and the given target regions) which is indexed over the road segments leaving this node. The ordering of the nodes and the road segments at a node is defined by the map. Whenever a bit value is zero, this means that the corresponding road segment can be ignored during the search. (This usually leads to a considerable reduction of the search space and thus the running time for the search.)

For a small number of nodes, neither region information nor bit vector data is stored in the side-files. For these nodes, the decoder returns a bit string in which all bits are 1. (This will prevent the route search from skipping any road segment at this node.) The decoder has a Boolean query function which says whether this is the case for a given node. Moreover, there is a Boolean query function which says whether a given node is located in one of the previously fixed target regions. The bit vectors returned by the decoder for a node in a target region are again bit strings in which all bits are 1. These Boolean query functions are used for optimizations in the route search.

According to the side-file format, the bit vector data for a given node is decoded in several steps. In each side-file, the region and bit vector information is organized in so-called pages. The number of nodes per page is a fixed power of 2 (e.g. 16) and identical for each side-file of a side-file set. This means that, for a given node ID, the page index of a bit vector page can be computed by a simple bit-shift. Information for the nodes is stored consecutively by node ID.

Finding the Page Offset for a Given Node

For each side-file, the average number of bytes per page is stored in the header of the side-file. It is used to approximate the byte offset of the page by multiplying the page index with the average size. A correction term is stored in a table indexed by the page index. This table is stored in a separate section of the side-file. When a page is queried, the correction term is looked up in the table and added to the approximate page offset, giving the position of the page in the side-file.

Decoding a Page

Caching

When a page is queried for the first time, the bit vector strings for the nodes in the page are decoded (with respect to the fixed target region set) and cached. The next time data is queried for a node from the same page, the cached data can be used without any side-file access. A special marker bit in the decoded bit vector bit string is used to remember whether the node is a no-information node.

Page Code

For each page, a so-called page code bit specifies whether all nodes in the page have the same region ID. The page code contains one bit per level, but all bits are stored as a common Huffman symbol at the beginning of the page in the level-0 side-file only.

Decoding Outgoing Road Segment Counts

As mentioned above, each page contains information for a fixed number of nodes. This number of nodes is stored in the header of each side-file. At the beginning of a page (or after the page code, for level 0), the page lists the number of outgoing road segments for each node in the page. Whenever the number of outgoing road segments is zero, this means that no information at all is stored for the corresponding node. While the page is decoded, the numbers are stored in a temporary array.

Decoding Regions

The road segment counts section is followed by the regions section. The region of a node is given by a sequence of region IDs, one at each level. The region ID of a particular level is stored in the corresponding side-file. The decoder reads the regions at all levels for all nodes in the page. When no information is stored for a node (i.e. the road segment count of the node is zero), the region information is left empty. The decoder reads the region ID sequence for the first node which has a road segment count greater than zero. If the page code at a given level specifies that all region IDs are the same at that level, then at that level the same region ID is set for all nodes. Otherwise, the region IDs at the corresponding levels are read for all nodes of positive road segment count. At the end of this process, the decoder has filled a table with the complete region ID sequences for all nodes of the page (where some sequences may be empty).

Decoding Bit Vectors

Finding the Set of Relevant Bit Positions

For a given node and target region, a particular bit at a particular level determines the value of the bit vector bits for the road segments leaving this node. When there is more than one target region, the resulting bits are ORed together. For each node, the decoder computes the set of relevant bit positions. The set of relevant bit positions is the same for each outgoing road segment at that node. It only depends on the region of the node and the set of target regions. If there is just one target region, there will be only one relevant bit position at one level; in other words, information stored at the other levels can be ignored for this node. In the case of more than one target region, some of the relevant bit positions may coincide, so there are always at most as many relevant bit positions as there are target regions. In the following, we shall discuss how the decoder determines the relevant bit position for one target region. For more than one target region, the relevant bit positions are found in the same way and combined into a set.

When no neighbour regions are defined, there is one bit vector bit (per outgoing road segment) for each target region at each level. (For simplicity, we neglect the fact that no bit is stored for the region ID of the node itself.) The relevant bit is at the first level, counting up from level 0, at which the region ID of the node differs from the region ID of the target region. For example, if the region ID of the node at the global level is equal to the target region ID at the global, but the two region IDs are different at level 1, then the relevant bit position is at level 1, and it equals the target region ID. It is a bit position in the uncompressed bit vector string at that level; this string contains one bit for each possible target region ID. The region remap table is used to transform this position into a position in the compressed bit vector string, the string which is actually encoded at that level.

When neighbour regions are defined (i.e. regions within the visibility area), then the relevant bit is determined at the "finest" level at which the target region is a neighbour of the node's region. Taking four levels as an example, let the target region ID sequence be (a, b, c, d), and let the node's region ID sequence be (e, f, g, h). If (a, b, c, d) is a neighbour of (e, f, g) as defined in the neighbour lists section, and (a, b) is a neighbour of (e), then the relevant bit is determined by (a, b, c, d) and located at level 2, the level of the (e, f, g) prefix which contains (a, b, c, d) as a neighbour. More precisely, the relevant bit position is the index of (a, b, c, d) as a neighbour of region (e, f, g) in the level-2 side-file. The regular bit for region ID h, as explained in the previous paragraph, is irrelevant in this case. Again, this relevant bit position is with respect to the uncompressed bit vector string. The decoder uses the region remap table to transform it to a bit position in the compressed bit string at level 2. More information on neighbour lists is contained in the document "Proposal for enhanced multi-level graph partitioning".

Decoding the Bit Vector Bits

Given the fixed set of target regions, the bit vector for each node in the page will consist of one bit per outgoing road segment. If the road segment count of the node is zero (i.e. the node is a no-information node), each bit will be set to 1 without further decoding for that node. If the node is located in one of the target regions, the bit vector will again be all-1; in this case, encoded data might have to be skipped in order to decode data for the subsequent nodes.

If the bit vector for the current node is not trivially all-1, the decoder determines the set of relevant bit positions, as explained earlier. Each bit position is with respect to a particular level, i.e. the bit is located in a particular side-file. At each level, the side-file contains the complete compressed bit string, but the decoder needs to extract the bits at the relevant bit positions only. During decoding, unused information is read (skipped), but only if it is followed by information which is really needed. Otherwise, the unused part of the bit stream is not read at all.

The set of relevant bit positions is grouped according to level. Instead of decoding the compressed bit string and uncompressing it for reading the bits at the relevant positions, the relevant positions are transformed into positions in the compressed bit string. If there are relevant bits at some level, first the data for preceding nodes is skipped, if appropriate (the decoder remembers how far it has come in the side-file at each level). When the section for the node in question is reached in a given side-file, the bit vectors are decoded line by line. For each outgoing road segment, one bit is stored; it is the result of an OR operation of the decoded bit for all relevant bit positions. The information for a particular road segment at the current node starts with a Huffman symbol which specifies the decoding method. It has one of the following values:

A symbol which specifies that all bit vector bits for the road segment at this level are 0 (including all neighbour bits at this level). No further bits have to be decoded for this road segment.

A symbol which specifies that all bit vector bits for the road segment at this level are 1 (including all neighbour bits at this level). No further bits have to be decoded for this road segment.

A symbol which specifies that the bit vector bit string is given explicitly by blocks. The decoding of the compressed bit vector bit string by blocks is explained below. The bit vector bit for the road segment is put into a "history stack" that is built up during the encoding of the entire page.

A symbol which specifies an index into the history stack. At the given index, the history stack contains the desired bit vector bit value for the road segment.

A different Huffman tree for the decoding method selector is used, depending on the current size of the history stack. There is a limit value in the header of the side-file which specifies the number of Huffman trees; when the size of the history stack exceeds this value, then the last Huffman tree is reused.

If the method selector symbol specifies that the bit vector string should be encoded explicitly, then the decoder reads the compressed bit vector bit string block by block. It collects the bit values at the relevant bit positions (with respect to the compressed bit vector string) at this level. The values of the bits are ORed. As soon as the intermediate result of the OR becomes 1, the rest of the bits in all further blocks for this road segment can be skipped. The Huffman tree used for decoding each block depends on the number of bits in the block. There is one Huffman tree for the regular block length as specified in the side-file header. The last block for the road segment may be shorter; depending on its size, an appropriate Huffman tree is used for decoding. A block of length one is just a bit, which is read directly without Huffman decoding.

If the number of blocks is at least 2, then the bit stream generated from the bit vector contains an additional bit which comes before the Huffman symbols for the blocks. Its value specifies whether the entire decoded string is understood to be the bit-wise negation of the actual value. (The purpose of this negation is better Huffman compression.)

Note on Search Methods

The skilled person will appreciate that, although the classical Dijkstra and A* search methods produce a search tree and may thus be called examples of a tree search, a general route search rooted at a given navigable segment may typically produce a directed acyclic graph, constituting a subnetwork of the network in which the search is carried out, and that for any given navigable segment contained in that directed acyclic graph there will be one or more minimum cost routes between that segment and the root of the search. Therefore, when mention is made to a search tree or a tree search, it will be understood that this concept can be generalized to a directed acyclic graph resulting from the search.

For example, with time varying functions providing speed values for navigable segments in the map, there can be more than one minimum cost route between a given navigable segment and the root of the search and as such, such searches use a directed acyclic graph rather than a tree search.

The invention claimed is:

1. A method of creating map data, including search acceleration data arranged to increase the speed at which a route can be planned across an electronic map, the method comprising using at least one processing apparatus to process an electronic map comprising a plurality of navigable segments each representing segments of a navigable route in an area covered by the map, the method comprising:

a) dividing the map into a plurality of hierarchical regions belonging to at least a coarser level and a neighboring finer level such that each navigable segment is categorized into at least one region in each of the coarser and finer levels and wherein any one region of the coarser level contains a plurality of regions of the finer level;

b) determining, for a given destination region, the extent of a visibility area, comprising at least the coarser level region containing the destination region, by assessing whether regions close to the coarser level region containing the destination region should be added to the visibility area and adding those regions if the assessment is positive;

c) determining, for navigable segments in the visibility area of the destination region, whether a navigable segment is part of a minimum cost route to the destination region, wherein the search performed to make said determination is constrained by the visibility area;

d) arranging the search acceleration data to comprise information indicating said determination for the navigable segments; and e) generating the map data.

2. At least one computing device arranged to perform the method of claim 1.

3. A non-transitory computer readable medium containing instructions which when read on a machine cause the machine to perform the method of claim 1.

4. Search acceleration data generated by the method of claim 1.

5. A method according to claim 1, wherein the processing of a navigation segment to determine if the navigable segment is part of a minimum cost route comprises performing a reverse search from the destination region back toward the navigable segment and includes substantially only navigable segments in the visibility area.

6. A method according to claim 1 in which the assessment as to whether regions are close to the coarser level region containing the destination region is based upon a predetermined criterion comprising at least one of: graph-theoretical distance, geographical distance, travel time, fuel consumption, and $CO_2$ emission.

7. A method according to claim 1, wherein a time varying function is associated with at least some, and generally each, navigable segment.

8. A method according to claim 7, wherein the time varying function associated with a navigable segment represents an average speed on the navigable segment at a plurality of time intervals.

9. A method according to claim 1, comprising:
reducing the number of navigable segments to be considered in the creation of the search acceleration data by removing segments to form a core network of navigable segments.

10. A method according to claim 9 in which navigable segments are removed from the electronic map prior to the creation of the search acceleration data according to any one or more of the following criteria:
(i) removing navigable segments which fulfil a predetermined criterion related to the road property;
(ii) collapsing nodes, which occur at junctions between navigable segments, onto one another in predetermined situations; and
(iii) collapsing nodes onto one another if they have two or less than two navigable segments connected thereto.

11. A method according to claim 1, wherein the plurality of navigable segments of the electronic map each have a plurality of nodes associated therewith and each have at least one associated attribute representing a parameter of the navigable route, the at least one attribute associated with a navigable segment includes any one of the following:
(i) a type of the navigable segment;
(ii) an average speed along the navigable segment;
(iii) a length of the navigable segment; and
(iv) a connectivity of the navigable segment to other navigable segments, and wherein the categorization of each of the navigable segments uses an assessment of the least one attribute to ensure that the plurality of nodes associated with the navigable segments are balanced across the regions of the electronic map.

12. A method according to claim 1, wherein the minimum cost route is determined according to one of the following cost criterion: shortest distance; shortest travel time; least environment impact; least petrol used; least $CO_2$ generated.

13. A method according to claim 1, comprising:
determining, for at least some navigable segments, whether a navigable segment is part of a minimum cost route to the destination region according to a first cost criterion and whether the navigable segment is part of a minimum cost route to the destination region according to a second cost criterion.

14. A method according to claim 1, wherein the generated map data comprises a side-file including the search acceleration data, the side-file being associated with the electronic map used to generate the side-file.

15. A method of creating map data, including search acceleration data arranged to increase the speed at which a route can be planned across an electronic map, the method comprising using at least one processing apparatus to process an electronic map comprising a plurality of navigable segments each representing segments of a navigable route in an area covered by the map, the method comprising:
a) dividing the map into a plurality of hierarchical regions at one or more levels of hierarchy;
b) processing at least some of the regions belonging to a particular level of hierarchy in the order of the level hierarchy, working from the finest level up to the coarsest, and for at least some of these regions, determining which navigable segments enter or leave that region;
c) processing at least some of the navigable segments within the map to determine at least one minimum cost route from that navigable segment to a destination region;
d) wherein the processing of a navigable segment includes performing a reverse search from the destination region back toward the navigable segment;
e) in a resulting search graph, identifying, for at least one region at the next-finer level, a set of regions at that next-finer level, such that each minimum-cost path from the given region passes through at least one of the regions of the set, resulting in a correlation matrix;
f) in the resulting search graph, identifying which navigable segments are not contained in any path from a region different from a region including the respective navigable segment to a further destination region, so they can be thought of as "non-transit segments", and removing the non-transit segments for the subsequent steps in order to reduce the number of navigable segments which are considered in the subsequent steps;
g) wherein the creation of search acceleration data comprises using the correlation matrix to assign search acceleration data to the non-transit segments which have been removed in all previous steps; and
h) generating the map data.

16. At least one computing device arranged to perform the method of claim 15.

17. A non-transitory computer readable medium containing instructions which when read on a machine cause the machine to perform the method of claim 15.

18. A navigation device arranged to generate a route across an electronic map using a processor thereof, the navigation device comprising:
- an electronic map comprising a plurality of navigable segments representing segments of a navigable route in an area covered by the map, wherein the map is divided into a plurality of hierarchical regions belonging to at least a coarser level and a neighbouring finer level such that each navigable segment is categorized into at least one region in each of the coarser and finer levels and wherein any one region of the coarser level contains a plurality of regions of the finer level; and
- search acceleration data that indicates whether a navigable segment is part of a minimum cost route to a region, the search acceleration data for a region of the finer level being constrained to data that indicates whether a navigable segment within a visibility area of the finer level region is part of a minimum cost route to the region, the visibility area comprising the coarser level region containing the finer level region and any regions determined to be close to the coarser level region;
- wherein the processor is arranged to:
- perform a route search across the electronic map;
- perform, in a cost calculation at nodes processed during the search which represent navigable segments in the electronic map, an assessment of whether navigable segments connected to those nodes are marked, within the search acceleration data, as being part of a minimum cost route; and
- if there are such navigable segments exploring only those navigable segments.

* * * * *